(12) United States Patent
Sato et al.

(10) Patent No.: US 8,208,511 B2
(45) Date of Patent: Jun. 26, 2012

(54) SURFACE EMITTING LASER, SURFACE EMITTING LASER ARRAY, OPTICAL SCANNING DEVICE, IMAGE FORMING APPARATUS, OPTICAL TRANSMISSION MODULE AND OPTICAL TRANSMISSION SYSTEM

(75) Inventors: Shunichi Sato, Miyagi (JP); Akihiro Itoh, Miyagi (JP); Takeshi Hino, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/669,090

(22) PCT Filed: Nov. 13, 2008

(86) PCT No.: PCT/JP2008/071058
§ 371 (c)(1),
(2), (4) Date: Jan. 14, 2010

(87) PCT Pub. No.: WO2009/064018
PCT Pub. Date: May 22, 2009

(65) Prior Publication Data
US 2010/0189467 A1 Jul. 29, 2010

(30) Foreign Application Priority Data
Nov. 14, 2007 (JP) .................. 2007-295505
Jan. 28, 2008 (JP) .................. 2008-016331
May 26, 2008 (JP) .................. 2008-136146

(51) Int. Cl.
*H01S 5/00* (2006.01)
*H01S 3/22* (2006.01)
*H01S 3/223* (2006.01)

(52) U.S. Cl. ............. 372/46.013; 372/50.11; 372/50.124
(58) Field of Classification Search ............. 372/46.013, 372/50.11, 50.124
See application file for complete search history.

(56) References Cited

U.S. PATENT DOCUMENTS

| 5,493,577 A | 2/1996 | Choquette et al. |
| 5,923,691 A | 7/1999 | Sato |
| 5,939,733 A | 8/1999 | Sato |

(Continued)

FOREIGN PATENT DOCUMENTS

JP 2757633 3/1998

(Continued)

OTHER PUBLICATIONS

J. Select, "Topics Quantum Electron", 1997, pp. 916-926, vol. 3.

(Continued)

*Primary Examiner* — Patrick Stafford
(74) *Attorney, Agent, or Firm* — Cooper & Dunham LLP

(57) ABSTRACT

A disclosed surface emitting laser is capable of being manufactured easily, having a higher yield and a longer service lifetime. In the surface emitting laser, a selectively-oxidized layer is included as a part of a low refractive index layer of an upper semiconductor distribution Bragg reflector; the low refractive index layer including the selectively-oxidized layer includes two intermediate layers adjoining the selectively-oxidized layer and two low refractive index layers adjoining the intermediate layers. Al content rate in the intermediate layers is lower than that in the selectively-oxidized layer, and Al content rate in the low refractive index layers is lower than that in the selectively-oxidized layer. This configuration enables providing more control over the thickness and oxidation rate of the oxidized layer, thereby enabling reducing the variation of the thickness of the oxidized layer.

20 Claims, 33 Drawing Sheets

U.S. PATENT DOCUMENTS

| | | | |
|---|---|---|---|
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Takahashi et al. | |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 2002/0163950 A1 | 11/2002 | Johnson et al. | |
| 2003/0006429 A1 | 1/2003 | Takahashi et al. | |
| 2004/0081215 A1 | 4/2004 | Johnson et al. | |
| 2004/0091011 A1* | 5/2004 | Liu | 372/46 |
| 2004/0213310 A1 | 10/2004 | Otoma | |
| 2005/0100068 A1 | 5/2005 | Jikutani et al. | |
| 2005/0147143 A1 | 7/2005 | Jikutani | |
| 2006/0007979 A1* | 1/2006 | Jikutani et al. | 372/92 |
| 2006/0093006 A1 | 5/2006 | Jikutani | |
| 2007/0280322 A1 | 12/2007 | Sato et al. | |
| 2008/0024849 A1 | 1/2008 | Hayashi et al. | |
| 2008/0055672 A1 | 3/2008 | Watanabe et al. | |
| 2008/0056321 A1 | 3/2008 | Motomura et al. | |
| 2008/0212636 A1 | 9/2008 | Sato et al. | |
| 2008/0233017 A1 | 9/2008 | Sato et al. | |
| 2009/0022199 A1 | 1/2009 | Jikutani et al. | |
| 2009/0262770 A1 | 10/2009 | Itoh et al. | |
| 2009/0295902 A1 | 12/2009 | Sato et al. | |

FOREIGN PATENT DOCUMENTS

| | | | |
|---|---|---|---|
| JP | 11-26879 | | 1/1999 |
| JP | 2002-208755 | | 7/2002 |
| JP | 2003-508928 | | 3/2003 |
| JP | 2003-115634 | | 4/2003 |
| JP | 2003-198060 | | 7/2003 |
| JP | 2004-31925 | | 1/2004 |
| JP | 2004-63634 | | 2/2004 |
| JP | 2004-253408 | | 9/2004 |
| JP | 2004-327862 | | 11/2004 |
| JP | 2005-44964 | | 2/2005 |
| JP | 2005044964 | A * | 2/2005 |
| JP | 2006-504281 | | 2/2006 |
| JP | 2007-318064 | | 12/2007 |
| WO | WO2007/063806 A1 | | 6/2007 |

OTHER PUBLICATIONS

A.E. Bond, P.D. Dapkus, J.D. O'Brien, "Design of Low-Loss Single-Mode Verticle-Cavity Surface-Emitting Lasers", 1999, pp. 574-581, vol. 5, No. 3.

U.S. Appl. No. 11/993,406, filed Dec. 20, 2007.

* cited by examiner

Al$_{0.1}$Ga$_{0.9}$As  AlAs  Al$_{0.9}$Ga$_{0.1}$As

Al$_x$O$_y$

SURFACE EMITTING LASER, SURFACE EMITTING LASER ARRAY, OPTICAL SCANNING DEVICE, IMAGE FORMING APPARATUS, OPTICAL TRANSMISSION MODULE AND OPTICAL TRANSMISSION SYSTEM

TECHNICAL FIELD

This disclosure relates to a surface emitting laser, a surface emitting laser array, an optical scanning device, an image forming apparatus, an optical transmission module, and an optical transmission system. More specifically, the disclosure relates to a surface emitting laser emitting light in the direction perpendicular to its substrate, a surface emitting laser array having plural surface emitting lasers, and an optical scanning device, an image forming apparatus, an optical transmission module, and an optical transmission system, each having the surface emitting laser array.

BACKGROUND ART

A Vertical Cavity Surface Emitting Laser (hereinafter may be referred to as "VCSEL") is a semiconductor laser that emits light in the direction perpendicular to its substrate. When compared with edge emitting semiconductor lasers, the VCSEL has some advantages including (1) lower cost, (2) lower energy consumption, (3) smaller sizes, and (4) easier to perform two-dimensional integration. Recently, because of the advantages, the VCSEL has attracted increasing attention.

The surface emitting laser has a current confined structure to enhance current influx efficiency. To form the current confined structure, a selective oxidation process is usually performed with respect to an AlAs (Al: aluminum, As: arsenic) layer. In the following, the current confined structure may be referred to as an "oxide-confined structure" for convenience (see, for example, Patent Document 1). The oxide-confined structure may be formed by forming a mesa structure having prescribed sizes and having a side surface on which a selectively-oxidized layer is exposed. Then, the formed mesa structure is processed under water-vapor atmosphere so that aluminum (Al) in the selectively-oxidized layer is selectively oxidized from the surface side of the mesa structure. By doing this, an unoxidized region remains at and near the center of the mesa structure. The unoxidized region (hereinafter referred to as a "confined region" for explanation purposes) becomes a passing region (or a "current injection region") through which a driving current for the surface emitting laser passes.

The refractive index of the aluminum-oxidized layer ($Al_xO_y$) (hereinafter referred to as an "oxidized layer") in the oxide-confined structure is about 1.6, which is lower than that of semiconductor layers. Because of this feature, a refractive index difference is generated in the lateral direction in the resonator structure of the surface emitting laser, and the light is confined in the center of the mesa structure, thereby improving the emission efficiency of the surface emitting laser. As a result, it becomes possible to obtain excellent characteristics such as lower threshold current and higher efficiency.

To further improve the emission efficiency of the surface emitting laser, it is effective to reduce the scattering loss of the lights by the oxidized layer. To that end, the oxidized layer may be positioned at a node of standing wave distribution of the electric field of the light (as described in, for example, Non Patent Document 1).

Further, in many applications of the surface emitting lasers, there is a strong demand for a beam having higher power and a single peak shape. However, unfortunately, in surface emitting lasers having an oxide-confined structure, due to a large refractive index difference in the lateral direction caused by the oxidized layer, an even higher-order lateral mode may also be confined and oscillated. To reduce the light confinement of the higher-order lateral mode, it is effective to reduce the refractive index difference in the lateral direction and reduce the area (size) of the confined region.

By positioning the oxidized layer at a node position of the standing wave distribution of the electric field of light, it becomes possible to reduce the influence of the oxidized layer to electricity distribution and also reduce the refractive index difference. Further, by reducing the area (size) of the confined region, a higher-order lateral mode having wider mode distribution may leak from the confined region; therefore, the confining effect with respect to the higher-order lateral mode may be reduced. Though it depends on the wavelength range, to realize a single fundamental mode oscillation, it is considered that the one side or the diameter of the confined region is required to be reduced to as small as three or four times the oscillation wavelength. For example, when the oscillation wavelength is 0.85 μm, the one side or the diameter of the confined region is 3.5 μm or less, and when the oscillation wavelength is 1.3 μm, the one side or the diameter of the confined region is 5 μm or less. By having this, simultaneously, the threshold current value becomes smaller.

However, when the size of the confined region is reduced as described above, a single fundamental mode may be controlled only when an injection level of the carriers is relatively low. Further, when the injection level of the carriers is relatively high, a higher-order lateral mode may be oscillated by the thermal lens effect caused by generated heat, or by the spatial hole burning. Especially, as described above, when the size of the confined region is reduced, the size of the oscillation region becomes accordingly smaller, which makes it difficult to obtain high power and makes the resistance of the surface emitting laser larger.

To overcome the problems and to respond to the demand for increasing the output power, there have been proposed several mode control mechanisms that may be used for surface emitting lasers and that do not depend on the oxidized layer.

For example, Patent Document 2 discloses a surface emitting semiconductor laser in which the diameter of the opening and the diameter of the current confined section are determined so that the difference between the optical loss in the oscillator in a high-order lateral mode of a laser light and the optical loss in the oscillator in a fundamental lateral mode of a laser light becomes larger based on the refractive index of the oscillator of the region with respect to the p-side electrode.

Further, Patent Document 3 discloses a surface emitting semiconductor laser in which a GaAs layer having a thickness indicating a high refractive index with respect to the oscillation wavelength is formed on an upper DBR mirror, and a groove is formed on the GaAs layer so that the groove is located above a dividing line between the Al oxidized layer and the AlAs layer, the groove having such a depth that the GaAs layer under the groove has a depth indicating a lower refractive index with respect to the oscillation wavelength.

However, unfortunately, in the surface emitting laser disclosed in Patent Document 2, the lateral mode characteristics, the output, and the like are extremely susceptible to the size of an electrode opening, the displacement between the electrode aperture and the selected oxidation structure, and the like. Because of the disadvantage, high alignment accuracy and high shape controllability for fabrication become necessary, which makes it difficult to uniformly manufacture surface emitting lasers. In addition, severe process control needs to be performed, which results in the increase of the manufacturing cost.

Further, the surface emitting laser disclosed in Patent Document 3 requires processes of forming a dielectric film and partially removing the dielectric film, which disadvantageously increases the manufacturing cost. Additionally, the device characteristics are susceptible to the accuracy of the displacement between the dielectric film and the current injection region, which makes it difficult to uniformly manufacture the surface emitting lasers.

On the other hand, when one of the plural low refractive index layers in a semiconductor multilayer film reflection mirror is entirely a selectively-oxidized layer (as described in, for example, Patent Document 1 and Patent Document 4), the thickness of the oxidized layer becomes in a range from 50 nm to 80 nm, which may cause large distortion due to volume shrinkage caused by the oxidation. The oxidized layer is disposed near the active layer because of the purpose of the oxidized layer. However, the oxidized layer may serve as a main component accelerating the degradation due to the distortion, and there is a tendency that the thicker the oxidized layer is, the faster the degradation proceeds.

Patent Document 4 discloses a surface emitting laser in which intermediate thin films are formed on both sides of the current confined layer. The intermediate thin films are AlGaAs thin films having a composition ratio of Al being 0.38 and having a thickness in a range between 20 nm and 30 nm.

However, in the surface emitting laser disclosed in Patent Document 4, all the low refractive index layers are oxidized. Therefore, the oxidized layer becomes thicker and the distortion due to volume shrinkage caused by the oxidation may negatively affect the active layer and accelerate the degradation of the characteristics. Further, in the surface emitting laser disclosed in Patent Document 1 and Patent Document 4, when viewed from the active layer, the current confined layer is located between the node and the antinode positions of the electric field intensity distribution, which disadvantageously increases the diffraction loss and reduces the single mode output.

Patent Document 5 discloses an oxide-confined VCSEL including a distributed Bragg reflector having a heavily-doped high Al content (for example, 95% or more, and preferably about 98%) oxide aperture forming layer provided between a low Al content (for example, between 0% and 35%, and beneficially about 15%) first layer and medium Al content (for example, around 65%, and preferably less than 85%) second layer. Further, between the first layer and the oxide aperture forming layer, there is provided a transition layer which is a relatively thin layer having a thickness of about 20 nm. In the transition layer, Al concentration linearly changes across the thickness.

On the other hand, in a so-called composition gradient layer for reducing the electric resistance in the semiconductor distributed Bragg reflector, it is preferable to selectively increase the doping (see, for example, Patent Document 6). Further, preferably, the composition gradient layer is located at a node position of the electric field intensity distribution to avoid the increase of the absorption loss. Further, preferably, the oxide-confined structure is located at a node position of the electric field intensity distribution to reduce the diffraction loss.

However, unfortunately, in the oxide-confined VCSEL disclosed in Patent Document 5, the oxide aperture forming layer (corresponding to the current confined structure) and the transition layer (corresponding to the composition gradient layer) adjoin each other. Therefore, it is difficult to locate both of the layers at a node position of the electric field intensity distribution at the same time.

The oxidation rate of the selectively-oxidized layer including Al and As is susceptible to the film thickness, composition rate of Al and As, oxidation temperature, and the like (see, for example, Non Patent Document 2). Further, the oxidation rate of the selectively-oxidized layer is influenced by the thickness of the natural oxidation film that has been formed on the side surface of the selectively-oxidized layer just before the oxidation process starts.

When the oxidized amount is different from that desired and accordingly the size of the current injection region varies, the size of the region that contributes the oscillation in the active layer may vary. As a result, the device characteristics including the light output may vary and the yield of the product is reduced. Especially, the size of the current injection region of single-mode devices is smaller than that of the multi-mode devices. Therefore, the device characteristics of the single-mode devices are likely to be more severely affected by the variation of the oxidation amount in the selectively-oxidized layer. Especially, when the size of the current injection region becomes larger than desired, the device may be operated in multi-mode and the yield of manufacturing single-mode devices is disadvantageously reduced.

Patent Document 1: U.S. Pat. No. 5,493,577
Patent Document 2: Japanese Patent Application Publication No. 2002-208755
Patent Document 3: Japanese Patent Application Publication No. 2003-115634
Patent Document 4: Japanese Patent Application Publication No. H11-26879
Patent Document 5: Japanese Patent Application Publication No. 2006-504281
Patent Document 6: Japanese Patent No. 2757633
Non Patent Document 1: A. E. Bond, P. D. Dapkus, J. D. O'Brien, "Design of Low-Loss Single-Mode Vertical-Cavity Surface-Emitting Lasers", IEEE Journal of selected topics in quantum electronics, vol. 5, No. 3, pp. 574-581, 1999.
Non Patent Document 2: J. Select, "Topics Quantum Electron", vol. 3, pp. 916-926, 1997.

According to research on the optical characteristics of many conventional surface emitting lasers, the optical characteristics such as single-mode output may vary even when the size of the current passage regions are substantially the same. Further experiments were performed and it was found that the thickness of the oxidized layers may vary between lots and even in the same lot even when the thickness of the selectively-oxidized layer, the Al composition, and oxidation conditions are set constant; the variation of the thickness of the oxidized layer is one of the causes of the variation in the optical characteristics; and the thickness of the oxidized layer remarkably varies especially on the side surface of the mesa where the oxidation starts. In addition, some surface emitting lasers show that the thickness of the oxidized layer from the oxidation start section (side surface of the mesa) to the oxidation end section (middle-inside part of the mesa) are uneven.

SUMMARY

In an aspect of this disclosure, there is provided a surface emitting laser and a surface emitting laser array that may be easily manufactured, have higher yield, and have a longer service lifetime.

In another aspect, there is provided an optical scanning device capable of stably performing high-density optical scanning without incurring high cost.

In another aspect, there is provided an image forming apparatus capable of stably forming a high-quality image without incurring high cost.

In another aspect, there is provided an optical transmission module capable of stably generating a high-quality optical signal without incurring high cost.

In another aspect, there is provided an optical transmission system capable of stably performing high-quality optical data transmission without incurring high cost.

According to another aspect of this disclosure, a surface emitting laser includes an oscillator structure including an active layer, semiconductor distribution Bragg reflectors each including plural pairs of a low refractive index layer and a high refractive index layer, the semiconductor distribution Bragg reflectors sandwiching the oscillator structure, and a confined structure formed by selectively oxidizing a selectively-oxidized layer including aluminum. In this configuration, the selectively-oxidized layer is included as a part of the low refractive index layer of the semiconductor distribution Bragg reflector. Further, the low refractive index layer including the selectively-oxidized layer includes first and second layers. The first layer adjoins at least one of the one side and the other side of the selectively-oxidized layer, and the second layer adjoins the first layer. Further, Al content rate in the first layer is lower than that in the selectively-oxidized layer and is greater than that in the second layer.

It should be noted that when a composition gradient layer in which composition is gradually changed from one side to the other side is interposed between the refractive index layers, an optical thickness of each of the refractive index layers may include one-half of each of the composition gradient layers adjoining the refractive index layer.

By doing this, the selectively-oxidized layer is included as a part of the low refractive index layer of the semiconductor distribution Bragg reflector, and the low refractive index layer including the selectively-oxidized layer includes first and second layers, the first layer adjoining at least one of the one side and the other side of the selectively-oxidized layer, and the second layer adjoining the first layer. Further, Al content rate in the first layer is lower than that in the selectively-oxidized layer and is greater than that in the second layer. With this configuration, it becomes possible to provide more control of the oxidation rate with respect to the inward direction of the selectively-oxidized layer and the thickness of the oxidized layer when the selectively-oxidized layer is oxidized. Therefore, it becomes possible to easily reduce the variation of the thickness of the oxidized layer. Namely, it becomes possible to make the manufacturing easier and the yield higher. Further, it becomes possible to reduce the influence of distortion to the active layer and improve the service lifetime.

According to another aspect of this disclosure, there is provided a surface emitting laser for emitting a light in the direction perpendicular to its substrate. The surface emitting laser includes an oscillator structure including an active layer, semiconductor distribution Bragg reflectors each including plural pairs of a low refractive index layer and a high refractive index layer, the semiconductor distribution Bragg reflectors sandwiching the oscillator structure, and a confined structure in which a current passage region is surrounded by an oxidized layer, the confined structure being formed in the semiconductor distribution Bragg reflector and being formed by selectively oxidizing aluminum. In the surface emitting laser, the oxidized layer includes first and second boundary surfaces, the first boundary surface being provided at one side closer to the active layer and the second boundary surface being provided at the other side; the thickness of the oxidized layer gradually decreases as the distance to the current passage region decreases; and the second boundary surface is more inclined than the first boundary surface with respect to a virtual surface perpendicular to the laser light emitting direction.

By doing this, it becomes possible to increase the threshold current value in the higher-order lateral mode without degrading the slope efficiency in the fundamental lateral mode. Therefore, it becomes possible to obtain high single-mode output without incurring high cost.

In this description, it should be noted that when a composition gradient layer adjoins a refractive index layer, the optical thickness of the refractive index layer may include one-half of the composition gradient layer adjoining the refractive index layer.

According to another aspect of this disclosure, there is provided a surface emitting laser array in which the aforementioned surface emitting lasers are integrated.

By doing this, since a plurality of the aforementioned surface emitting lasers are included, it becomes possible to obtain high single-mode output without incurring high cost. Further, it becomes possible to make the manufacturing easier and the yield higher and to improve the service lifetime.

According to another aspect of this disclosure, there is provide an optical scanning device scanning a light on a scanning surface. The optical scanning device includes a light source including the aforementioned surface emitting laser array; a deflector deflecting light from the light source; and a scanning optical system focusing the light deflected by the deflector on the scanning surface.

By having this, since the light source of the optical scanning device includes the aforementioned surface emitting laser array, it becomes possible to perform highly-accurate optical scanning without incurring high cost.

According to another aspect of this disclosure, a first image forming apparatus includes at least one image carrier; and at least one of the aforementioned optical scanning device for scanning a light having image information onto the image carrier.

By having this, since the image forming apparatus includes at least one of the aforementioned optical scanning device, it becomes possible to form a high-quality image without incurring high cost.

According to another aspect of this disclosure, a second image forming apparatus includes an image carrier; the aforementioned surface emitting laser array; and an exposure device driving the surface emitting laser array in accordance with image information and exposing the image carrier.

By having this, the second image forming apparatus includes the aforementioned surface emitting laser array. Therefore, it becomes possible to form a high-quality image without incurring high cost.

According to another aspect of this disclosure, there is provided an optical transmission module generating an optical signal in accordance with an input signal. The optical transmission module includes the aforementioned surface emitting laser array; and a driving unit driving the surface emitting laser array in accordance with the input electronic signal.

By having this, since the optical transmission module includes the aforementioned surface emitting laser array, it becomes possible to generate a high-quality optical signal.

According to another aspect of this disclosure, there is provided an optical transmission system. The optical transmission system includes the aforementioned optical transmission module; an optical medium through which an optical signal generated by the optical transmission module is transmitted; and a converter converting the optical signal transmitted through the optical medium into an electronic signal.

By having this, since the optical transmission system includes the aforementioned optical transmission module, it becomes possible to perform high-quality optical data transmission.

DESCRIPTION OF THE REFERENCE NUMERALS

11a DEFLECTOR-SIDE SCANNING LENS (PART OF SCANNING OPTICAL SYSTEM)
11B IMAGE-SURFACE-SIDE SCANNING LENS (PART OF SCANNING OPTICAL SYSTEM)
13 POLYGON MIRROR (DEFLECTOR)
14 LIGHT SOURCE
100 SURFACE EMITTING LASER
103 LOWER SEMICONDUCTOR DBR (PART OF SEMICONDUCTOR DISTRIBUTION BRAGG REFLECTOR)
104 LOWER SPACER LAYER (PART OF OSCILLATOR STRUCTURE)
105 ACTIVE LAYER
106 UPPER SPACER LAYER (PART OF OSCILLATOR STRUCTURE)
107 UPPER SEMICONDUCTOR DBR (PART OF SEMICONDUCTOR DISTRIBUTION BRAGG REFLECTOR)
107a LOW REFRACTIVE INDEX LAYER
107a1 LOW REFRACTIVE INDEX LAYER (FIRST LAYER, THIRD LAYER)
107b HIGH REFRACTIVE INDEX LAYER
107c LOW REFRACTIVE INDEX LAYER (SECOND LAYER)
107m INTERMEDIATE LAYER (FIRST LAYER)
108 SELECTIVELY-OXIDIZED LAYER
108a OXIDIZED LAYER
108b CURRENT PASSAGE REGION
200 SURFACE EMITTING LASER
203 LOWER SEMICONDUCTOR DBR (PART OF SEMICONDUCTOR DISTRIBUTION BRAGG REFLECTOR)
204 LOWER SPACER LAYER (PART OF OSCILLATOR STRUCTURE)
205 ACTIVE LAYER

206 UPPER SPACER LAYER (PART OF OSCILLATOR STRUCTURE)
207 UPPER SEMICONDUCTOR DBR (PART OF SEMICONDUCTOR DISTRIBUTION BRAGG REFLECTOR)
207a LOW REFRACTIVE INDEX LAYER
208 SELECTIVELY-OXIDIZED LAYER
208a OXIDIZED LAYER
208b CURRENT PASSAGE REGION
303 LOWER SEMICONDUCTOR DBR (PART OF SEMICONDUCTOR DISTRIBUTION BRAGG REFLECTOR)
304 LOWER SPACER LAYER (PART OF OSCILLATOR STRUCTURE)
305 ACTIVE LAYER
306 UPPER SPACER LAYER (PART OF OSCILLATOR STRUCTURE)
307 UPPER SEMICONDUCTOR DBR (PART OF SEMICONDUCTOR DISTRIBUTION BRAGG REFLECTOR)
307a LOW REFRACTIVE INDEX LAYER
307a1 LOW REFRACTIVE INDEX LAYER (FIRST LAYER, THIRD LAYER)
307b HIGH REFRACTIVE INDEX LAYER
307c LOW REFRACTIVE INDEX LAYER (SECOND LAYER)
307m INTERMEDIATE LAYER (FIRST LAYER)
308 SELECTIVELY-OXIDIZED LAYER
308a OXIDIZED LAYER
308b CURRENT PASSAGE REGION
500 SURFACE EMITTING LASER ARRAY
600 SURFACE EMITTING LASER ARRAY
1000 LASER PRINTER (IMAGE FORMING APPARATUS)
1010 OPTICAL SCANNING DEVICE
1010A OPTICAL SCANNING DEVICE
1030 PHOTOSENSITIVE DRUM (IMAGE CARRIER)
1500 TANDEM COLOR MACHINE (IMAGE FORMING APPARATUS)
2000 OPTICAL TRANSMISSION SYSTEM
2001 OPTICAL TRANSMISSION MODULE
2002 LIGHT SOURCE
2003 DRIVING CIRCUIT (DRIVING DEVICE)
2004 OPTICAL FIBER CABLE (OPTICAL TRANSMISSION MEDIUM)
2006 LIGHT RECEIVING DEVICE (PART OF CONVERTER)
2007 RECEIVING CIRCUIT (PART OF CONVERTER)
K1, C1, M1, Y1 PHOTOSENSITIVE DRUM (IMAGE CARRIER)

BEST MODE FOR CARRYING OUT THE INVENTION

Surface Emitting Laser

First Embodiment

Figure 1:
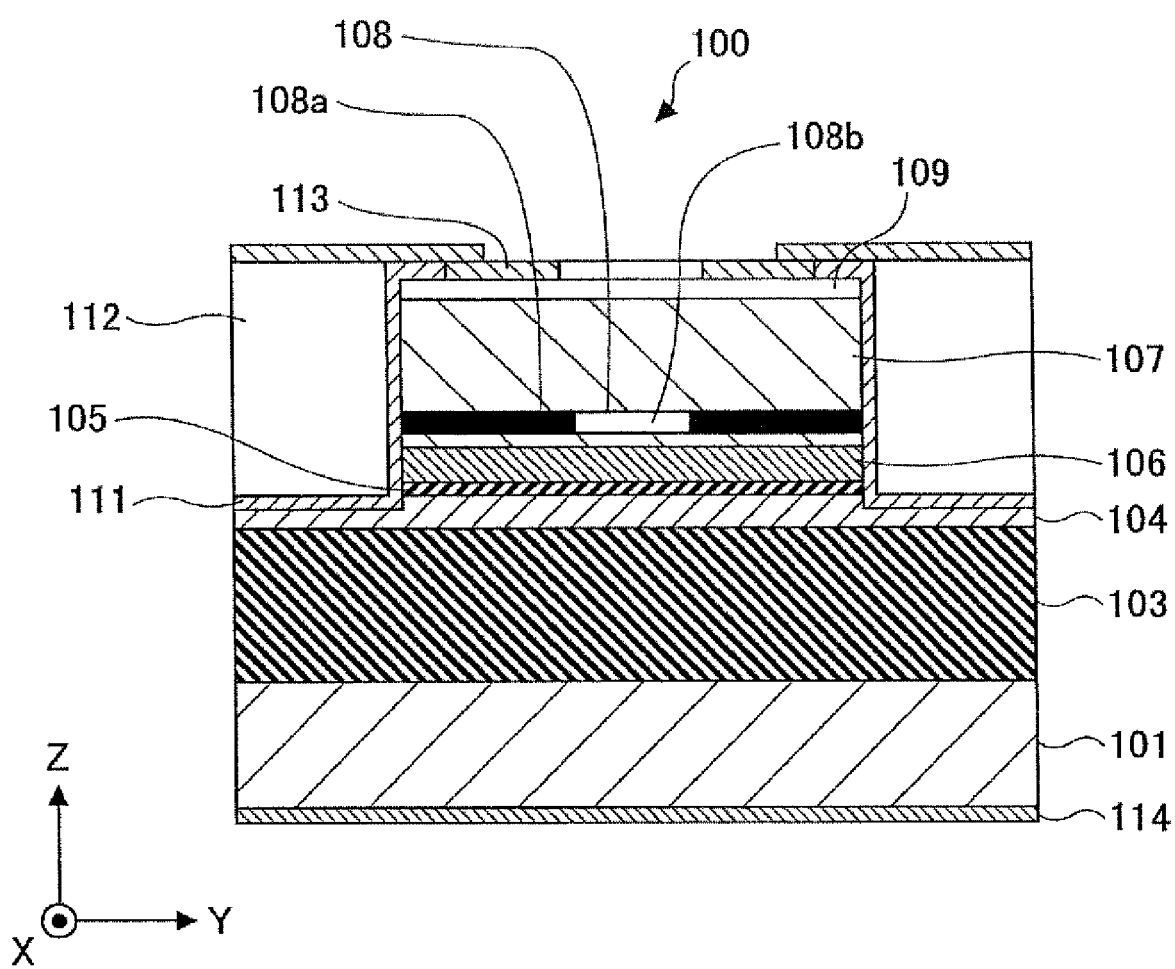
FIG. 1 is a schematic drawing showing a configuration of a surface emitting laser according to first and second embodiments of the present invention.

FIG. 1 is a cross-sectional diagram schematically showing a surface emitting laser 100 according to a first embodiment of the present invention. It should be noted that the Z-direction in the figures is the direction parallel to the laser oscillation direction, and X-direction and Y-direction are orthogonal to each other and in the plane orthogonal to the Z-direction.

Figure 2:
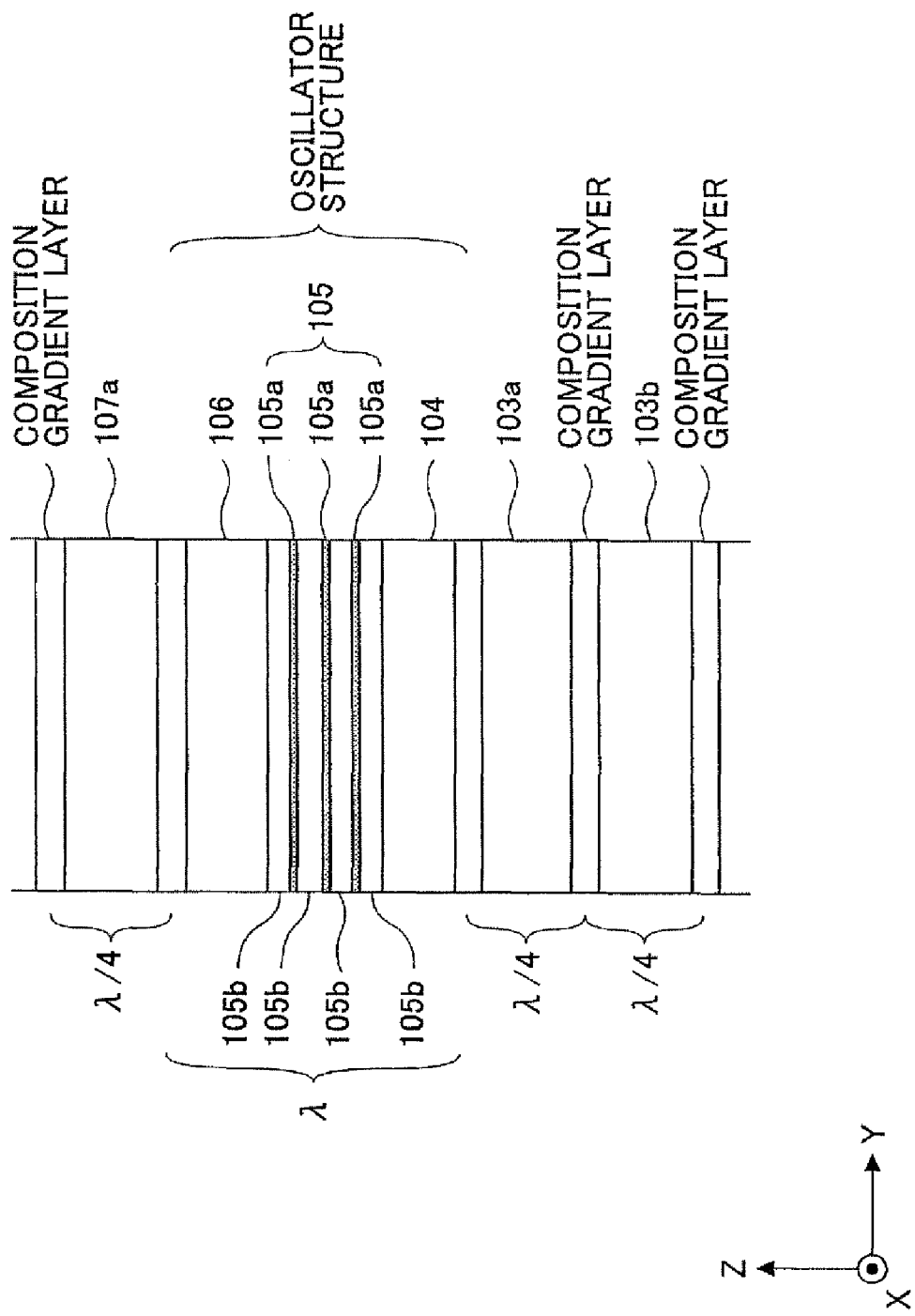
FIG. 2 is an enlarged drawing showing the vicinity of an active layer in FIG. 1 according to the first embodiment of the present invention.
Figure 3:
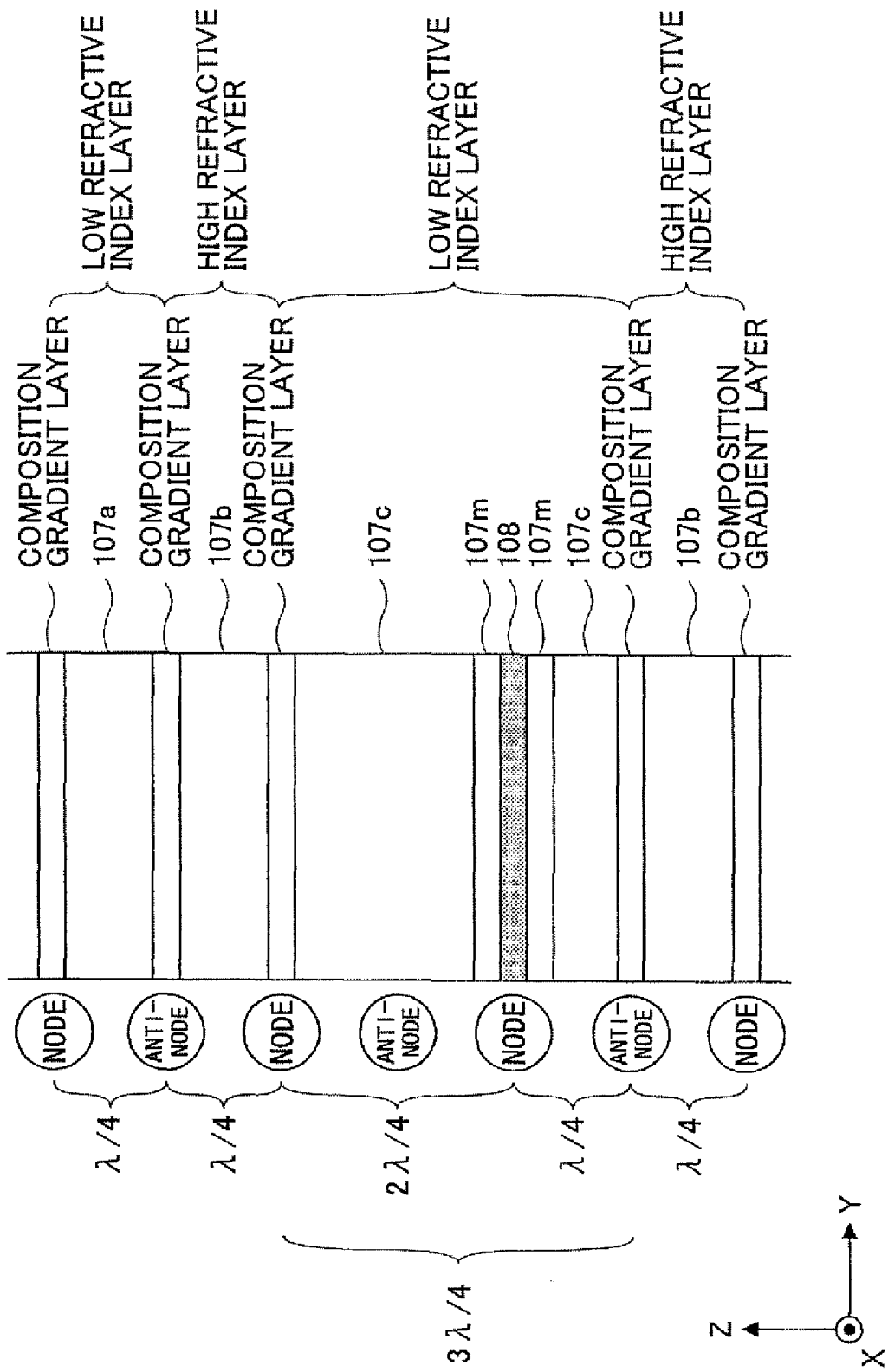
FIG. 3 is an enlarged drawing showing a part of an upper semiconductor DBR in FIG. 1 according to the first embodiment of the present invention.

The surface emitting laser 100 is designed to oscillate at the wavelength band of 850 nm. As shown in FIG. 1, in the surface emitting laser 100, a lower semiconductor DBR 103, a lower spacer layer 104, an active layer 105, an upper spacer layer 106, an upper semiconductor DBR 107, and a contact layer 109 are sequentially laminated in this order on a substrate 101. In the following, it should be noted that a laminated structure including plural semiconductor layers may be called a "laminated body" for convenience. FIG. 2 is an enlarged view of the vicinity of the active layer 105, and FIG. 3 is a partially-enlarged view of the upper semiconductor DBR 107.

The substrate 101 is an n-GaAs single-crystal substrate.

The lower semiconductor DBR 103 includes 40.5 pairs of a low refractive index layer 103a made of "n-$Al_{0.9}Ga_{0.1}As$" and a high refractive index layer 103b made of "n-$Al_{0.1}Ga_{0.9}As$". Further, a composition gradient layer is interposed between each of the refractive index layers (see FIG. 2) to reduce the electrical resistance. In the composition gradient layer, composition is gradually changed from one side to the other side. It should be noted that each of the refractive index layers is designed so that the optical thickness with respect to the refractive index layer and one-half of each of the composition gradient layers adjoining the refractive index layer is equal to $\lambda/4$ ($\lambda$:oscillation wavelength). Further, it should be noted that there is the relationship between the optical thickness of a layer and an actual thickness of the layer, in which when the optical thickness of a layer is $\lambda/4$, the actual thickness "d" of the layer is expressed by the following formula:

$$d=\lambda/4N$$

where: "N" denotes a refractive index of the medium of the layer.

The lower spacer layer 104 is a layer made of $Al_{0.4}Ga_{0.6}As$.

The active layer 105 includes three quantum well layers 105a made of GaAs and four barrier layers 105b made of $Al_{0.3}Ga_{0.7}As$ (see FIG. 2).

The upper spacer layer 106 is made of $Al_{0.4}Ga_{0.6}As$.

A multilayer part including the lower spacer layer 104, the active layer 105, and the upper spacer layer 106 may be called an "oscillator structure". The oscillation structure is designed so that the optical length thereof is equal to one wavelength in optical thickness. It should be noted that the active layer 105 is located at the position of the middle of the "oscillator structure" so as to obtain high stimulated emission probability, the position corresponding to an antinode position of the standing wave distribution of the electric field.

This oscillator structure is sandwiched between the lower semiconductor DBR 103 and the upper semiconductor DBR 107.

The upper semiconductor DBR 107 includes 24 pairs of a low refractive index layer and a high refractive index layer. Further, a composition gradient layer is interposed between each of the refractive index layers (see FIG. 3) to reduce the electrical resistance. In the composition gradient layer, the composition is gradually changed from one side to the other side.

The upper semiconductor DBR 107 includes a selectively-oxidized layer 108 made of p-AlAs and having a thickness of 20 nm as one of the low refractive index layers. The interposing position of the selectively-oxidized layer 108 is optically separated from the upper spacer layer 106 by $5\lambda/4$. Further, the low refractive index layer including selectively-oxidized layer 108 is designed so that the optical thickness of the low refractive index layer and one-half of each of the composition gradient layers adjoining the low refractive index layer is equal to $3\lambda/4$.

Further, the upper semiconductor DBR 107 is designed so that the positions of the selectively-oxidized layer 108 and the composition gradient layer positioned on +Z side of the low refractive index layer including selectively-oxidized layer 108 correspond to a node position of the electric field intensity distribution (see FIG. 3).

In the upper semiconductor DBR 107, each of the refractive index layers excluding the low refractive index layer including selectively-oxidized layer 108 is designed so that the optical thickness of the refractive index layer and one-half of each of the composition gradient layers adjoining the refractive index layer is equal to λ/4.

On each of the +Z and −Z sides of the selectively-oxidized layer 108, an intermediate layer 107m made of p-$Al_{0.83}Ga_{0.17}As$ and having a thickness of 20 nm is provided.

A layer 107c adjoining each intermediate layer 107m in the low refractive index layer including selectively-oxidized layer 108 is made of p-$Al_{0.75}Ga_{0.25}As$ (hereinafter, the layer 107c is referred to as a "low refractive index layer 107c").

In the upper semiconductor DBR 107, each of low refractive index layers 107a excluding the low refractive index layer including selectively-oxidized layer 108 is made of p-$Al_{0.9}Ga_{0.1}As$. Further, in the upper semiconductor DBR 107, each of high refractive index layers 107b is made of p-$Al_{0.1}Ga_{0.9}As$.

Namely, the selectively-oxidized layer 108 is included in one of the low refractive index layers in the upper semiconductor DBR 107. Further, the low refractive index layer including the selectively-oxidized layer 108 further includes two intermediate layers 107m both adjoining the selectively-oxidized layers 108 and two low refractive index layers 107c adjoining the corresponding intermediate layers 107m. Further, the Al content rate in the intermediate layer 107m is less than that in the selectively-oxidized layer 108 by 17%; and the Al content rate in the low refractive index layer 107c is less than that in the selectively-oxidized layer 108 by 25%.

The contact layer 109 is made of p-GaAs.

Next, a method of manufacturing the surface emitting laser 100 is briefly described.

(1): The above laminated body is formed by crystal growth by the MOCVD (Metal Organic Chemical Vapor Deposition) method or the MBE (Molecular Beam Epitaxy) method.

In this case, trimethyl aluminium (TMA), trimethyl gallium (TMG), and trimethyl indium (TMI) are used as group III materials, and arsine ($AsH_3$) gas is used as a group V material. Carbon tetrabromide ($CBr_4$) is used as p-type dopant material and hydrogen selenide ($H_2Se$) is used as n-type dopant material.

(2): A resist pattern having a square shape with one side having a length of 20 μm is formed on a surface of the laminated body.

(3): By the ECR etching method using $Cl_2$ gas, a mesa having a square pillar shape is formed using the resist pattern as a photomask. In this case, the etching is performed so that the bottom surface of the etching is stopped in the lower spacer layer 104.

(4): The photomask is removed.

(5): The laminated body is heat-processed with water vapor. In this case, Al in the selectively-oxidized layer 108 and the intermediate layer 107m is selectively oxidized from the side surface of the mesa. Then, a region 108b that remains unoxidized and that is surrounded by an Al-oxidized layer 108a is formed in the middle of the mesa. By doing this, a so-called the oxide-confined structure is formed for limiting the passage of the driving current for the light emitting section to the middle region of the mesa. The unoxidized region is the current passage region (current injection region). It should be noted that the oxidized layer 108a includes Al oxide of the selectively-oxidized layer 108 and the intermediate layer 107m.

(6): A protection layer 111 made of SiN or $SiO_2$ is formed using the CVD (Chemical Vapor Deposition) method (see FIG. 1).

(7): Polyimide 112 is used to perform flattening (see FIG. 1).

(8): A window for p-side electrode contact is opened on the upper side of the mesa. In this case, after a photoresist is used for masking, the opening on the upper side of the mesa is exposed to remove the photoresist on the opening. Then, the polyimide 112 and the protection layer 111 are etched using BHF to form the opening.

(9): A resist pattern having a square pattern with one side having a length of 10 μm is formed in a region to be formed as the light emitting section on the upper side of the mesa, so that p-side electrode material is evaporated. As the p-side electrode material, a multilayer film made of Cr/AuZn/Au or a multilayer film made of Ti/Pt/Au is used.

(10): The electrode material of the light emitting section is lifted off to form a p-side electrode 113 (see FIG. 1).

(11): After polishing the rear side of the substrate 101 so as to have a prescribed thickness (for example, about 100 μm), an n-side electrode 114 is formed (see FIG. 1). In this case, the n-side electrode 114 is a multilayer film made of AuGe/Ni/Au.

(12): An annealing process is performed so as to produce ohmic conductivity with respect to the p-side electrode 113 and the n-side electrode 114. By doing this the mesa becomes the light emitting section.

(13) The wafer is cut into chips.

The oxide-confined structures of the thus-manufactured plural surface emitting lasers 100 were observed using an SEM (Scanning Electron Microscope). The result of the observation showed that the thickness of the oxidized layers 108a on the side surface of the mesa where the oxidation starts was in a range from 60 nm to 70 nm, and the variation of the thickness was small; the current passage regions 108b showed a desired square shape; and the variation of the characteristics such as threshold value current was small.

Figure 4:
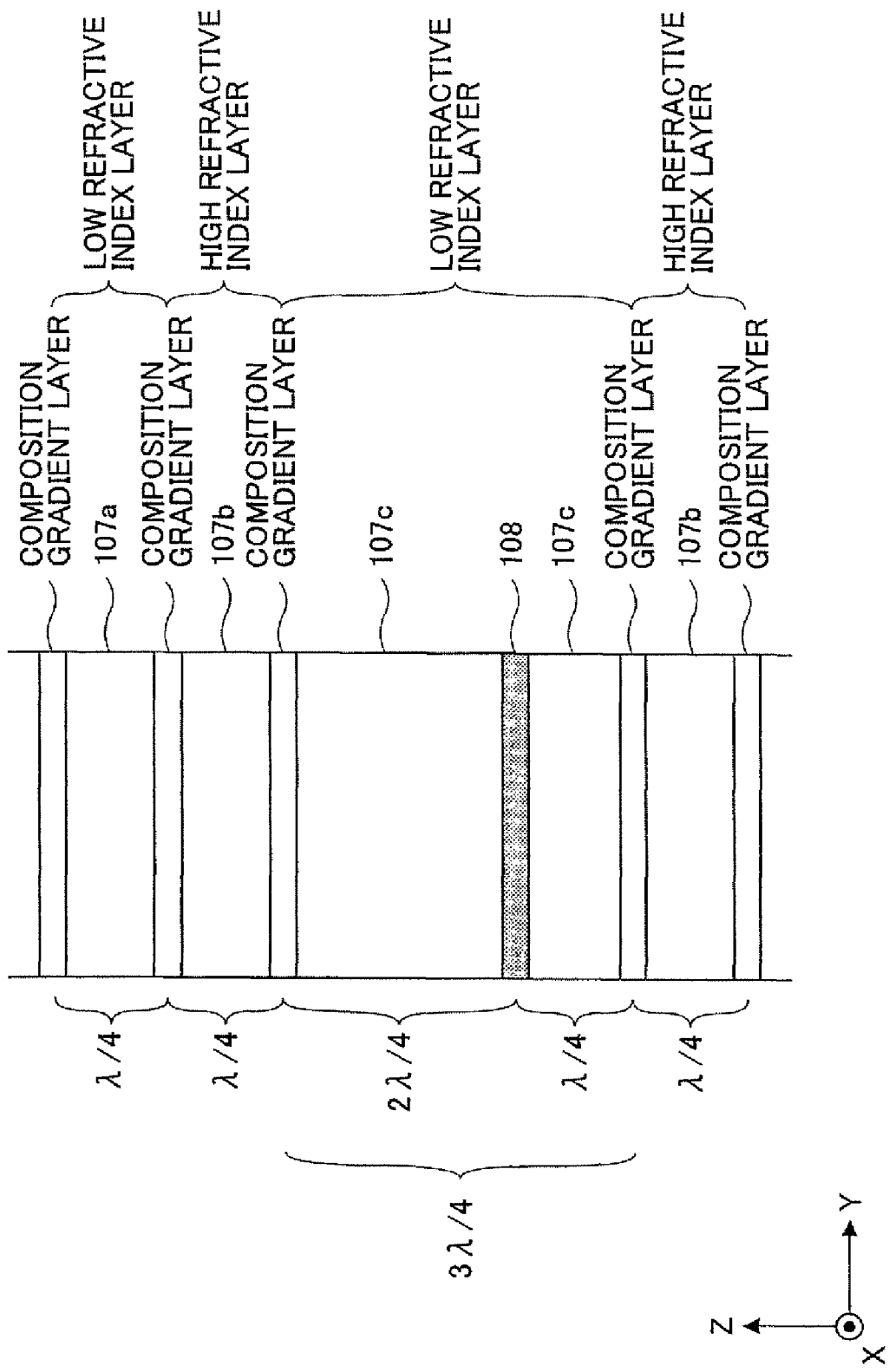
FIG. 4 is a drawing showing a comparative example 1 of the upper semiconductor DBR in FIG. 1.

As a comparative example 1, a case was considered where the intermediate layer 107m was not formed as shown in FIG. 4. In this case, the thickness of the oxidized layers 108a on the side surface of the mesa where the oxidation starts was in a range from 40 nm to 50 nm., and the variation of the thickness was small. However, the oxidation rate in the X-Y plane varies remarkably, and the shape of the current passage regions 108b did not match the shape of the mesas and had shapes other than a square. The current passage region 108b having a desired size and shape could not be obtained. Further, the variation of the characteristics such as threshold value current was large. Therefore, the configuration in this case provides less control as an epitaxial configuration.

Figure 5:
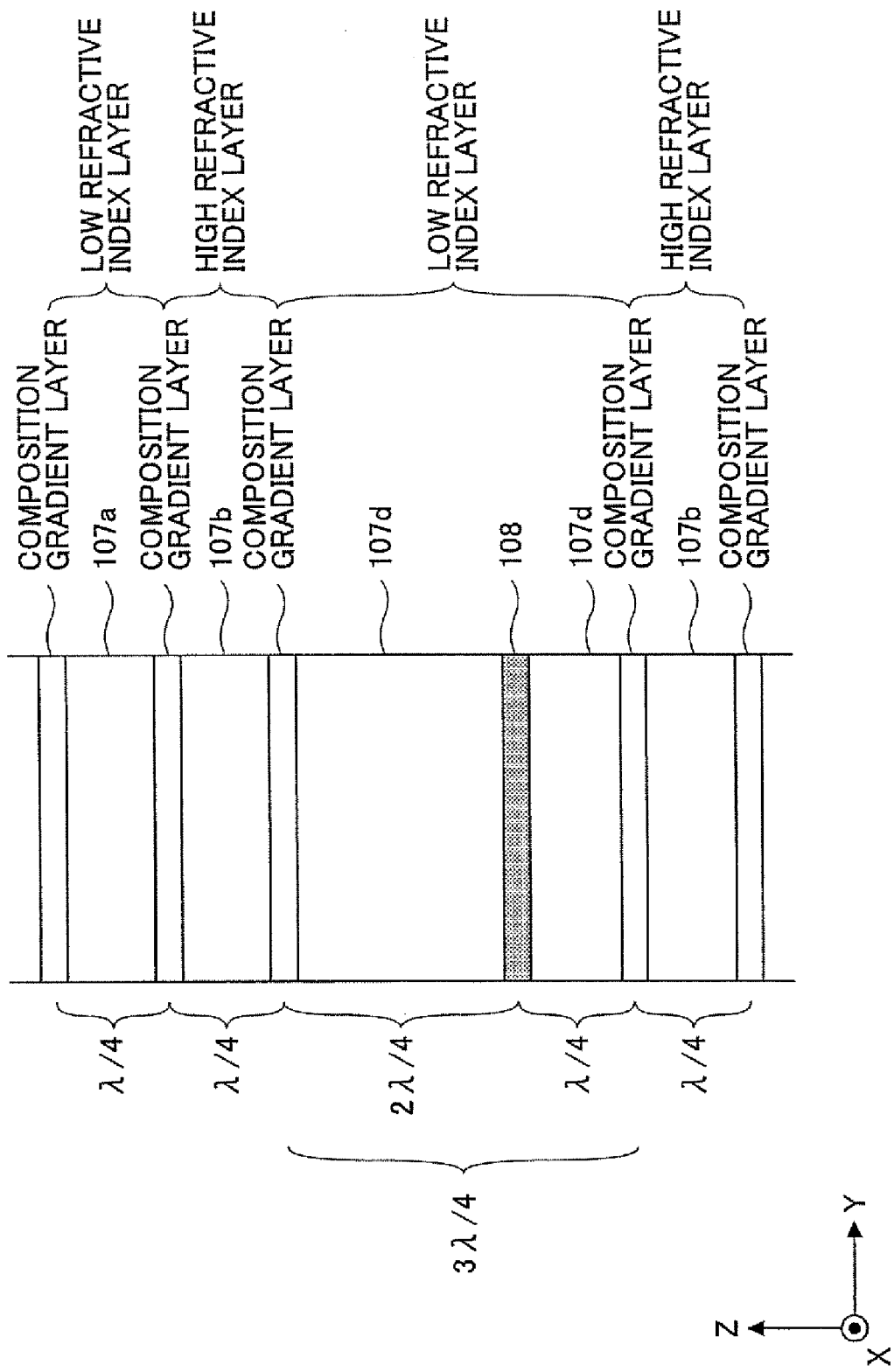
FIG. 5 is a drawing showing a comparative example 2 of the upper semiconductor DBR in FIG. 1.

Further, as a comparative example 2, a case is considered where the low refractive index layers 107c shown in FIG. 4 were replaced by low refractive index layers 107d made of p-$Al_{0.83}Ga_{0.17}As$ as shown in FIG. 5. In this case, the shape of the current passage regions 108b generally matched the square shape like a shape of the surface emitting laser 100. However, the thickness of the oxidized layers 108a on the side surface of the mesas where the oxidation starts largely varied from 80 nm to 160 nm, and the thickness of the oxidized layers 108a at their oxidation stopping end was almost the same as that of the selectively-oxidized layers 108. Namely, the thickness of the oxidized layers 108a gradually decreased from their oxidation starting end to their oxidation stopping end so that the oxidized layer 108a had a tapered shape. This phenomenon showed that the oxidation proceeded not only toward the center of the mesa in the X-Y plane but also in the laminating direction (this case, Z-direction) simultaneously. The thinner the oxidized layer 108a is, the greater single-mode output power is likely to become and the narrower the light divergence angle is likely to become. Therefore, the single-mode output power and the light divergence angle varied largely. Further, products having a thicker oxidized layer on the side surface of the mesa had a shorter service lifetime.

When the above cases are considered together, it is understood that by forming the intermediate layer 107m adjoining the selectively-oxidized layer 108, it becomes possible to (1) control the oxidation rate in the X-Y plane very accurately and (2) make the oxidized layers 108a uniformly thin.

With the configuration of this embodiment, the oxidation smoothly proceeds in the X-Y plane chiefly because the intermediate layers 107m having an Al content rate of 83% are provided so that both of the intermediate layers 107m adjoin the selectively-oxidized layer 108. However, on the other hand, the oxidation does not largely proceed in the laminating direction (this case, Z-direction) chiefly because the intermediate layer 107m is a thin layer having the thickness of 20 nm and the low refractive index layers 107c having an Al content rate of 75% are provided so that the low refractive index layers 107c adjoin the corresponding intermediate layers 107m.

As a result, it becomes possible to provide more control over the size of the current passage region 108b and the thickness of the oxidized layers 108a, thereby enabling reducing the variation of the characteristics of the threshold value current, single-mode output power, the light divergence angle, the service lifetime, and the like.

Preferably, the difference in Al content rate between the selectively-oxidized layer 108 and the intermediate layers 107m is 5% or more and 20% or less; and the difference in Al content rate between the selectively-oxidized layer 103 and the low refractive index layers 107c is 20% or more.

As described above, in a surface emitting laser 100 according to the first embodiment of the present invention, the selectively-oxidized layer 108 is included in one of the low refractive index layers in the upper semiconductor DBR 107, and the low refractive index layer including the selectively-oxidized layer 108 further includes two intermediate layers 107m both adjoining the selectively-oxidized layer 108 and two low refractive index layers 107c adjoining the corresponding intermediate layers 107m. Further, the Al content rate of the intermediate layers 107m is less than that in the selectively-oxidized layer 108 by 17%; and the Al content rate of the low refractive index layers 107c is less than that in the selectively-oxidized layer 108 by 25%. By this structure, it becomes possible to provide more control over the oxidation rate in the X-Y plane of the selectively-oxidized layer 108 and the thickness of the oxidized layers 108a, thereby enabling reducing the variation of the thickness of the oxidized layers 108a. Namely, it becomes possible to easily increase the yield in manufacturing the surface emitting lasers and reduce the negative influence of the distortion to the active layer 105, thereby increasing the service lifetime.

Further, the optical thickness of the low refractive index layer including the selectively-oxidized layer 108 is made equal to $3\lambda/4$. By doing this, it becomes possible for each of the selectively-oxidized layer 108 and the composition gradient layer positioned on +Z side of the low refractive index layer including selectively-oxidized layer 108 to be located at a node position of the electric field intensity distribution. As a result, it becomes possible to reduce the diffraction loss due to the selectively-oxidized layer 108 and the absorption loss in the heavily-doped composition gradient layer. It should be noted that when the optical thickness of the low refractive index layer including the selectively-oxidized layer 108 is equal to $(2n+1)\lambda/4$ ($\lambda$:oscillation wavelength, n: integer$\geq 1$), it becomes possible for the selectively-oxidized layer 108 and the composition gradient layer positioned on +Z side of the low refractive index layer including the selectively-oxidized layer 108 to be located at a node position of the electric field intensity distribution.

In this first embodiment, it is assumed that the intermediate layer is provided on the upper and the lower sides (both sides) of the selectively-oxidized layer. However, the present invention is not limited to this configuration. For example, the intermediate layer may be provided only on one side of the selectively-oxidized layer.

Further, in this first embodiment, a case is described where the optical thickness of the low refractive index layer and one-half of each of the composition gradient layers adjoining the low refractive index layer is equal to $3\lambda/4$. However, the present invention is not limited to this case.

Figure 6:
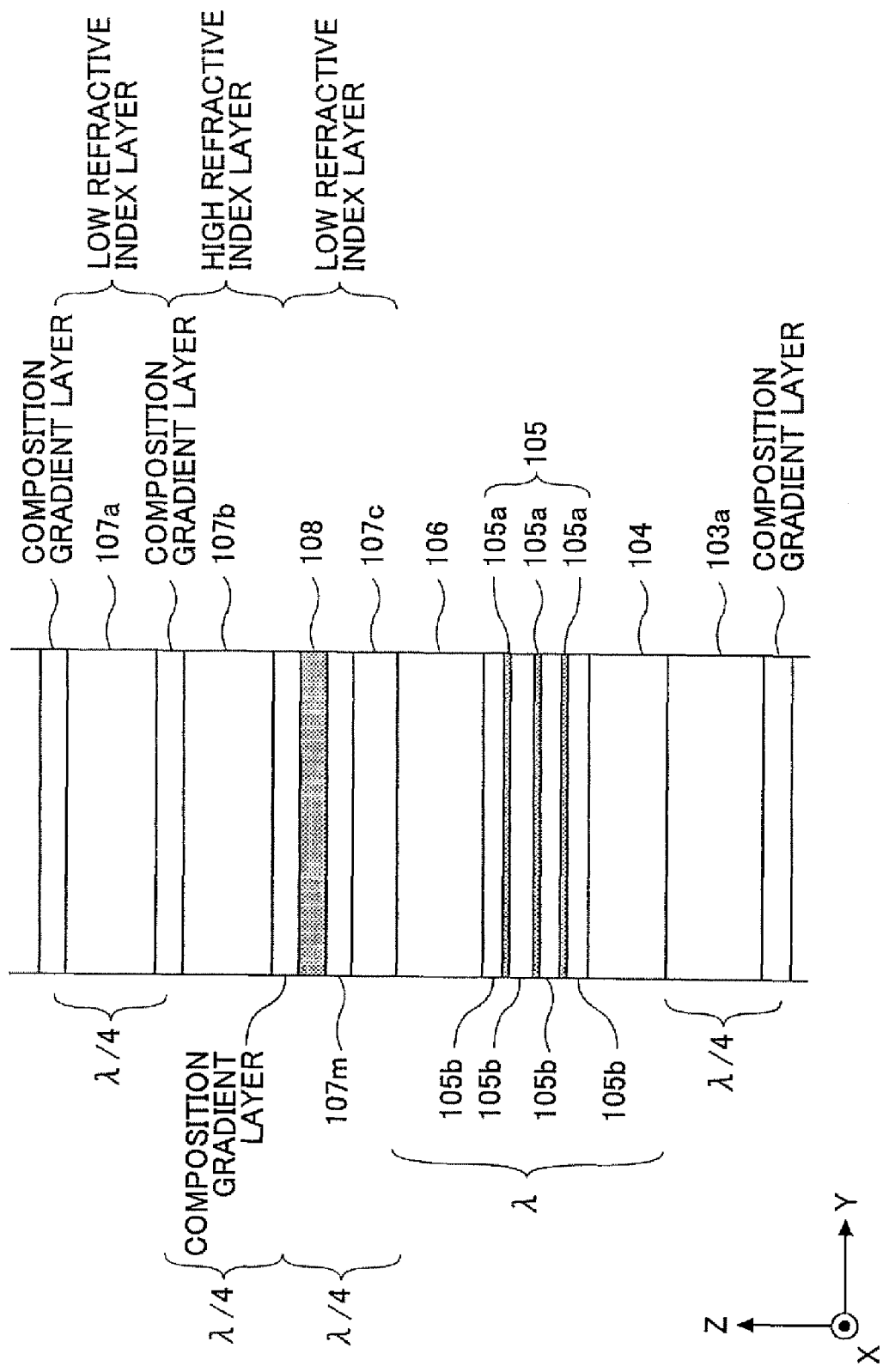
FIG. 6 is a drawing showing a modified example of the upper semiconductor DBR in FIG. 1.

For example, another exemplary case is shown in FIG. 6 where the optical thickness of the low refractive index layer and one-half of each of the composition gradient layers adjoining the low refractive index layer is equal to $\lambda/4$.

In FIG. 6, the selectively-oxidized layer 108 is interposed at a position optically separated from the upper spacer layer 106 by $\lambda/4$. Further, the intermediate layer 107m and the low refractive index layer 107c are provided on -Z side of the selectively-oxidized layer 108, and the high refractive index layers 107b is provided on +Z side of the selectively-oxidized layer 108 with a composition gradient layer provided between the high refractive index layers 107b and the selectively-oxidized layer 108. In this case, as well, it becomes possible to provide more control over the oxidation rate in the X-Y plane of the selectively-oxidized layer 108 and the thickness of the oxidized layers 108a than in a conventional case.

Further, in this first embodiment, a case is described where the shape of the mesa when cut along a plane perpendicular to the laser oscillation direction is a square. However, the present invention is not limited to this shape. The shape may be any other shape including circular, ellipsoidal, and rectangular shapes.

Further, in this first embodiment, a case is described where the etching is performed so that the bottom surface of the etching is stopped in the lower spacer layer. However, the present invention is not limited to this configuration. For example, the etching may be performed so that the bottom surface of the etching reaches the lower semiconductor DBR.

Further, in this first embodiment, a case is described where the oscillation wavelength of the surface emitting laser is 780 nm band. However, the present invention is not limited to this configuration. For example, another wavelength band such as 650 nm, 780 nm, 980 nm, 1.3 µm, or 1.5 µm may be used. In such a case, as the semiconductor material of the active layer, semiconductor material in accordance with the oscillation wavelength may be used. For example, AlGaInP-type mixed crystal semiconductor may be used for the 650 nm band, InGaAs-type mixed crystal semiconductor may be used for the 980 nm band, and GaInNAs(Sb)-type mixed crystal semiconductor may be used for the 1.3 µm and the 1.5 µm bands.

Surface Emitting Laser

Second Embodiment

FIG. 1 is a cross-sectional diagram schematically showing a surface emitting laser 100 according to a second embodiment of the present invention.

Figure 7:
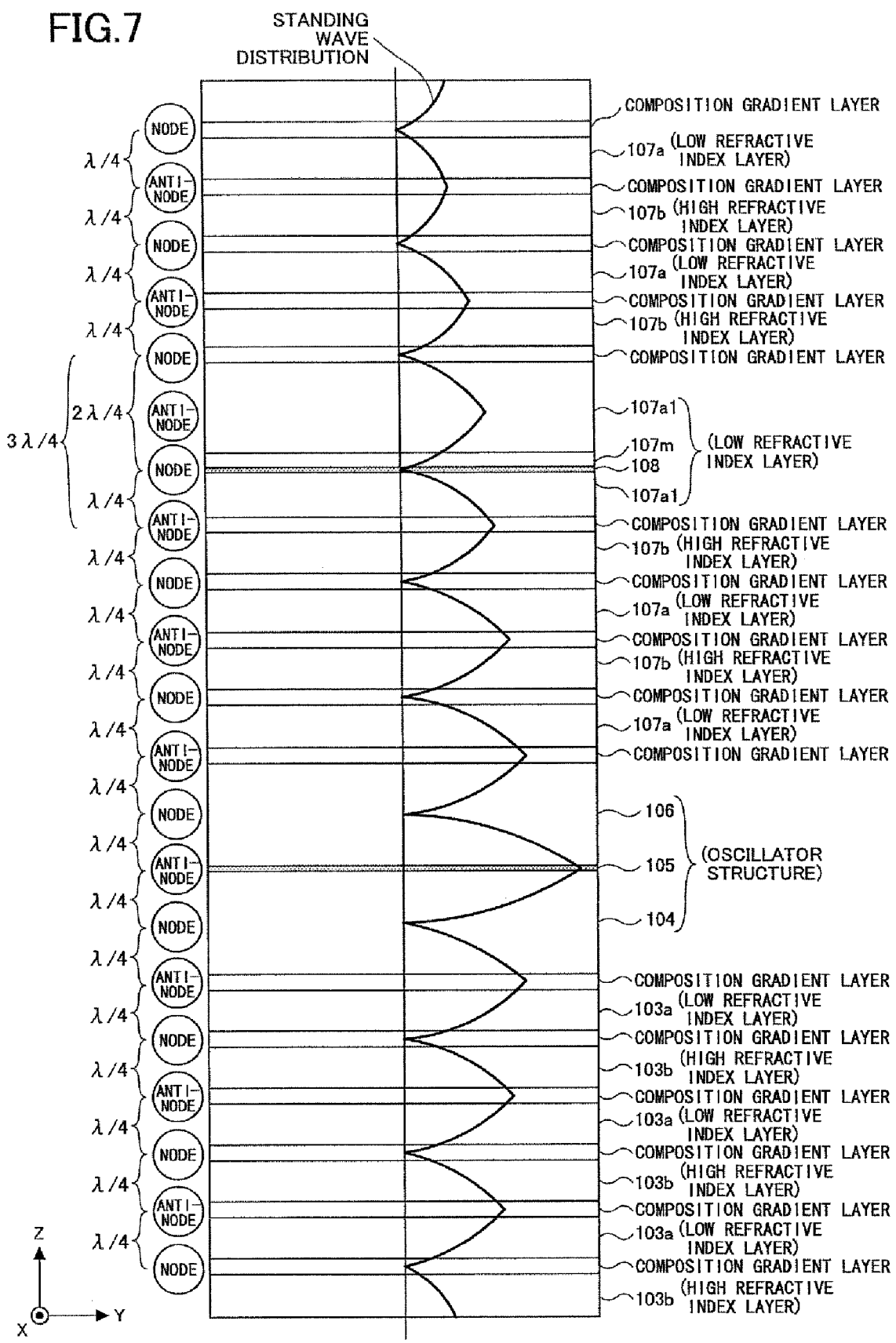
FIG. 7 is an enlarged drawing showing a part of an upper semiconductor DBR in FIG. 1 according to the second embodiment of the present invention.

The surface emitting laser 100 is designed to oscillate at the wavelength band of 780 nm. As shown in FIG. 1, the surface emitting laser 100 includes semiconductor layers such as a substrate 101, a lower semiconductor DBR 103, a lower spacer layer 104, an active layer 105, an upper spacer layer 106, an upper semiconductor DBR 107, and a contact layer 109, laminated with each other. In the following, it should be noted that a laminated structure including plural semiconductor layers may be called a "laminated body" for convenience. FIG. 2 is an enlarged view of the vicinity of the active layer 105, and FIG. 7 is a partially-enlarged view of the upper semiconductor DBR 107.

The substrate 101 is a single-crystal substrate made of n-GaAs.

The lower semiconductor DBR 103 includes 40.5 pairs of a low refractive index layer 103a made of n-AlAs and a high refractive index layer 103b made of n-$Al_{0.3}Ga_{0.7}As$. Further, a composition gradient layer is interposed between each of the refractive index layers (see FIG. 2) to reduce the electrical resistance. In the composition gradient layer, the composition is gradually changed from one side to the other side. It should be noted that each of the refractive index layers is designed so that the optical thickness with respect to the refractive index layer and one-half of each of the composition gradient layers adjoining the refractive index layer is equal to $\lambda/4$ ($\lambda$:oscillation wavelength).

The lower spacer layer 104 is made of $(Al_{0.7}Ga_{0.3})_{0.5}In_{0.5}P$.

The active layer 105 includes three quantum well layers 105a made of GaInPAs and four barrier layers 105b made of $Ga_{0.6}In_{0.4}P$ (see FIG. 2). The quantum well layers 105a have compressive stress with respect to the substrate 101, and the band-gap wavelength is about 780 nm. Further, the barrier layers 105b are in lattice matching with the quantum well layers 105a and have tensile strain.

The upper spacer layer 106 is made of $(Al_{0.7}Ga_{0.3})_{0.5}In_{0.5}P$.

A multilayer part including the lower spacer layer 104, the active layer 105, and the upper spacer layer 106 may be called an "oscillator structure". The oscillation structure is designed so that the optical length thereof is equal to one wavelength in optical thickness. It should be noted that the active layer 105 is located at the position of the middle of the "oscillator structure" so as to obtain high stimulated emission probability, the position corresponding to an antinode position of the standing wave distribution of the electric field.

The upper semiconductor DBR 107 includes 24 pairs of a low refractive index layer and a high refractive index layer. Further, a composition gradient layer is interposed between each of the refractive index layers to reduce the electrical resistance. In the composition gradient layer, the composition is gradually changed from one side to the other side.

The upper semiconductor DBR 107 includes a selectively-oxidized layer 108 made of p-AlAs and having a thickness of 30 nm as one of the low refractive index layers. The interposing position of the selectively-oxidized layer 108 is optically separated from the upper spacer layer 106 by, for example, $5\lambda/4$, as shown in FIG. 7 and is included in the low refractive index layer which is the third pair from the upper spacer layer 106. Further, the low refractive index layer including selectively-oxidized layer 108 is designed so that the optical thickness of the low refractive index layer and one-half of each of the composition gradient layers adjoining the low refractive index layer is equal to $3\lambda/4$.

Further, the upper semiconductor DBR 107 is designed so that each of the selectively-oxidized layer 108 and the composition gradient layer positioned on +Z side of the low refractive index layer including selectively-oxidized layer 108 is located at a node position of the electric field intensity distribution.

The refractive index layers excluding the low refractive index layer including selectively-oxidized layer 108 are designed so that the optical thickness of the refractive index layer and one-half of each of the composition gradient layers adjoining the refractive index layer is equal to $\lambda/4$.

An intermediate layer 107m made of p-$Al_{0.83}Ga_{0.17}As$ and having a thickness of 35 nm is provided on the +z side of the selectively-oxidized layer 108.

A layer 107a1 made of p-$Al_{0.75}Ga_{0.25}As$ (hereinafter referred to as a "low refractive index layer 107a1" for convenience) is provided on the −Z side of the selectively-oxidized layer 108 and the +Z side of the intermediate layer 107m.

Therefore, in the upper semiconductor DBR 107, the low refractive index layer including the selectively-oxidized layer 108 further includes the intermediate layer 107m and two low refractive index layer 107a1.

In the upper semiconductor DBR 107, the low refractive index layers 107a excluding the low refractive index layer including selectively-oxidized layer 108 are made of p-$Al_{0.9}Ga_{0.1}As$.

Further, in the upper semiconductor DBR 107, the high refractive index layers 107b are made of p-$Al_{0.3}Ga_{0.7}As$.

Namely, the center position of the selectively-oxidized layer 108 with respect to its thickness direction corresponds to a node position of the standing wave distribution of the electric field (hereinafter simplified as "standing wave distribution" for convenience), and the selectively-oxidized layer 108 is interposed between the intermediate layer 107m and the low refractive index layer 107a1. Further, Al content rate in the intermediate layer 107m and the low refractive index layer 107a1 is less than that in the selectively-oxidized layer 108. Further, Al content rate in the low refractive index layer 107a1 is less than that in the intermediate layer 107m. Further, Al content rate in the low refractive index layer 107a1 is less than that in the low refractive index layer 107a.

The contact layer 109 is made of p-GaAs.

Next, a method of manufacturing the surface emitting lasers 100 according to the second embodiment of the present invention is briefly described.

(1): The above laminated body is formed by crystal growth by the MOCVD (Metal Organic Chemical Vapor Deposition) method or the MBE (Molecular Beam Epitaxy) method.

In this case, trimethyl aluminium (TMA), trimethyl gallium (TMG), and trimethyl indium (TMI) are used as a group III material, and arsine ($AsH_3$) gas is used as group V materials. Carbon tetrabromide ($CBr_4$) is used as p-type dopant material and hydrogen selenide ($H_2Se$) is used as n-type dopant material.

(2): A resist pattern having a square shape with one side having a length of 20 μm is formed on a surface of the laminated body.

Figure 8:
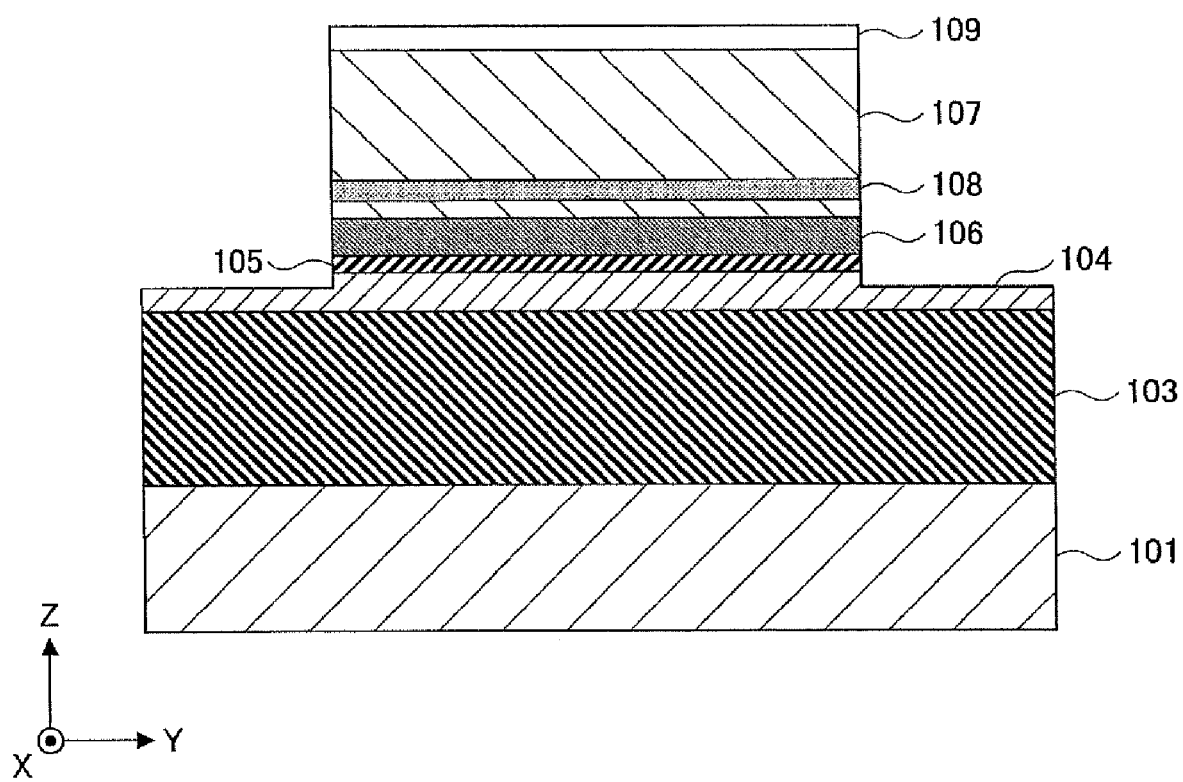
FIG. 8 is a drawing showing a laminated body in which a mesa is formed.

(3): By the ECR etching method using $Cl_2$ gas, a mesa having a square pillar shape is formed using the resist pattern having a square shape as a photomask. In this case, the etching is performed so that the bottom surface of the etching is stopped in the lower spacer layer 104. (see FIG. 8)

(4): The photomask is removed.

Figure 9:
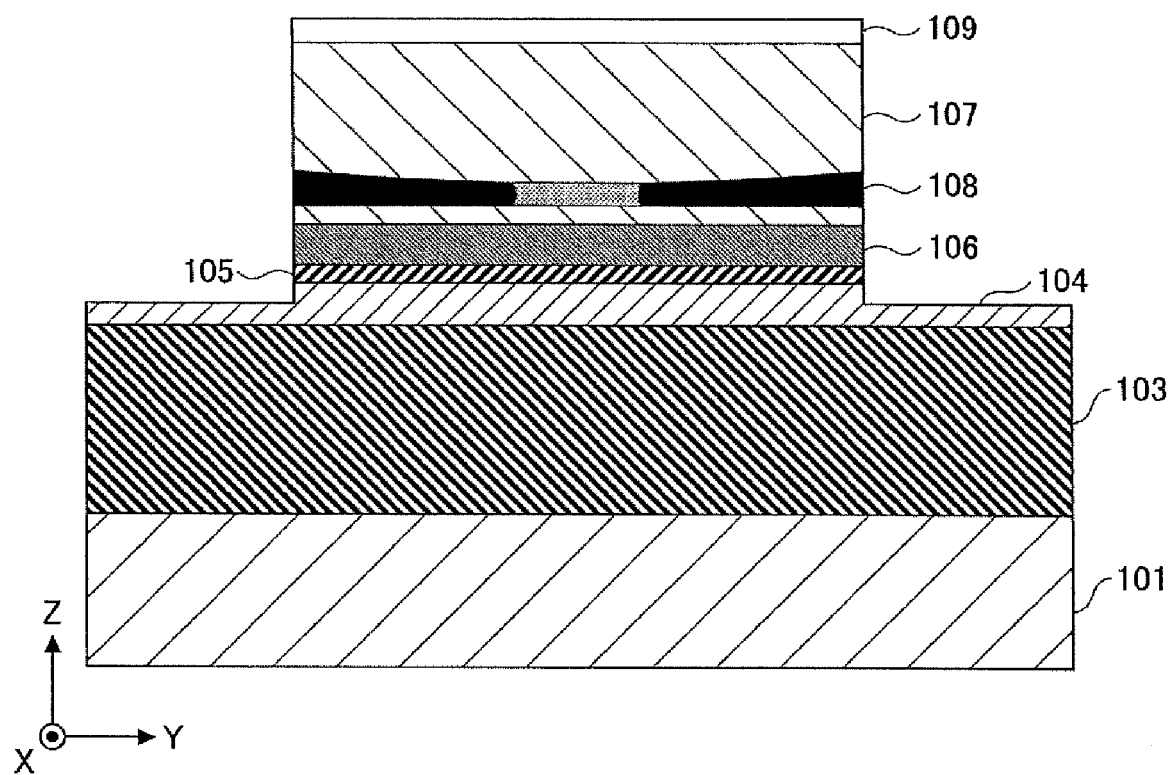
FIG. 9 is a drawing showing a laminated body after being heat-processed under a water-vapor atmosphere.

(5): The laminated body is heat-processed with water vapor. In this case, Al in the selectively-oxidized layer 108 and the intermediate layer 107m is selectively oxidized. Then, a region that remains unoxidized is formed in the middle of the mesa (see FIG. 9). By doing this, the so-called oxide-confined structure is formed for limiting the passage of the driving current for the light emitting section to the middle region of the mesa. The unoxidized region is the current passage region (current injection region).

Figure 10:
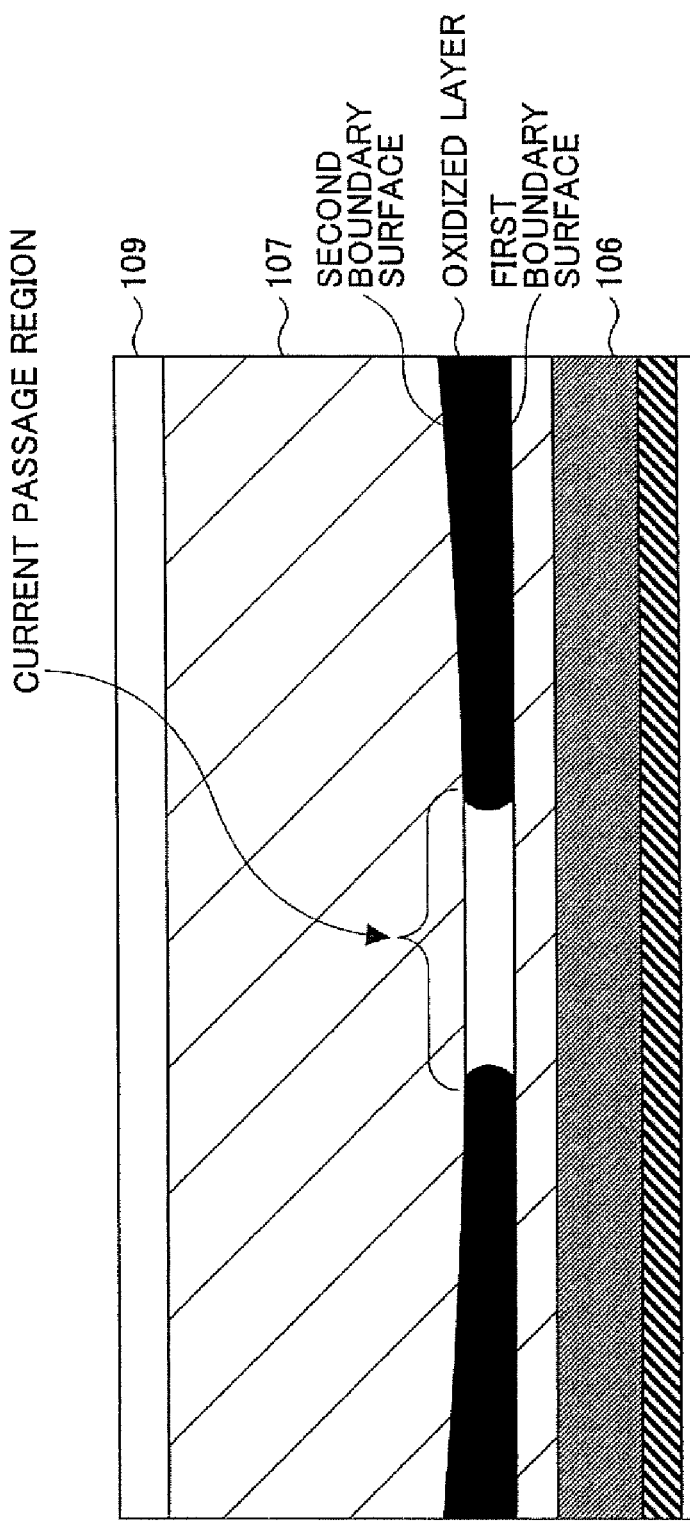
FIG. 10 is a partially enlarged drawing of the laminated body in FIG. 9.

In this case, as shown in FIG. 10, the oxidized layer has a first boundary surface on one side closer to the active layer 105 and a second boundary surface on the other side. The thickness of the oxidized layer gradually decreases as the distance to the current passage region decreases. Further, the second boundary surface is more inclined than the first boundary surface with respect to a virtual surface perpendicular to the laser light emitting direction (in this case, the Z direction).

It should be noted that the oxidized layer includes Al oxide of the selectively-oxidized layer 108 and the intermediate layer 107m.

(6): A protection layer 111 made of SiN is formed using the CVD (Chemical Vapor Deposition) method (see FIG. 1).

(7): Polyimide 112 is used to perform flattening (see FIG. 1).

(8): A window for p-side electrode contact is opened on the upper side of the mesa. In this case, after a photoresist is used for masking, the opening on the upper side of the mesa is exposed to remove the photoresist on the opening. Then, the polyimide 112 and the protection layer 111 are etched using BHF to form the opening.

(9): A resist pattern having a square pattern with one side having a length of 10 μm is formed in a region to be formed as the light emitting section on the upper side of the mesa, so that p-side electrode material is evaporated. As the p-side electrode material, a multilayer film made of Cr/AuZn/Au or a multilayer film made of Ti/Pt/Au is used.

(10): The electrode material of the light emitting section is lifted off to form a p-side electrode 113 (see FIG. 1).

(11): After polishing the rear side of the substrate 101 so as to have a prescribed thickness (for example, about 100 μm), an n-side electrode 114 is formed (see FIG. 1). In this case, the n-side electrode 114 is a multilayer film made of AuGe/Ni/Au.

(12): An annealing process is performed so as to produce the ohmic conductivity of the p-side electrode 113 and the n-side electrode 114. By doing this the mesa becomes the light emitting section.

(13) The wafer is cut into chips.

Figure 11:
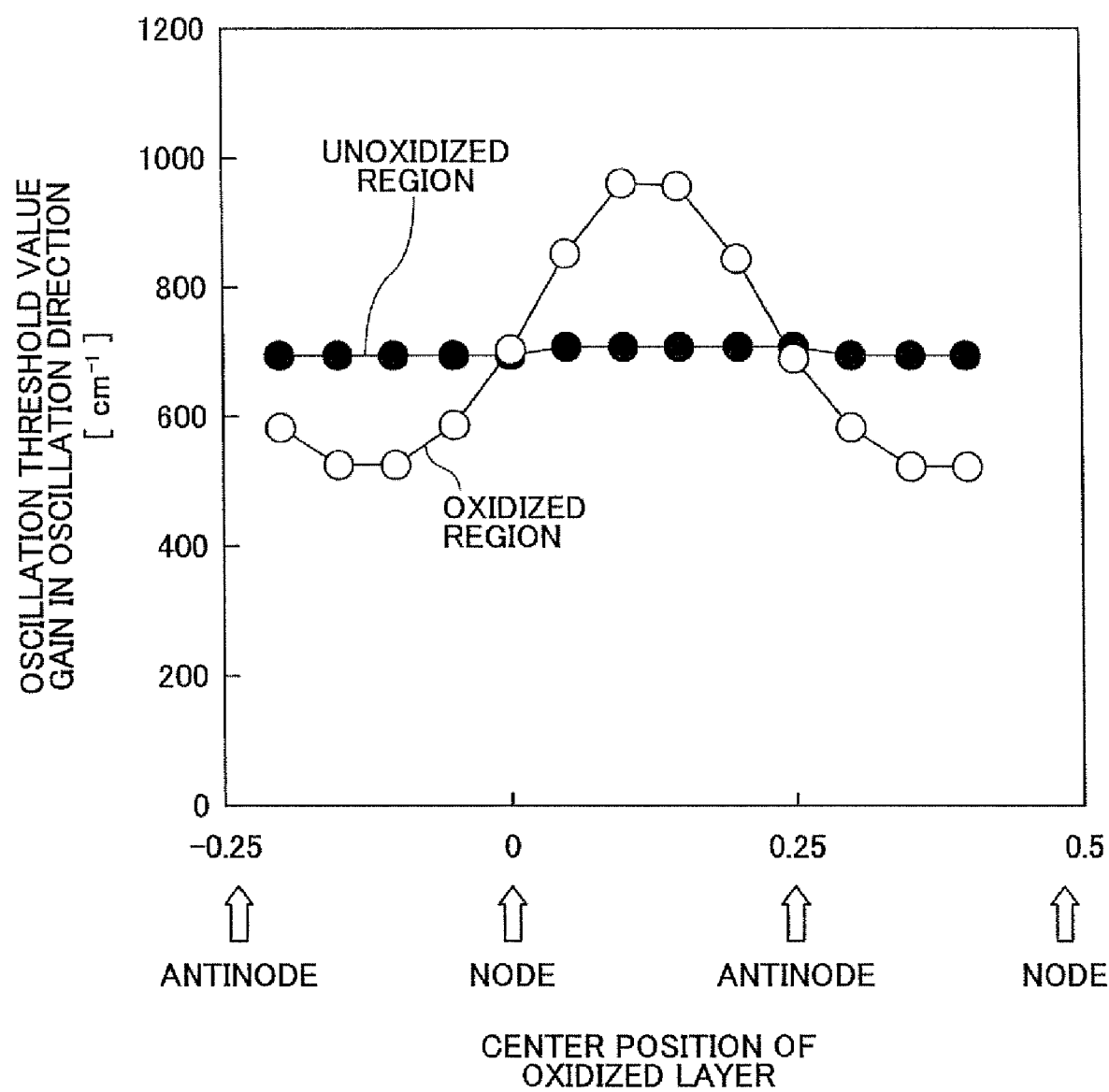
FIG. 11 is a graph showing a relationship between the center position of a selectively oxidized layer and oscillation threshold value gain.
Figure 12:
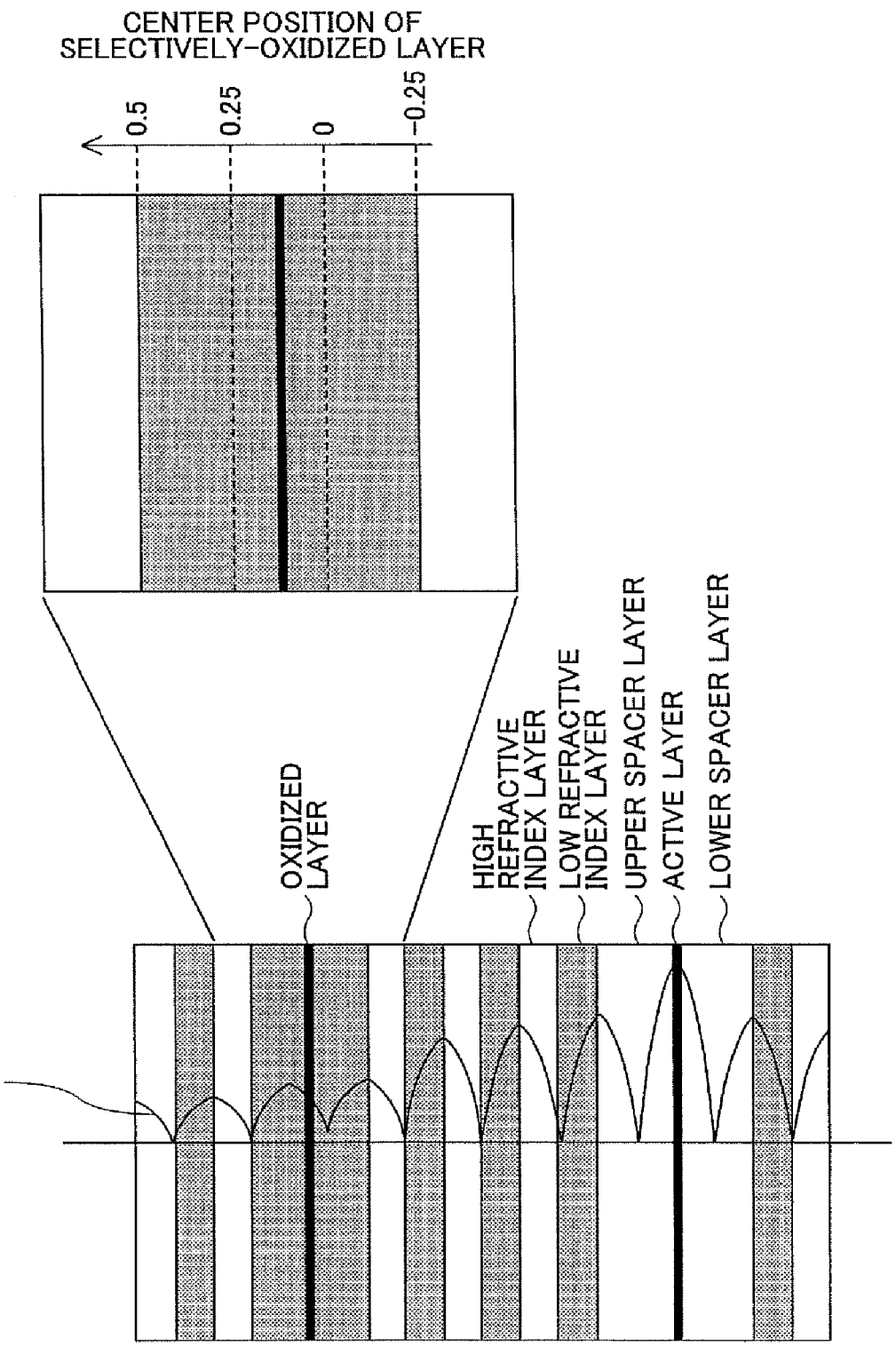
FIG. 12 is a drawing showing a relationship between the position of the selectively oxidized layer and the standing wave distribution of the electric field.

FIG. 11 is a graph showing a relationship between the center position of the oxidized layer in the current confined structure with respect to thickness direction of the oxidized layer (hereinafter simplified as a "center position of the oxidized layer" for convenience) and the oscillation threshold value gain (corresponding to a reflection loss) (see Japanese Patent Application Publication No. 2007-318064). In this case, the current confined structure is formed by the selective oxidation of the selectively-oxidized layer (AlAs layer) in the surface emitting laser as shown in FIG. 12 having an oscillation wavelength of 780 nm. It should be noted that the graph of FIG. 11 is based on a one dimensional analysis result using the transfer-matrix method. Therefore, the diffraction effect (diffraction loss) due to the oxidized layer and the like are not taken into consideration. Further, in FIG. 11, the lateral axis indicates the "center position of the oxidized layer", and the origin of the lateral axis corresponds to the fourth node position from the oscillator structure in the standing wave distribution. Further, the coordinate of the lateral axis is normalized by the oscillation waveform, and the positive direction is defined so that the value increases in the positive direction as the distance from the active layer increases.

As shown in FIG. 12, each node position of the standing wave distribution is located at a boundary surface between the high refractive index layer and the low refractive index layer that is provided on the active layer side with respect to the high refractive index layer and that adjoins the high refractive index layer. Further, to provide the oxidized layer in the low refractive index layer, it is necessary to determined the thickness of the low refractive index layer so that the phase shift amount of the oscillation light in the low refractive index layer is equal to or more than $\pi m/2$ ($m=3, 5, 7, \ldots$). Namely, it is necessary that the optical thickness of the low refractive index layer be equal to or more than $\lambda m/4$ ($m=3, 5, 7, \ldots$). By obtaining this, it becomes possible to satisfy the phase condition of multiple reflection of the distributed Bragg reflector.

In the surface emitting laser of FIG. 12, the low refractive index layer (made of $Al_{0.9}Ga_{0.1}As$ in this case) including the oxidized layer is provided as the fourth pair from the upper spacer layer, and their optical thickness is $3\lambda/4$.

As seen from FIG. 11, when the center position of the oxidized layer is moved in the positive direction from the node position of the standing wave distribution, the oscillation threshold value gain slightly increases in the unoxidized region of the current confined structure and the oscillation threshold value gain largely increases in the oxidized region of the current confined structure. In this case, it is possible to increase the oscillation threshold value gain of the higher-order lateral mode only while the oscillation threshold value gain of the fundamental lateral mode is kept low. In addition, it becomes possible to obtain the fundamental lateral mode up to high output power.

On the other hand, when the center position of the oxidized layer is moved in the negative direction from the node position of the standing wave distribution, the oscillation threshold value gain of the unoxidized region of the current confined structure becomes greater than that of the oxidized region of the current confined structure. In this case, a higher-order lateral mode is likely to be oscillated. Therefore, the amplitude of the oscillation of the fundamental lateral mode cannot be increased.

However, when the center position of the oxidized layer is moved in the positive direction from the node position of the standing wave distribution, the slope efficiency in the I-L characteristic may be slightly degraded. Because of this feature, when a desired output value (power) is required, a larger driving current is required in the surface emitting laser in which the center position of the oxidized layer is moved in the positive direction from the node position of the standing wave distribution than in the surface emitting laser in which the center position of the oxidized layer is located at the node position of the standing wave distribution.

Figure 13:
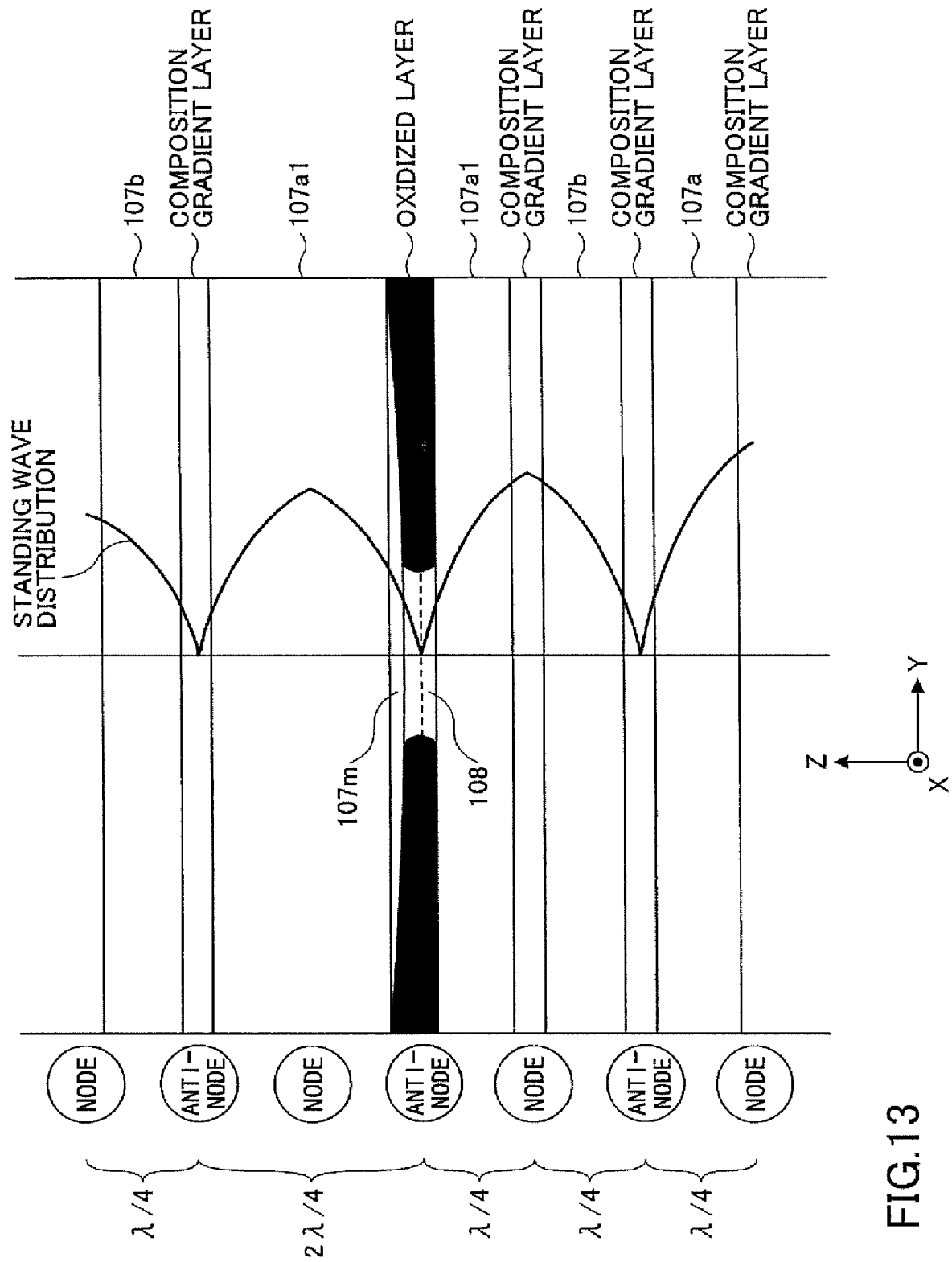
FIG. 13 is a drawing showing a relationship between the shape of the oxidized layer and the standing wave distribution of the electric field in a surface emitting laser according to the second embodiment of the present invention.

As described above, in a surface emitting laser according to the second embodiment of the present invention, the thickness of the oxidized layer gradually decreases as the distance to the current passage region decreases. Further, the second boundary surface is more inclined than the first boundary surface with respect to a virtual surface perpendicular to the laser light emitting direction. Namely, as shown in FIG. 13, at the head section of the oxidized layer, the center position of the oxidized layer is located at the node position of the standing wave distribution. However, in the outer section that is separated from the head section of the oxidized layer and that is closer to the side surface of the mesa, the center position of the oxidized layer is actually displaced in the positive direction from the node position of the standing wave distribution.

Generally, the diffusion in the lateral direction of light is minimized when the light is oscillated in the fundamental lateral mode and is increased in a higher-order lateral mode. Because of this feature, in a surface emitting laser according to the second embodiment of the present invention, conditions are satisfied so that the center position of the oxidized layer is located at a node position of the standing wave distribution in the fundamental lateral mode, and the center position of the oxidized layer is shifted in the positive direction from the node position of the standing wave distribution in the higher-order lateral mode. Due to this, it becomes possible to increase the threshold current value in the higher-order lateral mode without degrading the slope efficiency in the fundamental lateral mode.

Figure 14A:
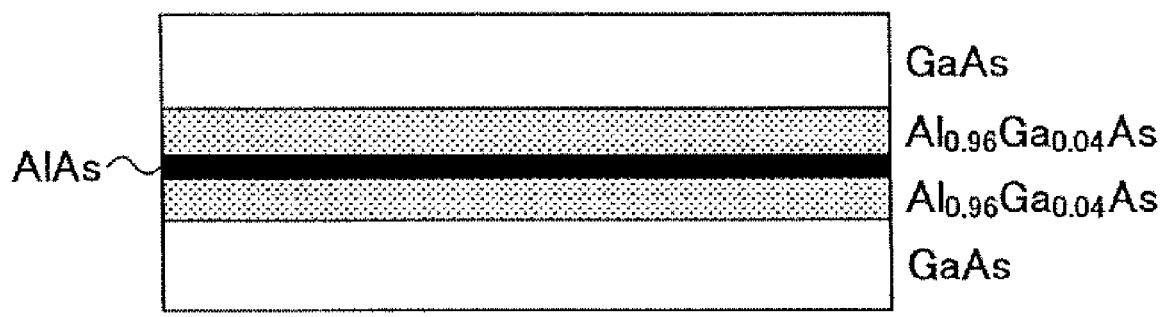
FIGS. 14A and 14B are drawings each showing the shape of the oxidized layer in comparative example 1.
Figure 14B:
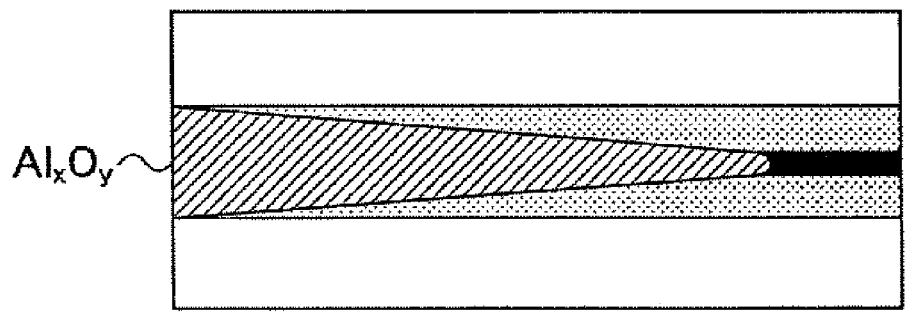

On the other hand, when oxidation is performed from one side surface of a sample in which a selectively-oxidized layer (AlAs layer) is sandwiched by the layers made of $Al_xGa_{x-1}As$ as shown in FIG. 14A, the oxidized layer is formed to have a tapered shape substantially symmetric with respect to the lateral direction as show in FIG. 14B. (see R. L. Naone et al., "Oxidation of AlGaAs layers for tapered apertures in vertical-cavity lasers", Electronics Letters, 13 Feb. 1997, vol. 33, No. 4, pp. 300-301)

Figure 15A:
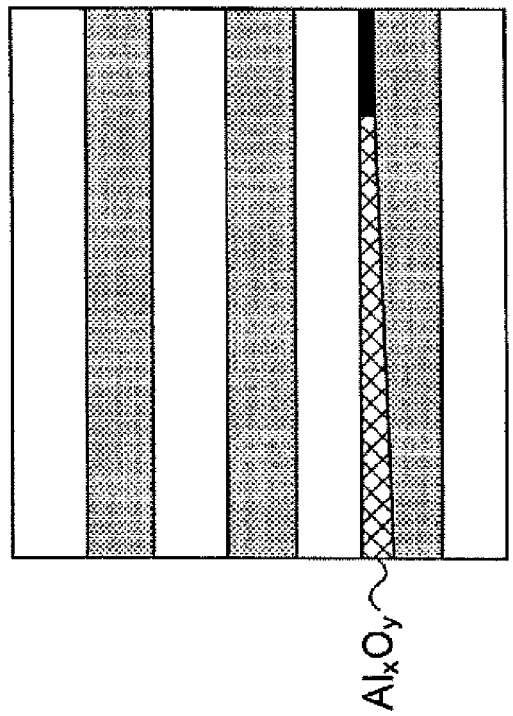
FIGS. 15A and 15B are drawings each showing the shape of the oxidized layer in comparative example 2.
Figure 15B:
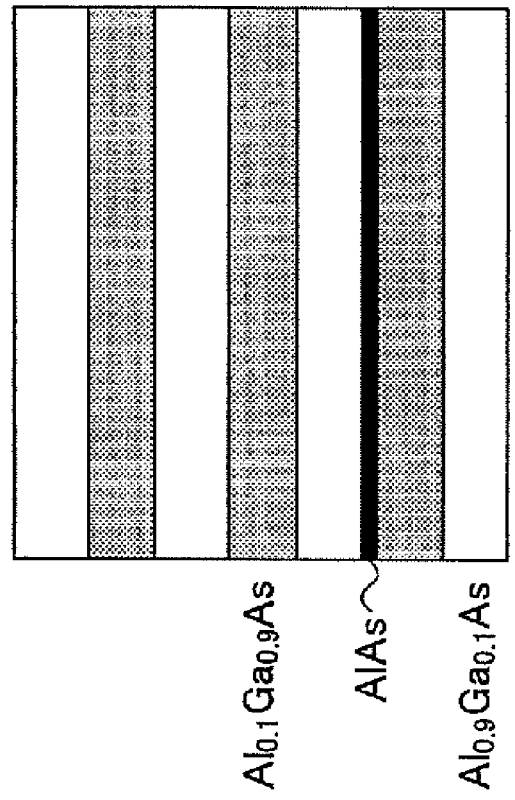

Further, in most surface emitting lasers, the oxidized layer is interposed at a node position of the standing wave distribution in the upper semiconductor DBR. As is usually the case, when the optical thickness of each of the refractive index layers in the upper semiconductor DBR is equal to $\lambda/4$, each of the node positions of the standing wave distribution is located at the boundary surface between the high refractive index layer and the low refractive index layer that is provided on the active layer side with respect to the high refractive index layer and that adjoins the high refractive index layer. In a case where widely-used AlGaAs-type material for the upper semiconductor DBRs is used, when the Al content rate is high, the refractive index becomes low, and when the Al content rate is low, the refractive index becomes high. Then, a case is considered where the selectively-oxidized layer (AlAs layer) is interposed between a layer made of AlGaAs type material having a low refractive index and a layer made of AlGaAs type material having a high refractive index as shown in FIG. 15A. In this case, unlike the first embodiment, when the oxidation is performed from one side surface, the first boundary surface is more inclined than the second boundary surface with respect to a virtual surface perpendicular to the laser light emitting direction. In this case, it is not possible to increase the threshold current value in the higher-order lateral mode without degrading the slope efficiency in the fundamental lateral mode.

As is apparent from the above descriptions, in a surface emitting laser 100 according to the second embodiment of the present invention, a first layer is formed as the low refractive index layer 107a1 adjoining the −Z side of the selectively-oxidized layer 108, and a second layer is formed as the intermediate layer 107m.

In addition, a third layer is formed as the low refractive index layer 107a1 adjoining the +Z side of the intermediate layer 107m.

As described above, a surface emitting laser according to the second embodiment of the present invention includes the oscillator structure and the semiconductor DBRs (the lower semiconductor DBR 103 and the upper semiconductor DBR 107) on the substrate 101, the oscillator structure including the active layer 105, each of the semiconductor DBRs including plural pairs of low refractive index layer and high refractive index layers, the oscillator structure being sandwiched by the semiconductor DBRs. Further, in upper semiconductor DBR 107, there is also provided the current confined structure that is formed by the selective oxidation of Al in which the current passage region is surround by the oxidized layer. The thickness of the oxidized layer gradually decreases as the distance to the current passage region decreases. The oxidized layer includes the first boundary surface on one side closer to the active layer 105 and the second boundary surface on the other side, and the second boundary surface is more inclined than the first boundary surface with respect to a virtual surface perpendicular to the laser light emitting direction. With this structure, it becomes possible to increase the threshold current value in the higher-order lateral mode without degrading the slope efficiency in the fundamental lateral mode. As a result, a single mode output having high power may be obtained without incurring high cost.

In the second embodiment, a case is described where the Al content rates of the two layers (the intermediate layer 107m and the low refractive index layer 107a1) sandwiching the selectively-oxidized layer 108 are different from each other. However, the present invention is not limited to this configuration.

Figure 16:
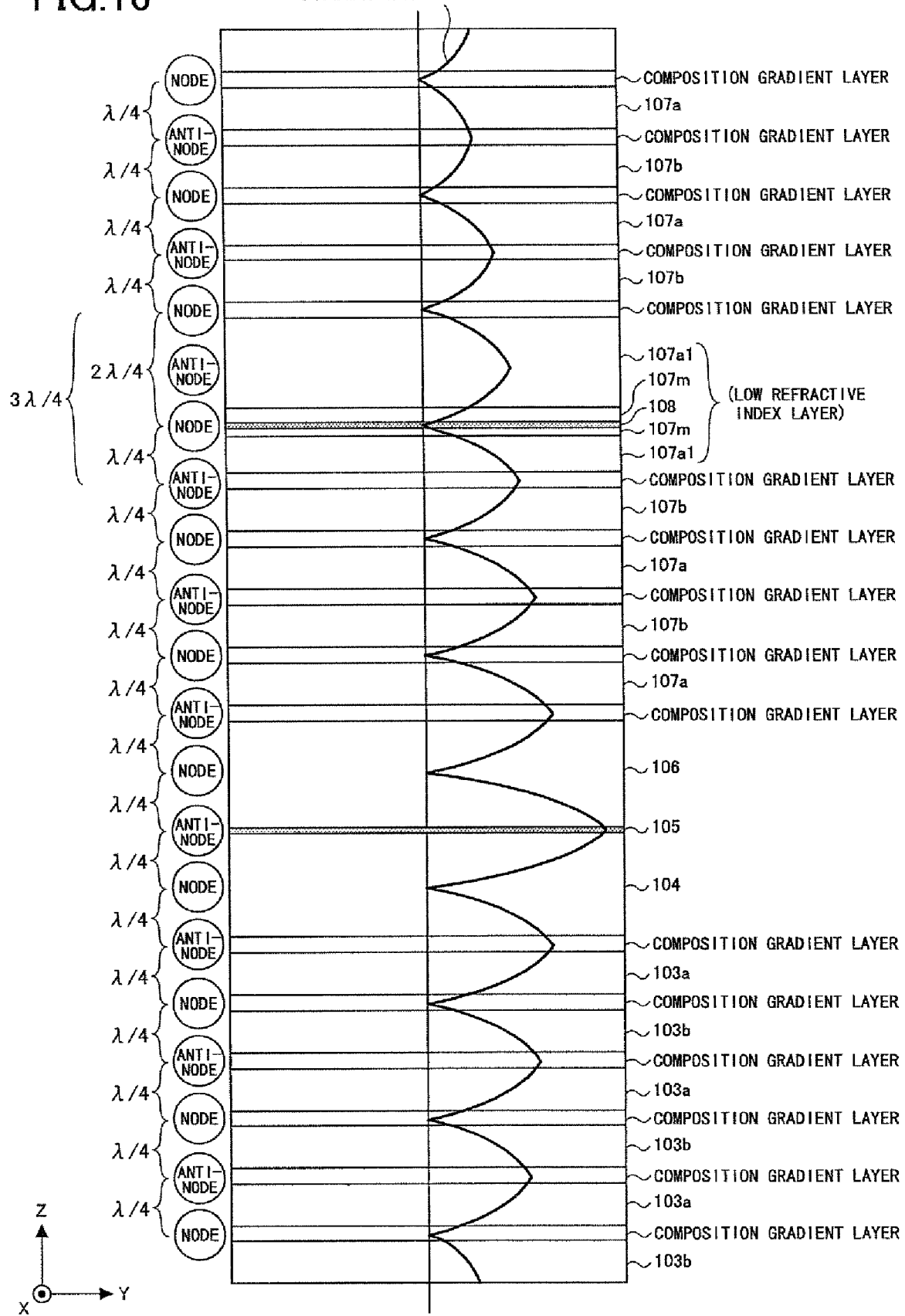
FIG. 16 is a drawing showing the laminated body of the modified example.

For example, the Al content rates of the two layers sandwiching the selectively-oxidized layer 108 may be the same, and the layer that is closer to the active layer 105 and that is provided on one side of the selectively-oxidized layer 108 may be thinner than the layer on the other side of the selectively-oxidized layer 108. More specifically, for example, as shown in FIG. 16, the layers 107m having thicknesses of 10 nm and 38 nm may be provided contiguous to the −Z side and +Z side of the selectively-oxidized layer 108, respectively. Even in this case, as in the second embodiment, the thickness of the oxidized layer gradually decreases as the distance to the current passage region decreases, and the second boundary surface is more inclined than the first boundary surface with respect to a virtual surface perpendicular to the laser light emitting direction.

Further, in the second embodiment, a case is described where the Al content rates of the two layers (both are the low refractive index layers 107a1) sandwiching the selectively-oxidized layer 108 and the intermediate layer 107m are substantially the same with each other. However, the present invention is not limited to this configuration. Namely, the Al content rate of the layer contiguous to the −Z side of the selectively-oxidized layer 108 may be different from that of the layer contiguous to the +Z side of the intermediate layer 107m. However, preferably, the Al content rate of the layers is lower than those of the intermediate layer 107m and the low refractive index layer 107a.

Further, in the second embodiment, a case is described where the optical thickness of the low refractive index layer including the selectively-oxidized layer 108 is equal to $3\lambda/4$. However, the present invention is not limited to this configuration. The optical thickness of the low refractive index layer may be equal to $(2n+1)\lambda/4$ using "n" which is an integer equal to or greater than one (1).

Further, in the second embodiment, a case is described where the shape of the mesa when cut along a plane perpendicular to the laser oscillation direction is a square. However, the present invention is not limited to this shape. The shape may be any other shape including circular, ellipsoidal, and rectangular shapes.

Further, in the second embodiment, a case is described where the etching is performed so that the bottom surface of the etching is stopped in the lower spacer layer 104. However, the present invention is not limited to this configuration. For example, the etching may be performed so that the bottom surface of the etching reaches the lower semiconductor DBR 103.

Further, in the second embodiment, a case is described where the oscillation wavelength of the surface emitting laser is 780 nm band. However, the present invention is not limited to this configuration. For example, another wavelength band such as 650 nm, 850 nm, 980 nm, 1.3 μm, or 1.5 μm may be used. In such a case, as the semiconductor material of the active layer, semiconductor material in accordance with the oscillation wavelength may be used. For example, an AlGaInP-type mixed crystal semiconductor may be used for the 650 nm band, an InGaAs-type mixed crystal semiconductor may be used for the 980 nm band, and a GaInNAs(Sb)-type mixed crystal semiconductor may be used for the 1.3 μm and the 1.5 μm bands.

Surface Emitting Laser

Third Embodiment

Figure 17:
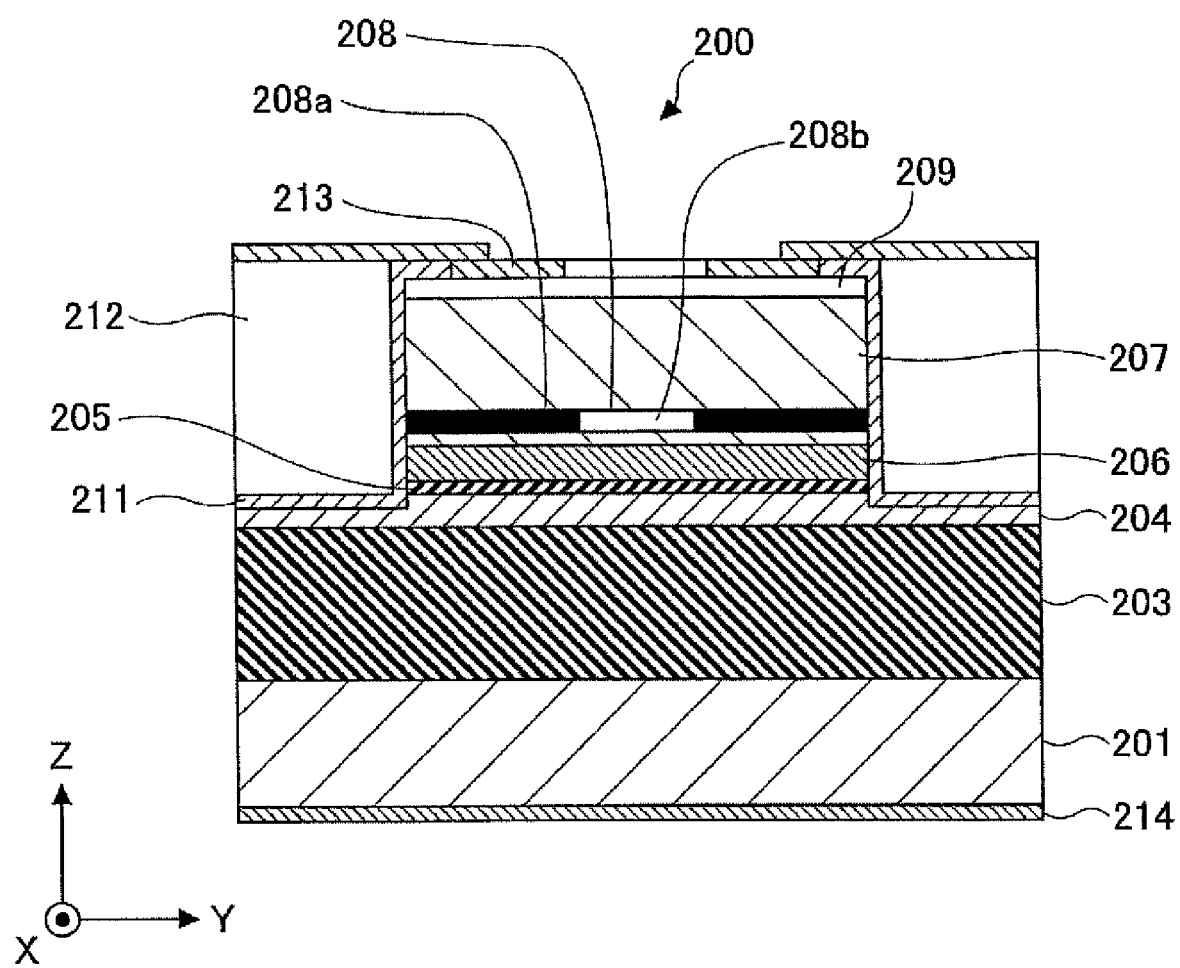
FIG. 17 is a schematic drawing showing a configuration of a surface emitting laser according to a third embodiment of the present invention.

FIG. 17 schematically shows a configuration of a surface emitting laser 200 according to a third embodiment of the present invention.

Figure 18:
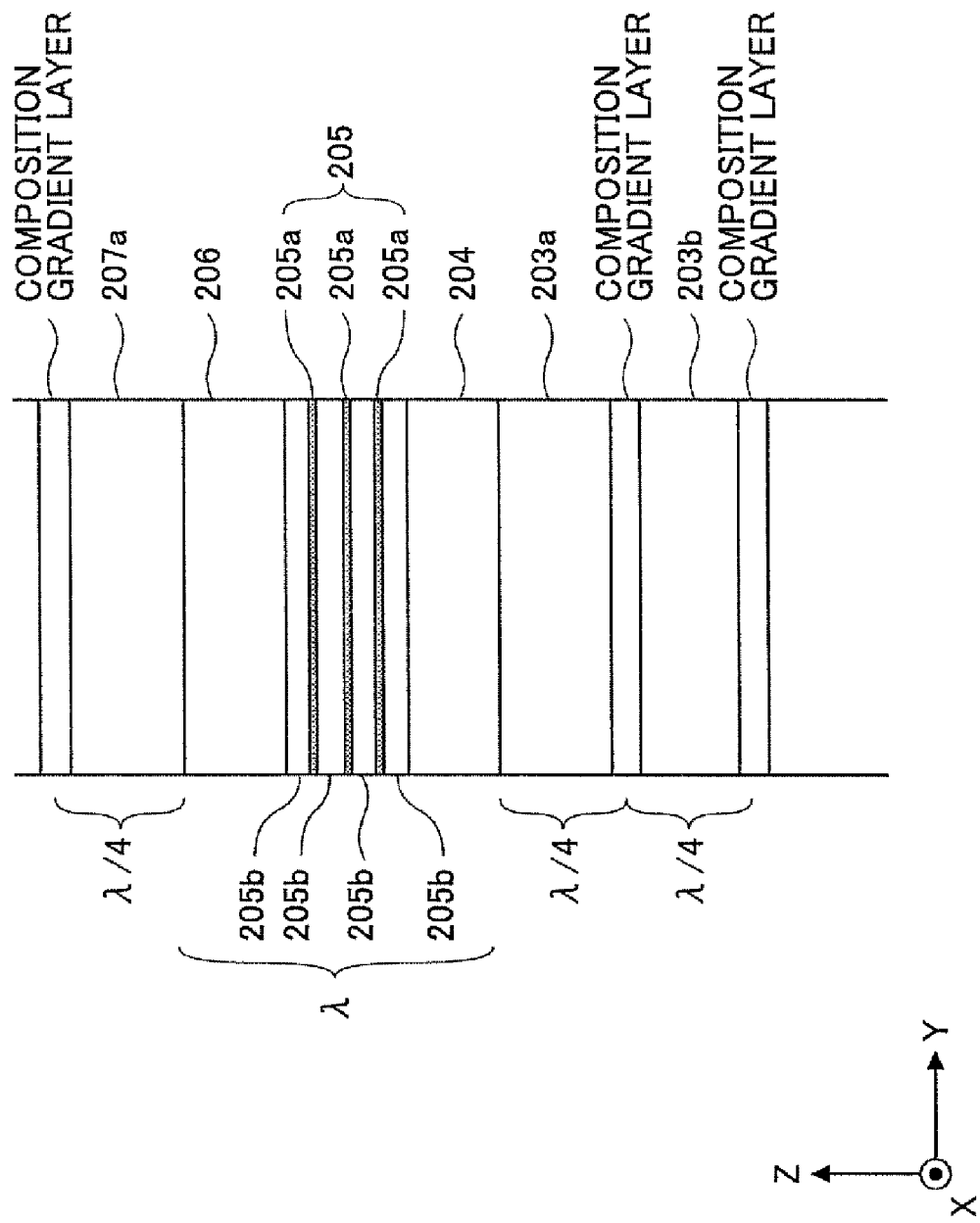
FIG. 18 is an enlarged drawing showing the vicinity of the active layer in FIG. 17.
Figure 19:
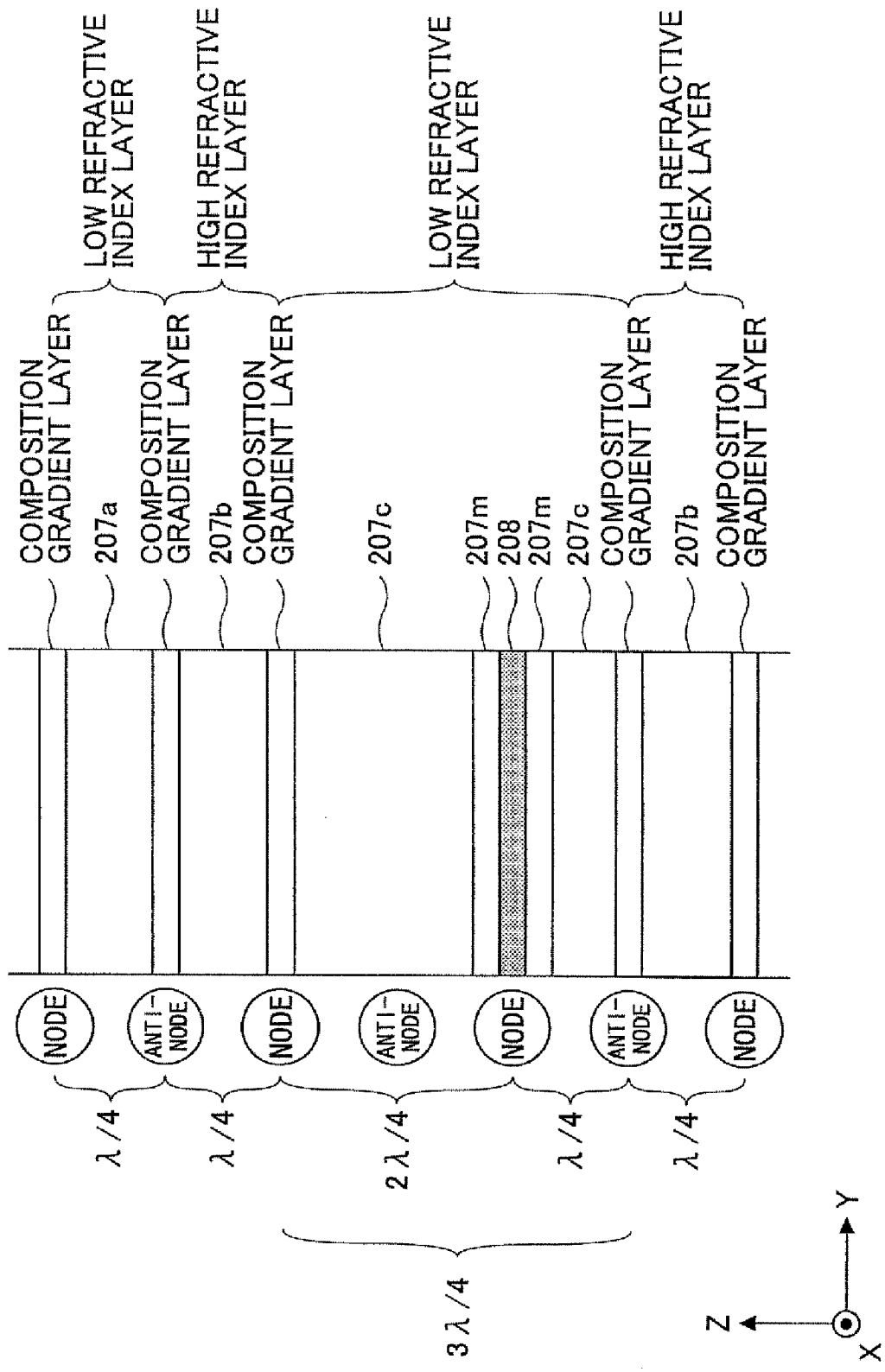
FIG. 19 is an enlarged drawing showing a part of the upper semiconductor DBR in FIG. 17.

The surface emitting laser 200 is designed to oscillate at the wavelength band of 780 nm. As shown in FIG. 17, in the surface emitting laser 200, a lower semiconductor DBR 203, a lower spacer layer 204, an active layer 205, an upper spacer layer 206, an upper semiconductor DBR 207, and a contact layer 209 are sequentially laminated in this order on a substrate 201. FIG. 18 is an enlarged view of the vicinity of the active layer 205, and FIG. 19 is a partially-enlarged view of the upper semiconductor DBR 207.

The substrate 201 is a single-crystal substrate made of n-GaAs.

The lower semiconductor DBR 203 includes 40.5 pairs of a low refractive index layer 203a made of n-AlAs and a high refractive index layer 203b made of n-Al$_{0.3}$Ga$_{0.7}$As. Further, a composition gradient layer is interposed between the adjacent refractive index layers (see FIG. 18) to reduce the electrical resistance. In the composition gradient layer, the composition is gradually changed from one side to the other side. It should be noted that each of the refractive index layers is designed so that the optical thickness with respect to the refractive index layer and one-half of each of the composition gradient layers adjoining the refractive index layer is equal to λ/4 (λ:oscillation wavelength).

The lower spacer layer 204 is made of (Al$_{0.7}$Ga$_{0.3}$)$_{0.5}$In$_{0.5}$P.

The active layer 205 includes three quantum well layers 205a made of GaInPAs and four barrier layers 205b made of Ga$_{0.6}$In$_{0.4}$P. The quantum well layers 205a have compressive stress with respect to the substrate 201, and the band-gap wavelength is about 780 nm. Further, the barrier layers 205b are in lattice matching with the quantum well layers 205a and have tensile strain.

The upper spacer layer 206 is made of (Al$_{0.7}$Ga$_{0.3}$)$_{0.5}$In$_{0.5}$P.

A multilayer part including the lower spacer layer 204, the active layer 205, and the upper spacer layer 206 may be called the "oscillator structure". The oscillation structure is designed so that its optical length is equal to one wavelength in optical thickness. It should be noted that the active layer 205 is located at the position of the middle of the "oscillator structure" so as to obtain high stimulated emission probability, the position corresponding to an antinode position of the standing wave distribution of the electric field.

The upper semiconductor DBR 207 includes 24 pairs of a low refractive index layer and a high refractive index layer. Further, a composition gradient layer is interposed between the adjacent refractive index layers to reduce the electrical resistance (see FIG. 19). In the composition gradient layer, the composition is gradually changed from one side to the other side.

In the upper semiconductor DBR 207, there is a selectively-oxidized layer 208 made of p-AlAs and having a thickness of 30 nm included in one of the low refractive index layers. The interposing position of the selectively-oxidized layer 208 is optically separated from the upper spacer layer 206 by 5λ/4. Further, the low refractive index layer including selectively-oxidized layer 208 is designed so that the optical thickness of the low refractive index layer and one-half of each of the composition gradient layers adjoining the low refractive index layer is equal to 3λ/4.

Further, each position of the selectively-oxidized layer 108 and the composition gradient layer positioned on +Z side of the low refractive index layer including selectively-oxidized layer 208 is designed to be located at a node position of the electric field intensity distribution (see FIG. 19).

Each of the refractive index layers excluding the low refractive index layer including selectively-oxidized layer 208 is designed so that the optical thickness of the refractive index layer and one-half of each of the composition gradient layers adjoining the refractive index layer is equal to λ/4.

On the +z and −Z sides of the selectively-oxidized layer 208, intermediate layers 207m made of p-Al$_{0.83}$Ga$_{0.17}$As and having a thickness of 40 nm are provided.

Layers 207c made of p-Al$_{0.75}$Ga$_{0.25}$As (hereinafter referred to as a "low refractive index layer 207c") are provided so that the layers 207c adjoin the corresponding intermediate layers 207m in the low refractive index layer including the selectively-oxidized layer 208.

In the upper semiconductor DBR 207, the low refractive index layers 207a excluding the low refractive index layer including selectively-oxidized layer 208 are made of p-Al$_{0.9}$Ga$_{0.1}$As. Further, the high refractive index layers 207b are made of p-Al$_{0.3}$Ga$_{0.7}$As.

Namely, the selectively-oxidized layer 208 is included in one of the low refractive index layers in the upper semiconductor DBR 207, and the low refractive index layer including the selectively-oxidized layer 208 further includes two intermediate layers 207m adjoining the selectively-oxidized layer 208 and two low refractive index layer 207c adjoining the corresponding intermediate layer2 207m. Further, the Al content rate of the intermediate layers 207m is less than that in the selectively-oxidized layer 208 by 17%; and the Al content rate of the low refractive index layers 207c is less than that in the selectively-oxidized layer 208 by 25%.

The contact layer 209 is made of p-GaAs.

In FIG. 17, the reference numerals "208a" and "208b" denote the Al oxidized layer and the current passage region, respectively. The reference numerals "211" and "212" denote the protection layer and the polyimide, respectively. The reference numerals "213" and "214" denote the p-side electrode and the n-side electrode, respectively.

The surface emitting laser 200 may be manufactured in the same manner as the above surface emitting laser 100.

As described above, in the surface emitting laser 200 according to the third embodiment of the present invention, the selectively-oxidized layer 208 is included in one of the low refractive index layers in the upper semiconductor DBR 207, and the low refractive index layer including the selectively-oxidized layer 208 further includes two intermediate layers 207m adjoining the selectively-oxidized layer 208 and two low refractive index layers 207c adjoining the corresponding intermediate layers 207m. Further, Al content rate in the intermediate layers 207m is less than that in the selectively-oxidized layer 208 by 17%; and Al content rate in the low refractive index layers 207c is less than that in the selectively-oxidized layer 208 by 25%. By having this, it becomes possible to provide more control over the oxidation rate in the X-Y plane of the selectively-oxidized layer 208 and the thickness of the oxidized layers 208a when the selectively-oxidized layer 208 is being selectively oxidized, thereby enabling reducing the variation of the thickness of the oxidized layers 208a. As a result, it becomes possible to facilitate the manufacturing and increase the yield in the manufacturing. Further, it becomes possible to reduce the negative influence of the distortion with respect to the active layer 205 and increase the service lifetime.

Further, the optical thickness of the low refractive index layer including the selectively-oxidized layer 208 is equal to $3\lambda/4$. By having this, it becomes possible for each of the selectively-oxidized layer 208 and the composition gradient layer positioned on +Z side of the low refractive index layer including selectively-oxidized layer 108 to be located at a node position of the electric field intensity distribution. As a result, it becomes possible to reduce the diffraction loss due to the selectively-oxidized layer 208 as well as the absorption loss due to the composition gradient layer.

Further, in the third embodiment, a case is described where the shape of the mesa when cut along a plane perpendicular to the laser oscillation direction is a square. However, the present invention is not limited to this shape. The shape may be any other shape including circular, ellipsoidal, and rectangular shapes.

Further, in the third embodiment, a case is described where the etching is performed so that the bottom surface of the etching is stopped in the lower spacer layer. However, the present invention is not limited to this configuration. For example, the etching may be performed so that the bottom surface of the etching reaches the lower semiconductor DBR.

Further, in the third embodiment, a case is described where the oscillation wavelength of the surface emitting laser is 780 nm band. However, the present invention is not limited to this configuration. For example, another wavelength band such as 650 nm, 850 nm, 980 nm, 1.3 µm, or 1.5 µm may be used. In such a case, as the semiconductor material of the active layer, semiconductor material in accordance with the oscillation wavelength may be used. For example, AlGaInP-type mixed crystal semiconductor may be used for the 650 nm band, InGaAs-type mixed crystal semiconductor may be used for the 980 nm band, and GaInNAs(Sb)-type mixed crystal semiconductor may be used for the 1.3 µm and the 1.5 µm bands.

Surface Emitting Laser Array

Fourth Embodiment

Figure 20:
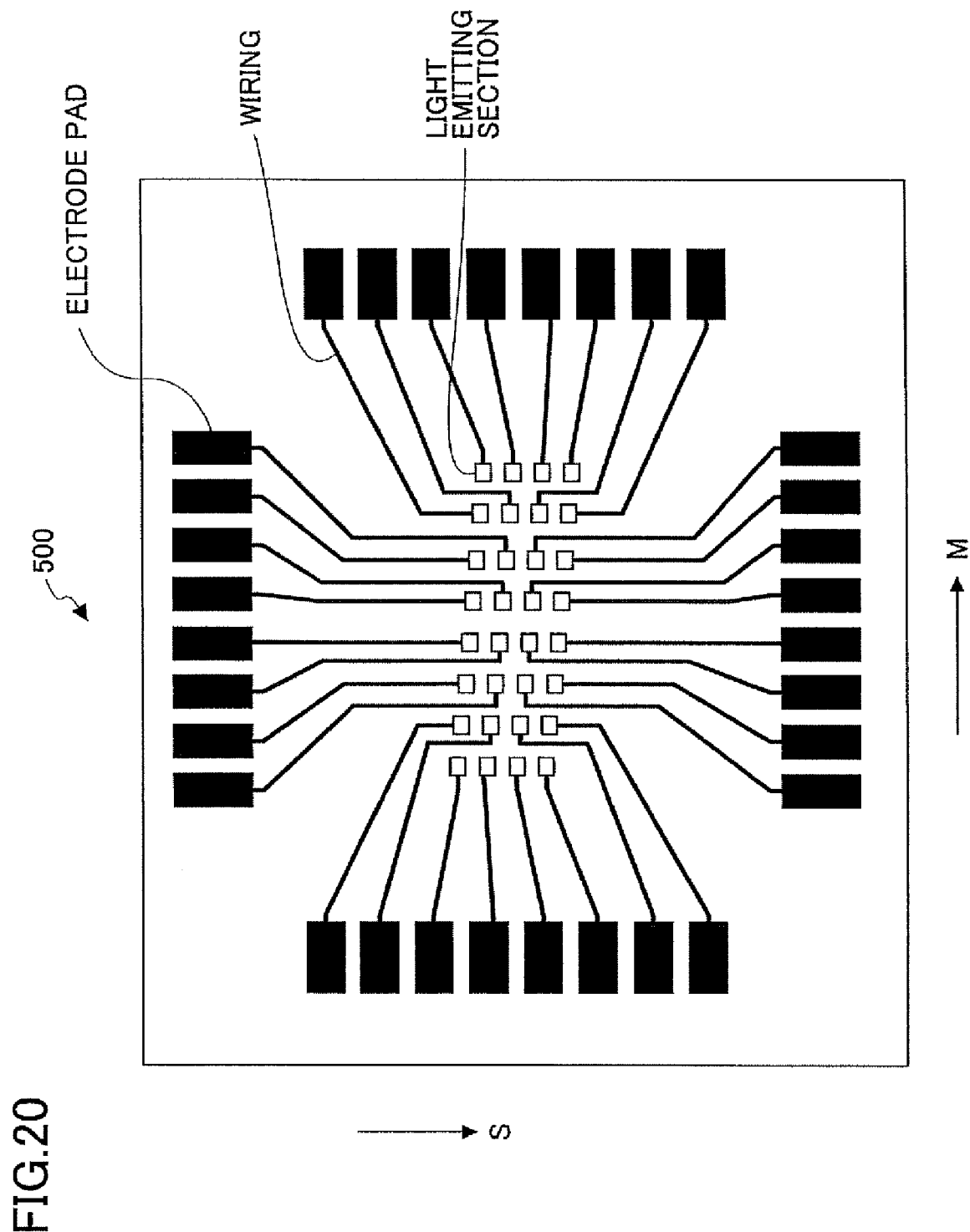
FIG. 20 is a drawing showing a surface emitting laser array according to fourth and fifth embodiments of the present invention.

FIG. 20 schematically shows a configuration of a surface emitting laser array 500 according to a fourth embodiment of the present invention.

As shown in FIG. 20, the surface emitting laser array 500 includes plural (in this case, thirty-two (32)) light emitting sections arranged on the same substrate.

Figure 21:
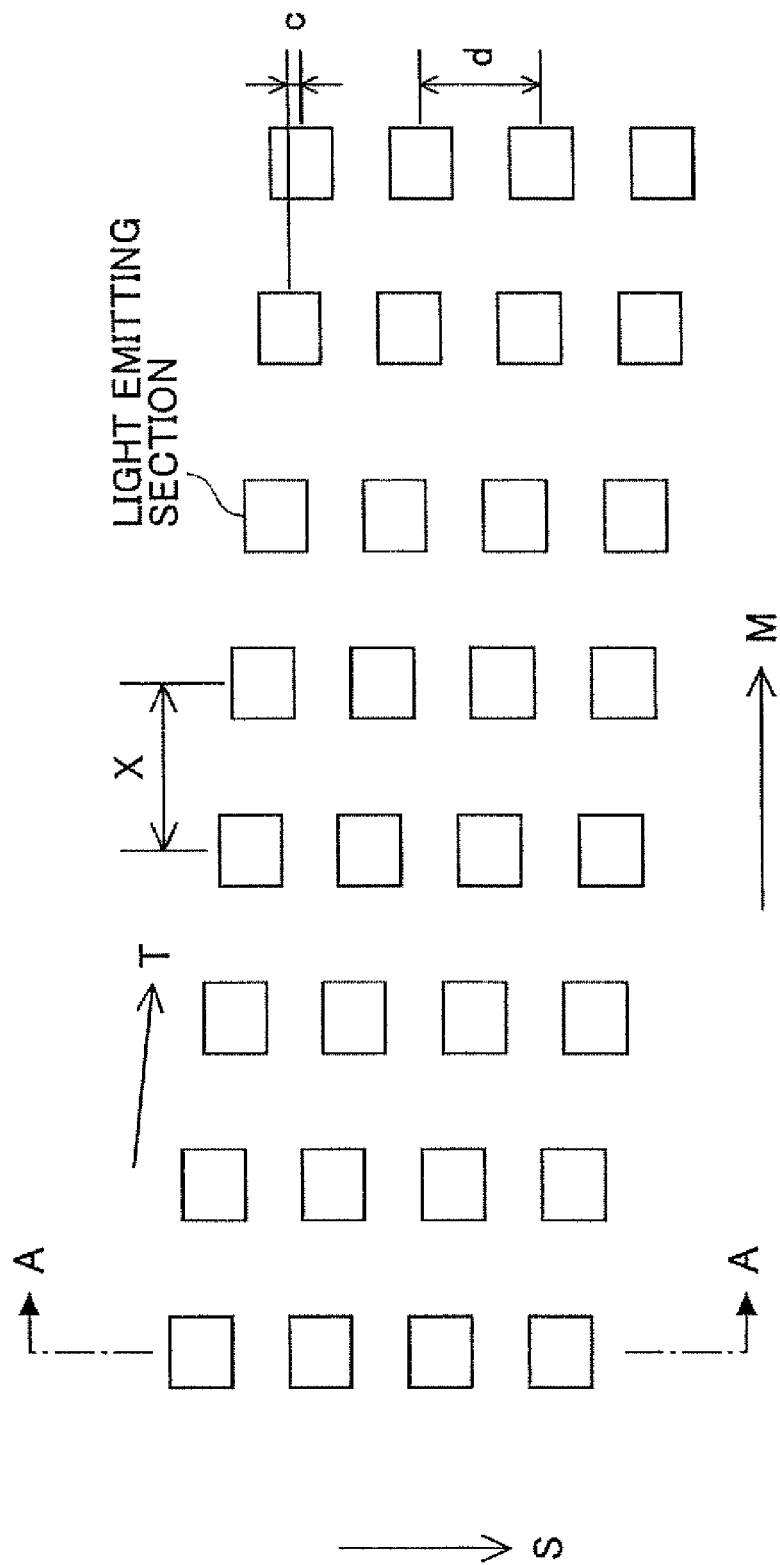
FIG. 21 is a drawing showing a two-dimensional array of the light emitting sections.

FIG. 21 shows the arrangement of the light emitting sections of the surface emitting laser array 500. As shown in FIG. 21, the light emitting sections are arranged in four lines each aligned in a "T" direction. The four lines are arranged at regular intervals in the "S" direction. The "T" direction is inclined at an angle of "α" ($0°<α<90°$) measured from an axis in the "M" direction toward an axis in the "S" direction. Each of the four lines has eight (8) light emitting sections at regular intervals in the "M" direction. Namely, thirty-two (32) light emitting sections are in a two-dimensional array having the "T" and the "S" directions. In this description, the term "light emitting section interval" refers to a distance between the centers of two adjacent light emitting sections.

In this two dimensional array, the light emitting section interval "d" in the "S" direction is 24 µm, and the light emitting section interval "X" in the "M" direction is 30 µm (see FIG. 21). Further, an interval "c" obtained when the thirty-two (32) light emitting sections are orthographically projected onto a virtual line extending in the "S" direction is 3 µm (see FIG. 21).

Figure 22:
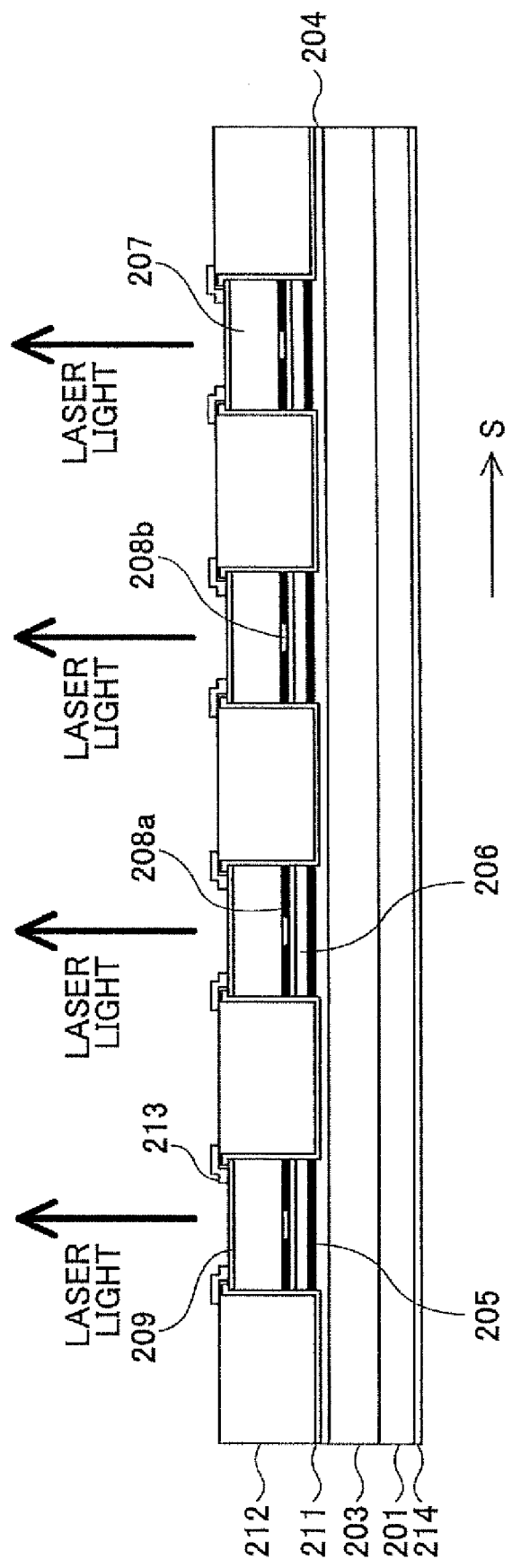
FIG. 22 is a cross-sectional drawing along line A-A of FIG. 21.

FIG. 22 is a cross-sectional drawing along line A-A in FIG. 21. As shown in FIG. 22, each of the light emitting sections has the same structure as the above described surface emitting laser 200.

Further, the surface emitting laser array 500 may be manufactured in the same manner as described for the surface emitting laser 200.

On the other hand, preferably, the grooves between two light emitting sections have a length of 5 µm or more for ensuring electrical and spatial separation between the light emitting sections. When they are too close to each other, it may become difficult to provide accurate control of etching in manufacturing. Further, preferably, the size (one side) of the mesa is 10 µm or more. When the size is too small, heat may persist internally, which may degrade the characteristics.

As described above, the surface emitting laser array 500 according to the fourth embodiment of the present invention is made of plural surface emitting lasers 200. Therefore, the surface emitting laser array 500 has the same effects as the surface emitting laser 200. Further, in the surface emitting laser array 500, the variations of the size (area) of the current passage region and the thickness of the oxidized layer are small among the light emitting sections, and the variations of the threshold value current, the single-mode output power, the light diffusion angle, the service lifetime, and the like are also small.

Figure 23:
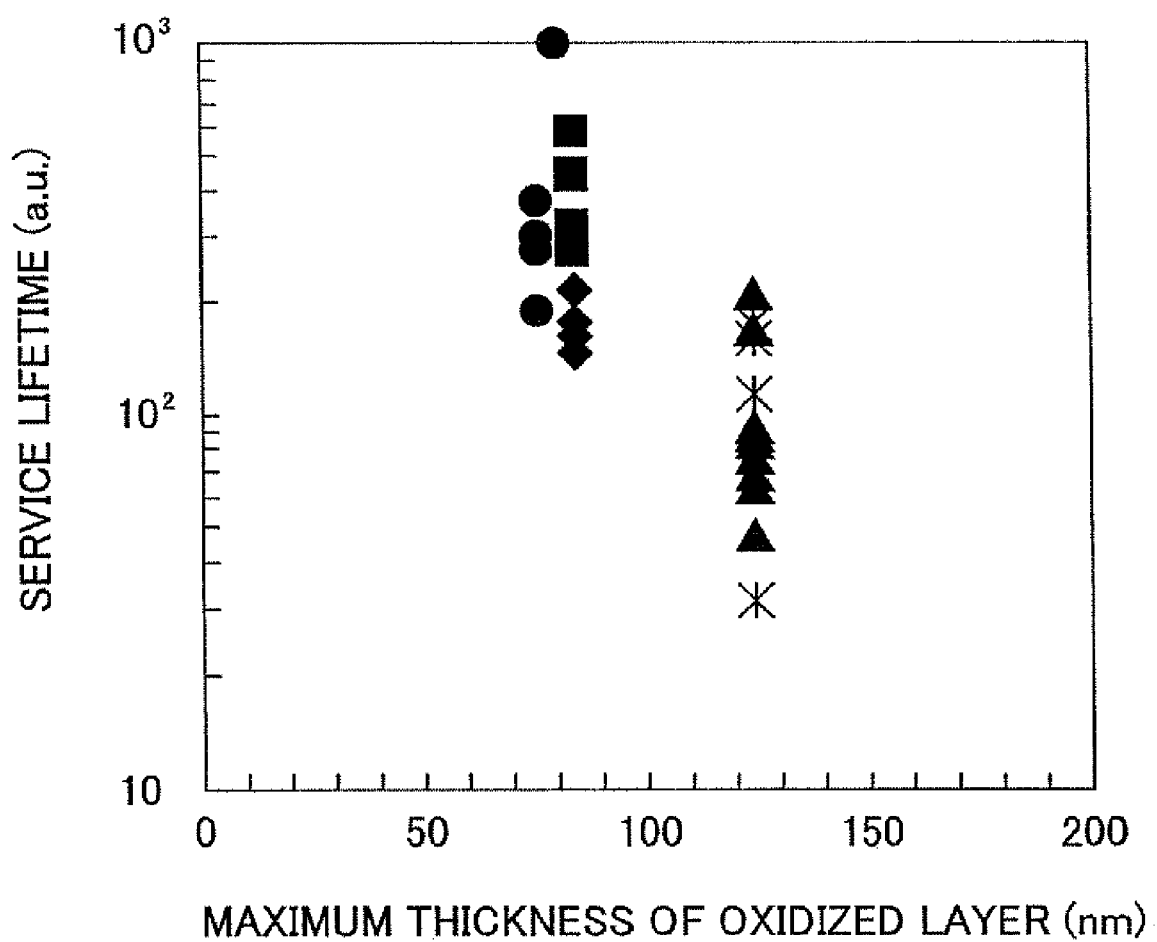
FIG. 23 is a graph showing a relationship between the maximum thickness of the oxidized layer and the service lifetime.

On the other hand, FIG. 23 shows a relationship between the maximum thickness of the oxidized layer and the service lifetime. FIG. 23 plots each measurement result of the maximum thickness of the oxidized layer and the service lifetime of the surface emitting laser arrays that are manufactured in plural lots, each of the surface emitting laser arrays including plural surface emitting lasers according to the above comparative example 2. The difference of the symbols in FIG. 23 indicates the difference of lots. Further, the service lifetime is determined as the elapsed time until the driving current of at least one of the light emitting sections becomes 120% of the initial value while feedback control is being performed on the driving current so that the output power of the light emitting sections becomes constant.

Further, other experiments showed that the service lifetime when the maximum thickness of the oxidized layer is 60 nm was substantially the same as that when the maximum thickness of the oxidized layer is 80 nm.

Based on the above results, preferably, the maximum thickness of the oxidized layer is 110 nm or less. In the surface emitting laser array 500 according to the fourth embodiment of the present invention, the maximum thickness of the oxidized layers were in a range from 70 nm to 90 nm.

Further, the oxidized layer surrounding the current passage region in the oxide-confined structure includes the Al oxide of the selectively-oxidized layer and the Al oxide of the intermediate layers. Therefore, preferably, total thickness of the selectively-oxidized layer and each of the intermediate layers is 110 nm or less.

Therefore, the surface emitting laser array 500 may be more easily manufactured, has a higher yield, and has a longer service lifetime than conventional surface emitting laser arrays.

In the description of the fourth embodiment, a case is described where the surface emitting laser array 500 has thirty two (32) light emitting sections. However, the number of the light emitting sections is not limited to this number.

In the fourth embodiment, a case is described where the shape of the mesa in a cross sectional surface perpendicular to the laser light emitting direction is square. However, in the present invention, the shape of the mesa is not limited to this shape. For example, the mesa may have any other shape including rectangular, circular, and elliptic.

In the fourth embodiment, a case is described where the wavelength is 780 nm band. However, in the present invention, the wavelength is not limited to this wavelength band. For example, the wavelength band may be, for example, 650 nm, 850 nm, 980 nm, 1.3 µm and 1.5 µm.

Surface Emitting Laser Array

Fifth Embodiment

FIG. 20 schematically shows a configuration of a surface emitting laser array 500 according to a fifth embodiment of the present invention.

As shown in FIG. 20, the surface emitting laser array 500 includes plural (in this case, thirty-two (32)) light emitting sections arranged on the same substrate. In the following description, it is assumed that the "M" direction refers to the right direction on the paper, and the "S" direction refers to the downward direction on the paper as shown in FIG. 21.

FIG. 21 shows the arrangement of the light emitting sections of the surface emitting laser array 500. As shown in FIG. 21, the light emitting sections has four lines each aligned in a "T" direction. The four lines are arranged at regular interval "d" in the "S" direction, so that the an interval "c" is obtained when all the light emitting sections are orthographically projected onto a virtual line extending in the "S" direction. The "T" direction is inclined at an angle of "α" (0°<α<90°) measured from an axis in the "M" direction toward an axis in the "S" direction. Each of the four lines has eight (8) light emitting sections at regular intervals in the "M" direction. Namely, thirty-two (32) light emitting sections are in a two-dimensional array in the "T" and the "S" directions. In this description, the term "light emitting section interval" refers to a distance between the centers of two light emitting sections.

In this case, the distance "c" is 3 µm, the distance "d" is 24 µm, and the light emitting section interval "X" is 30 µm.

FIG. 22 is a cross-sectional drawing along line A-A in FIG. 21. Each of the light emitting sections has the same structure as the above described surface emitting laser 100. Namely, in each of the light emitting sections, the oscillator structure including the active layer 205 and the semiconductor DBRs (the lower semiconductor DBR 203 and the upper semiconductor DBR 207) each including plural pairs of the low refractive index layer and the high refractive index layer, the semiconductor DBRs sandwiching the oscillator structure, are provided on the substrate 201. Further, the upper semiconductor DBR 207 includes the current confined structure in which the current passage region is surrounded by the oxidized layer formed by selective oxidation of Al.

The thickness of the oxidized layer gradually decreases as the distance to the current passage region decreases. The oxidized layer has a first boundary surface on one side closer to the active layer 205 and a second boundary surface on the other side. Further, the second boundary surface is more inclined than the first boundary surface with respect to a virtual surface perpendicular to the laser light emitting direction. Because of this feature, it becomes possible to increase the threshold current value in the higher-order lateral mode without degrading the slope efficiency in the fundamental lateral mode.

Further, the surface emitting laser array 500 may be manufactured in the same manner as the surface emitting laser 100.

On the other hand, preferably, the grooves between two light emitting sections have a length of 5 µm or more for ensuring electrical and spatial separation between the light emitting sections. When they are too close to each other, it may become difficult to provide accurate control of etching in manufacturing. Further, preferably, the size (one side) of the mesa is 10 µm or more. When the size is too small, heat may persist internally, which may degrade the characteristics.

As described above, the surface emitting laser array 500 according to the fifth embodiment of the present invention includes plural surface emitting lasers 100. Therefore, the surface emitting laser array 500 may obtain high single-mode output power in each light emitting section without incurring high cost.

In the fifth embodiment, a case is described where the surface emitting laser array 500 has thirty two (32) light emitting sections. However, the number of the light emitting sections is not limited to this number.

In the fifth embodiment, a case is described where the shape of the mesa in a cross-sectional surface perpendicular to the laser light emitting direction is square. However, in the present invention, the mesa is not limited to this shape. For example, the mesa may have any other shape including rectangular, circular, and elliptic.

In the fifth embodiment, a case is described where the wavelength is 780 nm band. However, in the present invention, the wavelength is not limited to this wavelength band. For example, the wavelength band may be 650 nm, 850 nm, 980 nm, 1.3 µm and 1.5 µm.

Surface Emitting Laser Array

Sixth Embodiment

Figure 24:
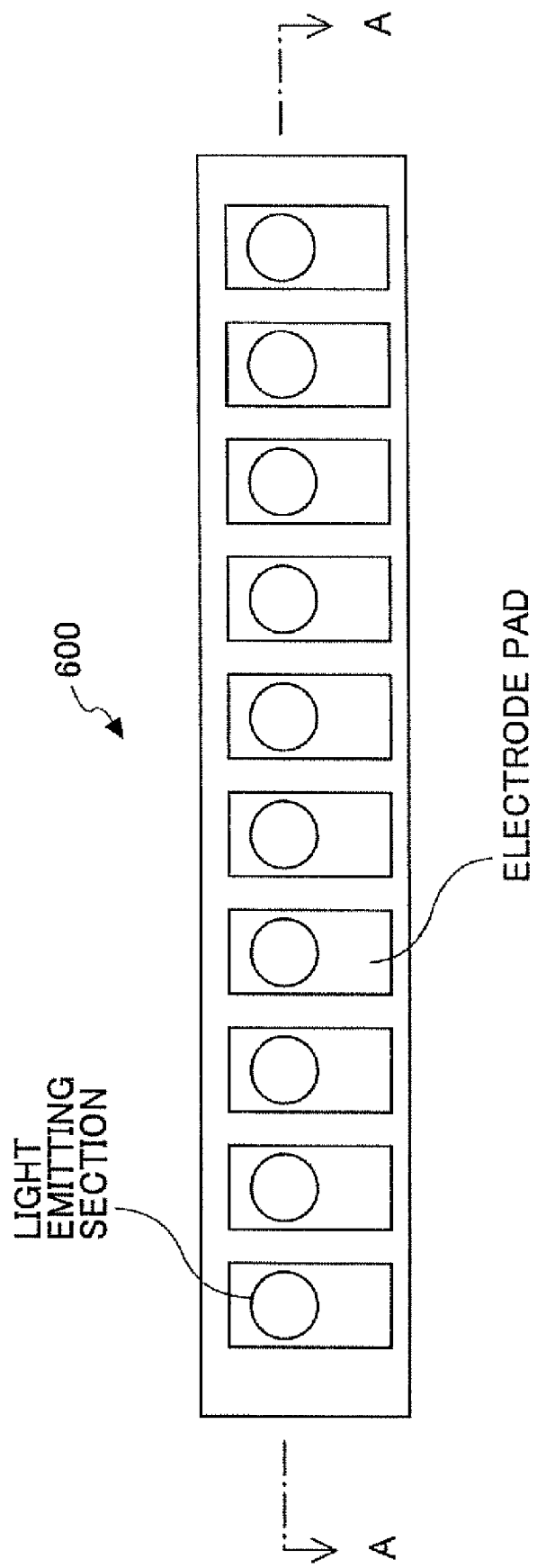
FIG. 24 is a drawing showing a surface emitting laser array according to sixth and seventh embodiments of the present invention.

FIG. 24 schematically shows a configuration of a surface emitting laser array 600 according to a sixth embodiment of the present invention.

The surface emitting laser array 600 includes plural (in this case, ten (10)) light emitting sections which are one-dimensionally aligned on the same substrate.

Figure 25:
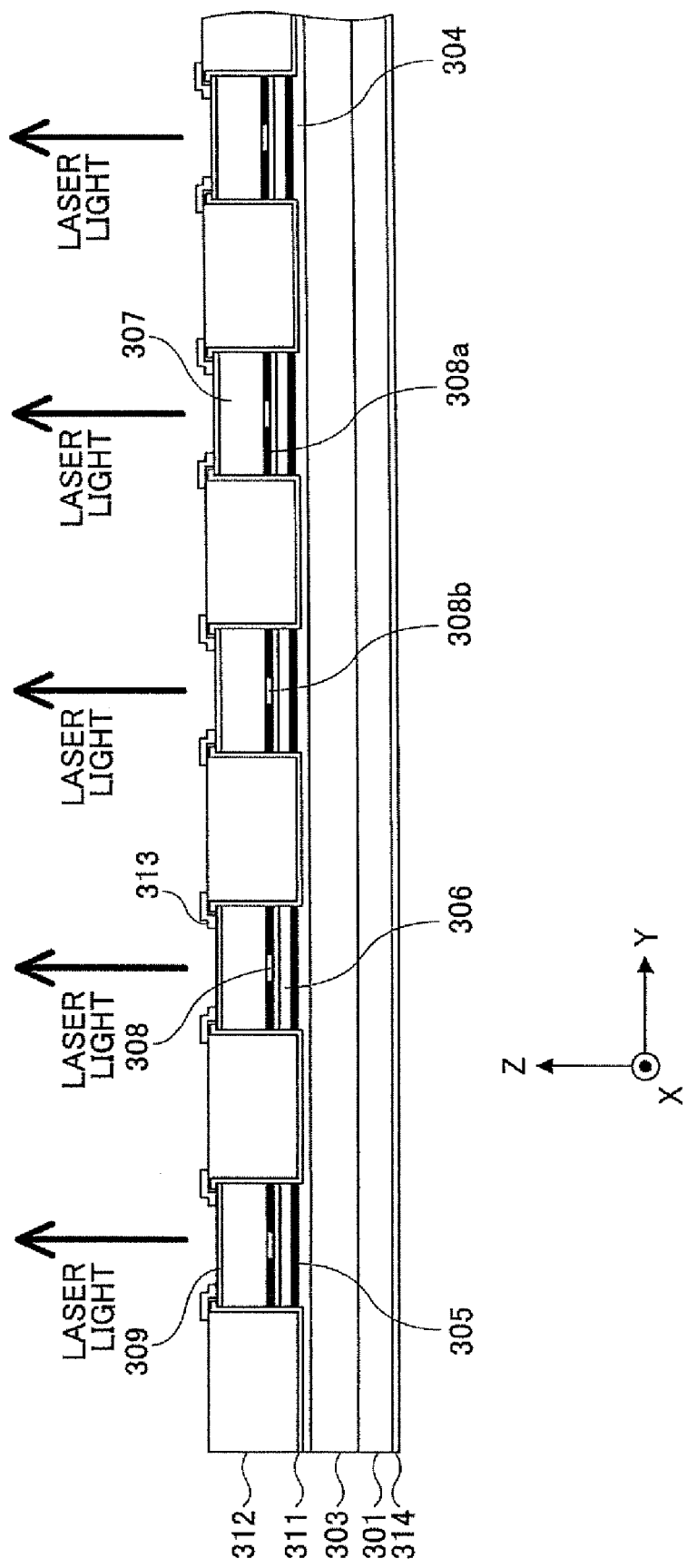
FIG. 25 is a cross-sectional drawing along line A-A of FIG. 24.
Figure 26:
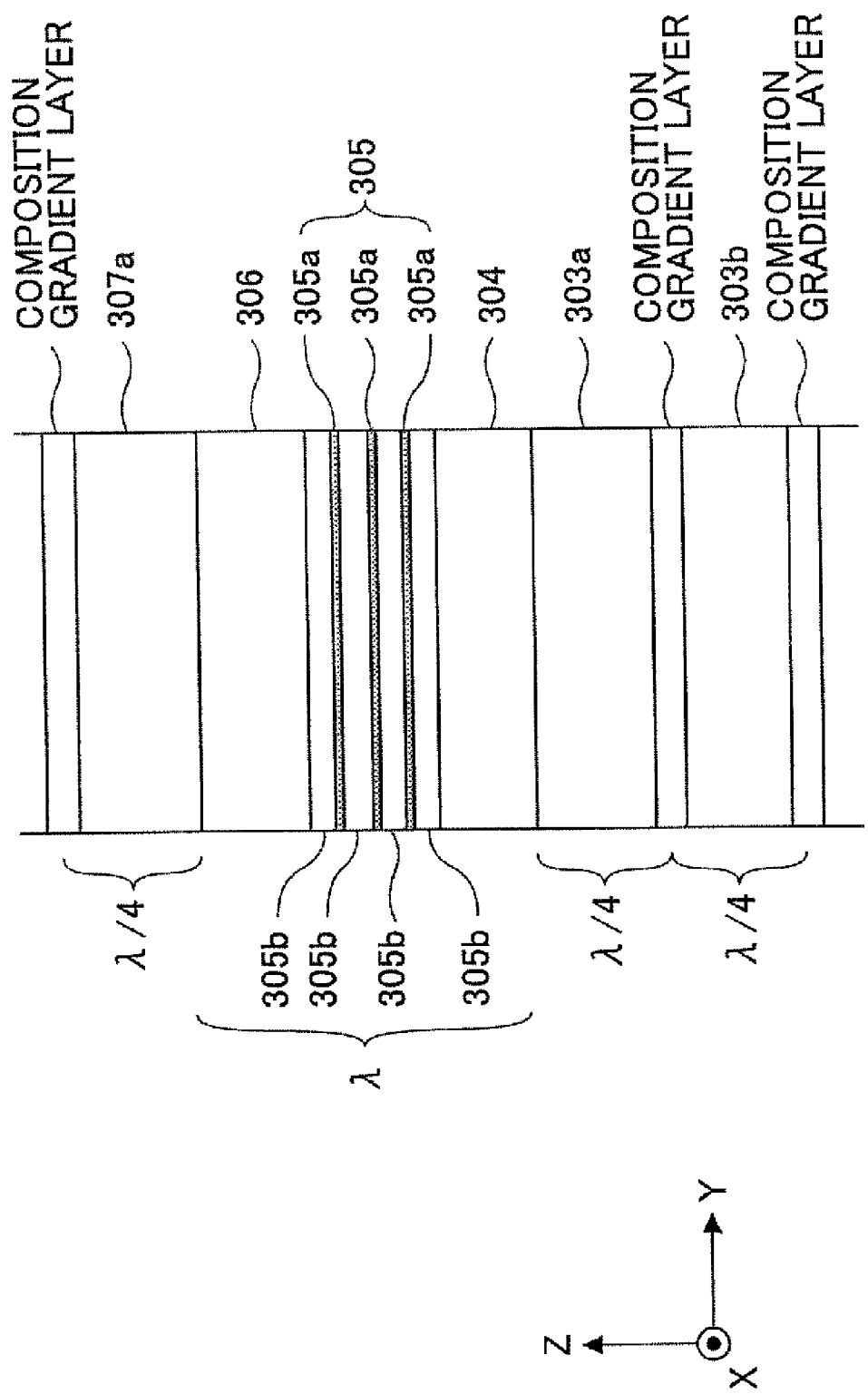
FIG. 26 is an enlarged drawing showing the vicinity of the active layer in FIG. 25.
Figure 27:
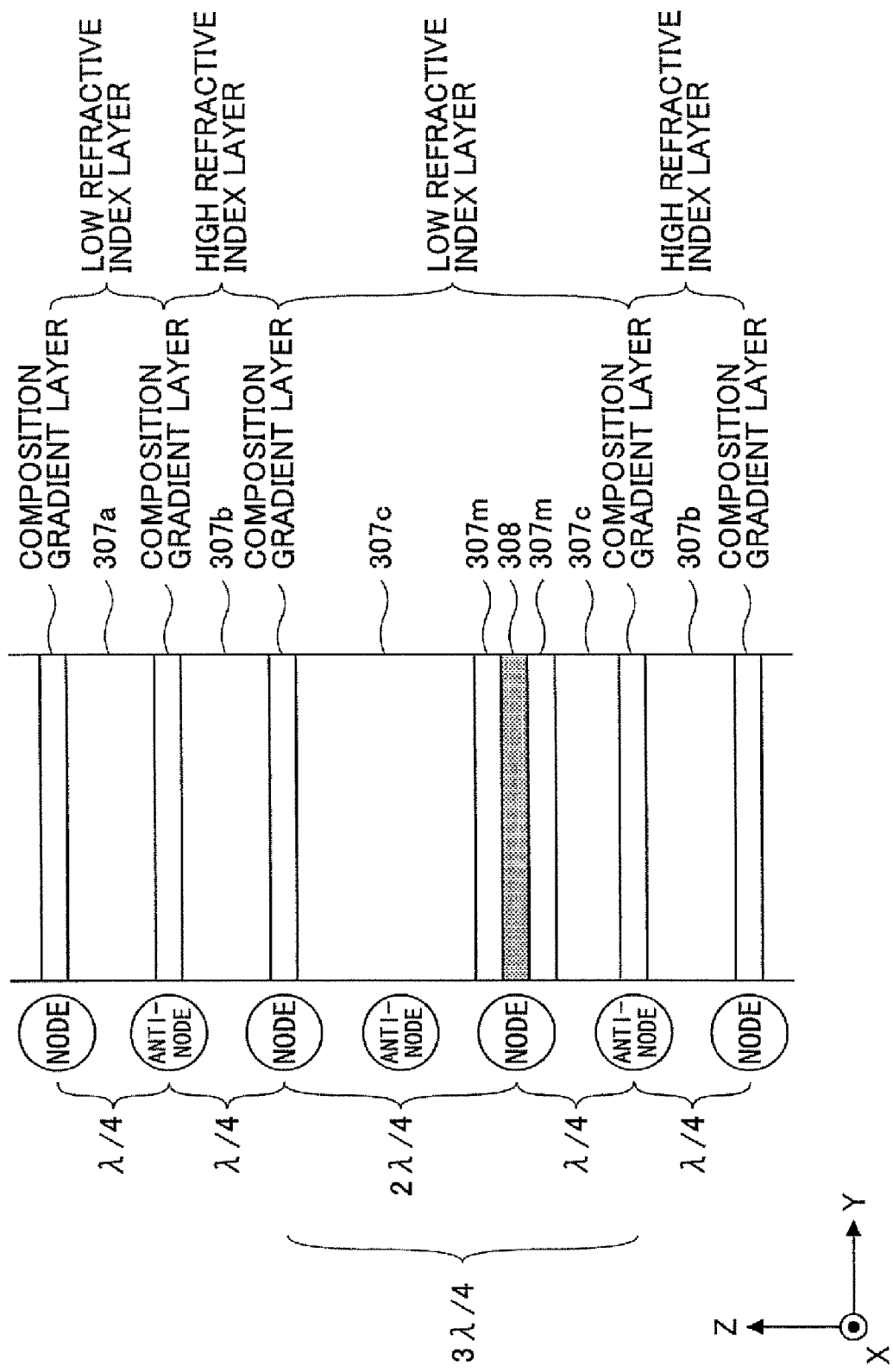
FIG. 27 is an enlarged drawing showing a part of the upper semiconductor DBR in FIG. 25 according to the sixth embodiment of the present invention.

Each of the light emitting sections of the surface emitting laser array 600 is designed to serve as a surface emitting laser having an oscillation wavelength of 1.3 µm band. FIG. 25 is a cross-sectional view along line A-A in FIG. 24. As shown in FIG. 25, the semiconductor layers such as a lower semiconductor DBR 303, a lower spacer layer 304, an active layer 305, an upper spacer layer 306, an upper semiconductor DBR 307, and a contact layer 309 are sequentially laminated on a substrate 301. FIG. 26 is an enlarged view of the vicinity of the active layer 305, and FIG. 27 is a partially-enlarged view of the upper semiconductor DBR 307.

The substrate 301 is a single-crystal substrate made of n-GaAs

The lower semiconductor DBR 303 includes 36.5 pairs of a low refractive index layer 303a made of n-$Al_{0.9}Ga_{0.1}As$ and a high refractive index layer 303b made of n-GaAs. Further, a composition gradient layer is interposed between each of the refractive index layers to reduce the electrical resistance. In the composition gradient layer, the composition is gradually changed from one side to the other side. It should be noted that each of the refractive index layers is designed so that the optical thickness with respect to the refractive index layer and one-half of each of the composition gradient layers adjoining the refractive index layer is equal to $\lambda/4$ ($\lambda$:oscillation wavelength).

The lower spacer layer 304 is made of GaAs.

The active layer 305 includes three quantum well layers 305a made of GaInNAs and four barrier layers 305b made of GaAs.

The upper spacer layer 306 is made of GaAs.

A multilayer part including the lower spacer layer 304, the active layer 305, and the upper spacer layer 306 may be called the "oscillator structure". The oscillation structure is designed so that the optical length thereof is equal to one wavelength in optical thickness. It should be noted that the active layer 305 is located at the position of the middle of the "oscillator structure" so as to obtain high stimulated emission probability, the position corresponding to an antinode position of the standing wave distribution of the electric field.

The upper semiconductor DBR 307 includes 26 pairs of a low refractive index layer and a high refractive index layer. Further, a composition gradient layer is interposed between the adjacent refractive index layers to reduce the electrical resistance. In the composition gradient layer, the composition is gradually changed from one side to the other side.

In the upper semiconductor DBR 307, there is a selectively-oxidized layer 308 made of p-AlAs having a thickness of 20 nm included in one of the low refractive index layers. The interposing position of the selectively-oxidized layer 308 is optically separated from the upper spacer layer 306 by $5\lambda/4$. Further, the low refractive index layer including the selectively-oxidized layer 308 is designed so that the optical thickness of the low refractive index layer and one-half of each of the composition gradient layers adjoining the low refractive index layer is equal to $3\lambda/4$.

The refractive index layers excluding the low refractive index layer including selectively-oxidized layer 308 are designed so that the optical thickness of the refractive index layer and one-half of each of the composition gradient layers adjoining the refractive index layer is equal to $\lambda/4$.

On the +z and −Z sides of the selectively-oxidized layer 308, intermediate layers 307m made of p-$Al_{0.8}Ga_{0.2}As$ and having a thickness of 35 nm are provided.

There are provided layers 307c made of p-$Al_{0.6}Ga_{0.4}As$ (hereinafter referred to as a "low refractive index layer 307c") adjoining the corresponding intermediate layers 307m in the low refractive index layer including the selectively-oxidized layer 308.

In the upper semiconductor DBR 307, the low refractive index layers 307a excluding the low refractive index layer including selectively-oxidized layer 308 are made of p-$Al_{0.9}Ga_{0.1}As$. Further, the high refractive index layers 307b are made of p-GaAs.

Namely, the selectively-oxidized layer 308 is included in one of the low refractive index layers in the upper semiconductor DBR 307, and the low refractive index layer including the selectively-oxidized layer 308 further includes two intermediate layers 307m adjoining the selectively-oxidized layer 308 and two low refractive index layer 307c adjoining the corresponding intermediate layers 307m. Further, Al content rate in the intermediate layers 307m is less than that in the selectively-oxidized layer 308 by 20%; and Al content rate in the low refractive index layer 307c is less than that in the selectively-oxidized layer 308 by 40%.

The surface emitting laser array 600 may be manufactured in the same manner as the surface emitting laser 100. However the shape of the mesa of the surface emitting laser array 600 is circular.

As described above, the surface emitting laser array 600 according to the sixth embodiment of the present invention includes plural surface emitting lasers having a similar structure as the surface emitting laser 100. Therefore, the surface emitting laser array 600 has the same effects as the surface emitting laser 100. Further, in the surface emitting laser array 600, the variations of the size (area) of the current passage region and the thickness of the oxidized layer are small among the light emitting sections, and the variations of the threshold value current, the single-mode output power, the light diffusion angle, the service lifetime, and the like are also small.

Therefore, the surface emitting laser array 600 may be more easily manufactured, has a higher yield, and has a longer service lifetime than conventional surface emitting laser arrays.

In the sixth embodiment, a case is described where the surface emitting laser array 600 has ten (10) light emitting sections. However, the number of the light emitting sections is not limited to this number.

In the sixth embodiment, a case is described where the shape of the mesa in a cross sectional surface perpendicular to the laser light emitting direction is circular. However, in the present invention, the shape of the mesa is not limited to this shape. For example, the mesa may have any other shape including square, rectangular, and elliptic.

In the sixth embodiment, a case is described where the wavelength is 1.3 μm band. However, in the present invention, the wavelength is not limited to this wavelength band. For example, the wavelength band may be 650 nm, 780 nm, 850 nm, 980 nm, and 1.5 μm.

Surface Emitting Laser Array

Seventh Embodiment

FIG. 24 schematically shows a configuration of a surface emitting laser array 600 according to a seventh embodiment of the present invention.

The surface emitting laser array 600 includes plural (in this case, ten (10)) light emitting sections which are one-dimensionally aligned on the same substrate.

Figure 28:
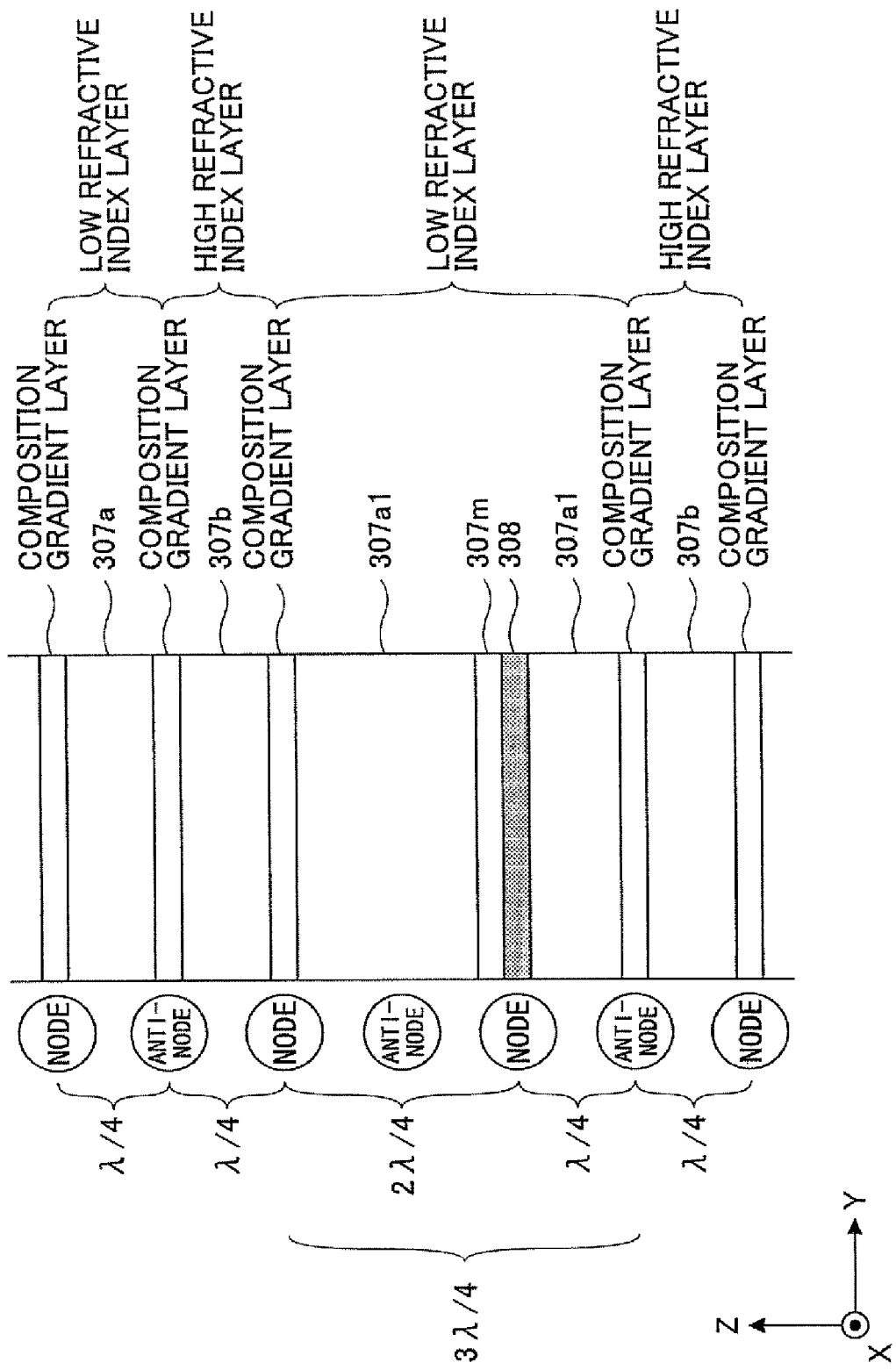
FIG. 28 is an enlarged drawing showing a part of the upper semiconductor DBR in FIG. 25 according to the seventh embodiment of the present invention.

Each of the light emitting sections of the surface emitting laser array 600 is designed to serve as a surface emitting laser having an oscillation wavelength of 1.3 μm band. FIG. 25 is a cross-sectional view along line A-A in FIG. 24, the semiconductor layers such as a lower semiconductor DBR 303, a lower spacer layer 304, an active layer 305, an upper spacer layer 306, an upper semiconductor DBR 307, and a contact layer 309 are sequentially laminated on a substrate 301. FIG. 26 is an enlarged view of the vicinity of the active layer 305 shown in FIG. 25, and FIG. 28 is a partially-enlarged view of the upper semiconductor DBR 307 shown in FIG. 25.

The substrate 301 is a single-crystal substrate made of n-GaAs.

The lower semiconductor DBR 303 includes 36.5 pairs of a low refractive index layer 303a made of n-$Al_{0.9}Ga_{0.1}As$ and a high refractive index layer 303b made of n-GaAs. Further, a composition gradient layer is interposed between the low refractive index layer and the high refractive index layer to reduce the electrical resistance. In the composition gradient layer, the composition is gradually changed from one side to the other side. It should be noted that each of the refractive index layers is designed so that the optical thickness with respect to the refractive index layer and one-half of each of the composition gradient layers adjoining the refractive index layer is equal to $\lambda/4$.

The lower spacer layer 304 is made of GaAs.

The active layer 305 includes three quantum well layers 305a made of GaInNAs and four barrier layers 305b made of GaAs.

The upper spacer layer 306 is made of GaAs.

A multilayer part including the lower spacer layer 304, the active layer 305, and the upper spacer layer 306 may be called the "oscillator structure". The oscillation structure is designed to have an optical length equal to one wavelength in optical thickness. It should be noted that the active layer 305 is located at the position of the middle of the "oscillator structure" so as to obtain high stimulated emission probability, the position corresponding to an antinode position of the standing wave distribution of the electric field.

The upper semiconductor DBR 307 includes 26 pairs of a low refractive index layer and a high refractive index layer. Further, a composition gradient layer is interposed between the low refractive index layer and the high refractive index layer to reduce the electrical resistance. In the composition gradient layer, composition is gradually changed from one side to the other side.

In the upper semiconductor DBR 307, there is a selectively-oxidized layer 308 made of p-AlAs and having a thickness of 20 nm included in one of the low refractive index layers. The interposing position of the selectively-oxidized layer 308 is optically separated from the upper spacer layer 306 by $5\lambda/4$. Further, the low refractive index layer including selectively-oxidized layer 308 is designed so that the optical thickness of the low refractive index layer and one-half of each of the composition gradient layers adjoining the low refractive index layer is equal to $3\lambda/4$.

Each of the refractive index layers excluding the low refractive index layer including selectively-oxidized layer 308 is designed so that the optical thickness of the refractive index layer and one-half of each of the composition gradient layers adjoining the refractive index layer is equal to $\lambda/4$.

An intermediate layer 307m made of p-$Al_{0.8}Ga_{0.2}As$ and having a thickness of 35 nm is provided on the +z side of the selectively-oxidized layer 308.

A layer 307a1 made of p-$Al_{0.6}Ga_{0.4}As$ (hereinafter referred to as a "low refractive index layer 307a1") is provided on each of the −Z side of the selectively-oxidized layer 308 and the +Z side of the intermediate layers 307m. Therefore, the low refractive index layer including the selectively-oxidized layer 308 further includes the intermediate layers 307m and two low refractive index layers 307a1.

In the upper semiconductor DBR 307, each of the low refractive index layers 307a excluding the low refractive index layer including the selectively-oxidized layer 308 is made of p-$Al_{0.9}Ga_{0.1}As$. Further, each of the high refractive index layers 307b is made of p-$Al_{0.1}Ga_{0.9}As$.

Namely, the center position of the selectively-oxidized layer 308 with respect to its thickness direction corresponds to a node position of the standing wave distribution and is positioned between the intermediate layer 307m and the low refractive index layer 307a1. Further, Al content rate in each of the intermediate layers 307m and the low refractive index layer 307a1 is less than that in the selectively-oxidized layer 308, and Al content rate in the low refractive index layer 307a1 is less than that in the intermediate layers 307m.

The surface emitting laser array 600 may be manufactured in the same manner as the surface emitting laser 100.

In each of the light emitting sections of the surface emitting laser array 600, the upper semiconductor DBR includes the current confined structure in which the current passage region is surrounded by the oxidized layer formed by selective oxidation of Al. The thickness of the oxidized layer gradually decreases as the distance to the current passage region decreases. The oxidized layer has a first boundary surface on one side closer to the active layer 305 and a second boundary surface on the other side. Further, the second boundary surface is more inclined than the first boundary surface with respect to a virtual surface perpendicular to the laser light emitting direction.

As described above, the surface emitting laser array 600 according to the seventh embodiment of the present invention includes plural surface emitting lasers having a similar structure as the surface emitting laser 100. Therefore, the surface emitting laser array 600 may obtain high single-mode output power in each light emitting section without incurring high cost.

In the seventh embodiment, a case is described where the surface emitting laser array 600 has ten (10) light emitting sections. However, the number of the light emitting sections is not limited to this number.

In the seventh embodiment, a case is described where the shape of the mesa in a cross-sectional surface perpendicular to the laser light emitting direction is circular. However, in the present invention, the shape of the mesa is not limited to this shape. For example, the mesa may have any other shape including square, rectangular, and elliptic.

In this seventh embodiment, a case is described where the wavelength is 1.3 μm band. However, in the present invention, the wavelength is not limited to this wavelength band. For example, the wavelength band may be 650 nm, 780 nm, 850 nm, 980 nm, and 1.5 μm.

Image Forming Apparatus

Eighth Embodiment

Figure 29:
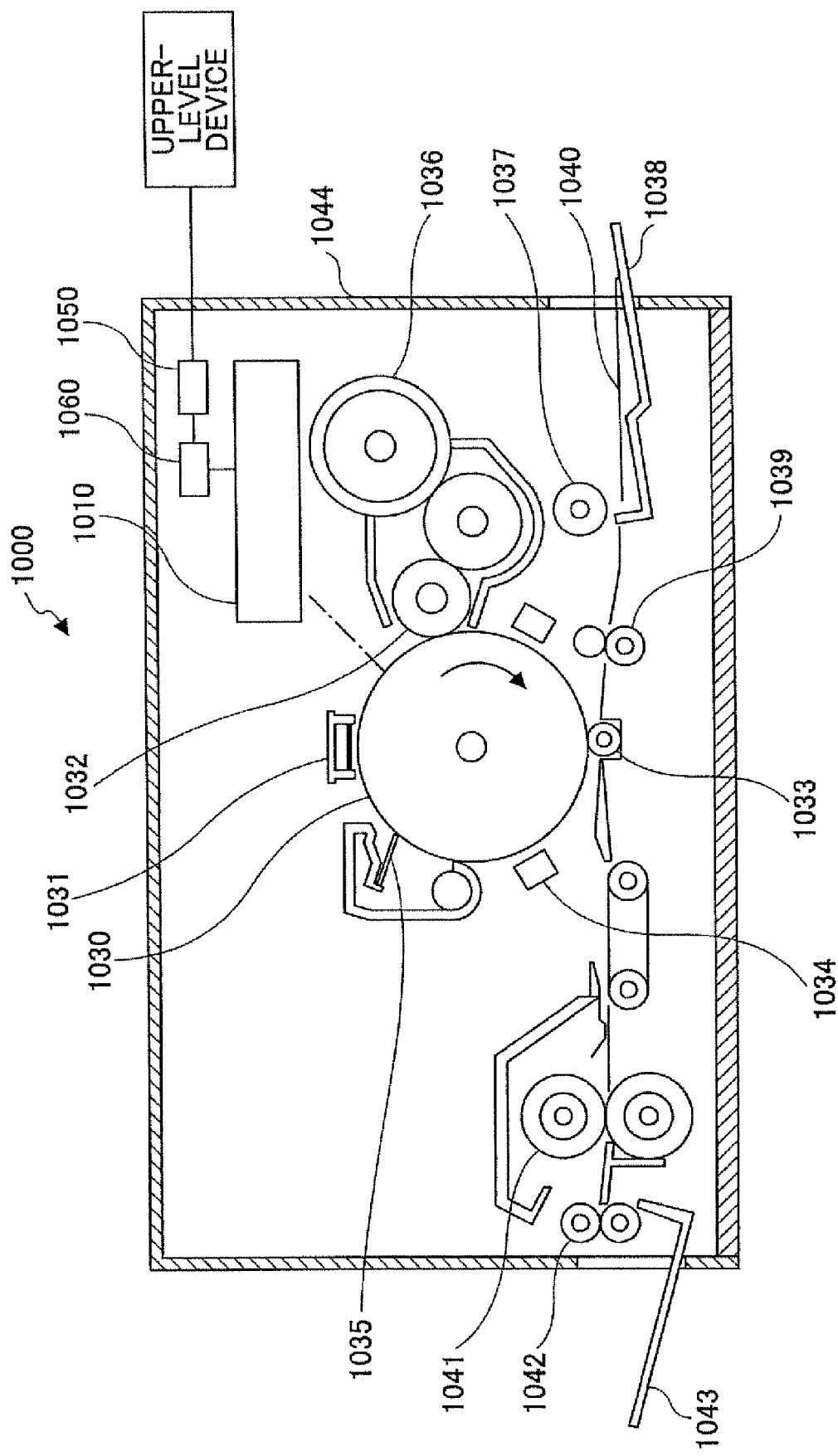
FIG. 29 is a schematic drawing showing a configuration of a laser printer according to an eighth embodiment of the present invention.

FIG. 29 schematically shows a configuration of a laser printer 1000 as an image forming apparatus according to an eighth embodiment of the present invention.

As shown in FIG. 29, the laser printer 1000 include an optical scanning device 1010, a photosensitive drum 1030, a charger 1031, a developing roller 1032, a transfer charger 1033, a neutralizing unit 1034, a cleaning blade 1035, a toner cartridge 1036, a sheet feeding roller 1037, a sheet feeding tray 1038, a resist roller pair 1039, a fixing roller 1041, a discharging roller 1042, a discharging tray 1043, a communication control device 1050, and a printer controlling device 1060 generally controlling the above elements. These elements are housed in a printer chassis 1044.

The communication control device 1050 controls two-way communications with an upper-level device (such as a personal computer) through a network.

The photosensitive drum 1030 has a cylindrical shape, and a photosensitive layer is formed on the surface of the photosensitive drum 1030. Namely, the surface of the photosensitive drum 1030 is to be scanned. The photosensitive drum 1030 rotates in the direction indicated by an arrow in FIG. 29.

Each of the charger 1031, the developing roller 1032, the transfer charger 1033, the neutralizing unit 1034, and the cleaning blade 1035 is disposed in the vicinity of the surface of the photosensitive drum 1030. Further, the charger 1031, the developing roller 1032, the transfer charger 1033, the neutralizing unit 1034, and the cleaning blade 1035 are sequentially arranged in this order along the rotating direction of the photosensitive drum 1030.

The charger 1031 uniformly charges the surface of the photosensitive drum 1030.

The optical scanning device 1010 irradiates a light flux modulated in accordance with the image information from the upper-level device. By doing this, a latent image in accordance with the image information is formed on the surface of the photosensitive drum 1030. The formed latent image is moved in the direction of the developing roller 1032 by the rotation of the photosensitive drum 1030. The configuration of the optical scanning device 1010 is described in detail below.

Toner housed in the toner cartridge 1036 is supplied to the developing roller 1032.

The developing roller 1032 causes the toner to adhere onto the latent image formed on the surface of the photosensitive drum 1030 to visualize the image information. The latent image with toner adhered (hereinafter may be referred to as a "toner image" for convenience) is moved in the direction of the transfer charger 1033 by the rotation of the photosensitive drum 1030.

Recording sheets 1040 are provided in the sheet feeding tray 1038. In the vicinity of the sheet feeding tray 1038, the sheet feeding roller 1037 is provided. The sheet feeding roller 1037 feeds the recording sheets 1040 from the sheet feeding tray 1038 to the resist roller pair 1039 one by one. The resist roller pair 1039 first holds the recording sheet 1040 taken out by the sheet feeding roller 1037 and sends out the recording sheet 1040 towards the gap between the photosensitive drum 1030 and the transfer charger 1033 in synchronization with the rotation of the photosensitive drum 1030.

A voltage of the opposite polarity to the polarity of the toner is applied to the transfer charger 1033 to electrically attract the toner on the surface of the photosensitive drum 1030 to the recording sheet 1040. By applying the voltage, the toner image on the surface of the photosensitive drum 1030 is transferred onto the recording sheet 1040. The transferred recording sheet 1040 is fed to the fixing roller 1041.

The fixing roller 1041 applies heat and pressure to the recording sheet 1040 to fix the toner onto the recording sheet 1040. The fixed recording sheet 1040 is discharged to the discharging tray 1043 to be sequentially stacked on the discharging tray 1043.

The neutralizing unit 1034 neutralizes the surface of the photosensitive drum 1030.

The cleaning blade 1035 removes the toner remaining on the surface of the photosensitive drum 1030 (residual toner). The surface of the photosensitive drum 1030 on which the residual toner is removed is returned to the position facing the charger 1031 again.

<<Optical Scanning Device>>

Next, a configuration of the optical scanning device 1010 is described.

Figure 30:
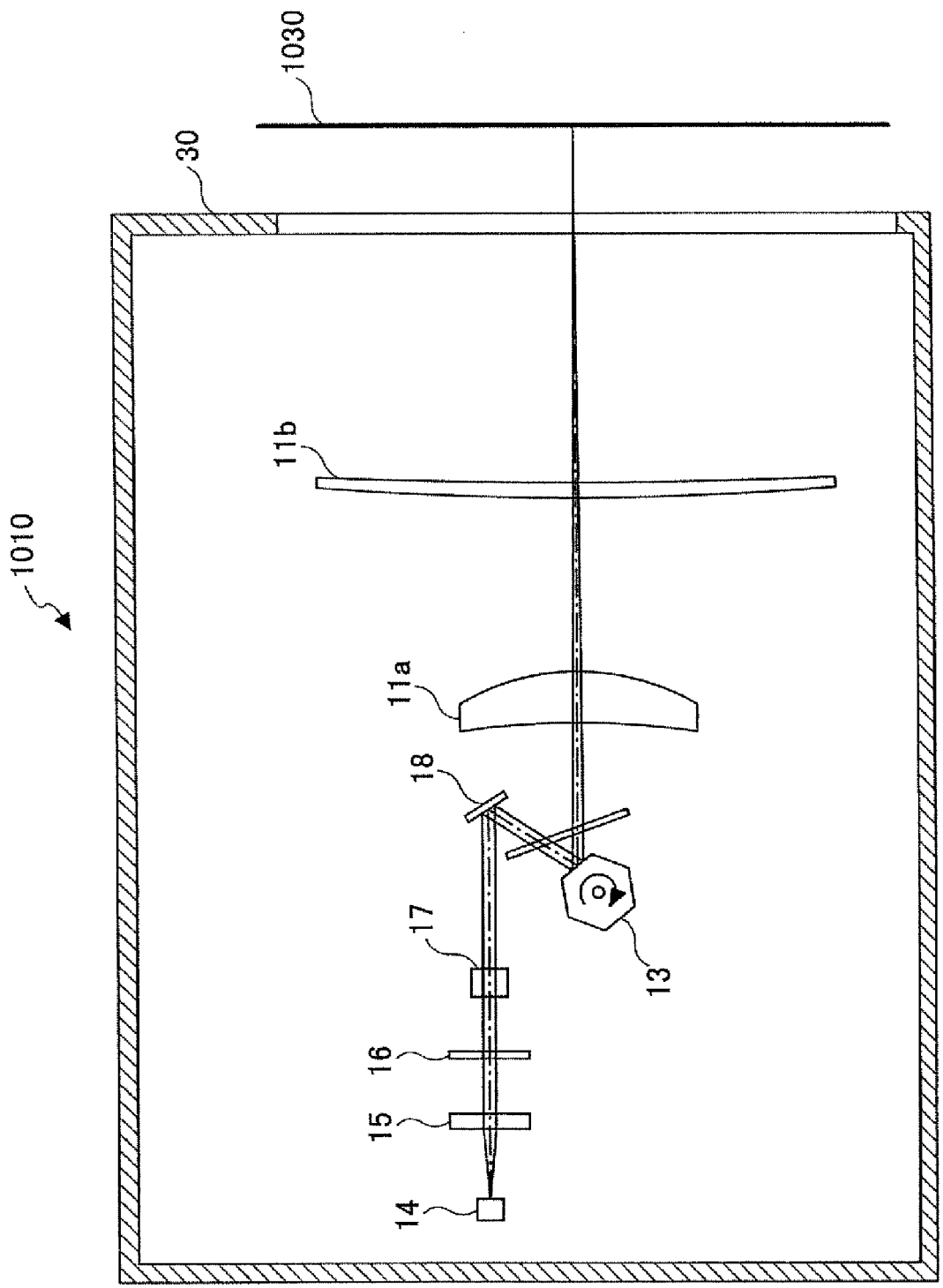
FIG. 30 is a schematic drawing showing the optical scanning device in FIG. 29.

For example, as shown in FIG. 30, the optical scanning device 1010 includes a light source 14, a coupling lens 15, an aperture plate 16, an anamorphic lens 17, a reflection mirror 18, a polygon mirror 13, a deflector-side scanning lens 11*a*, an image-surface-side scanning lens 11*b*, and a scanning control device (not shown). These elements are arranged in their prescribed positions in a housing 30.

It should be noted that in the following, the direction corresponding to a main scanning direction is simplified as a "main-scanning corresponding direction", and the direction corresponding to a sub-scanning direction is simplified as a "sub-scanning corresponding direction".

The light source 14 includes the surface emitting array 500 and is capable of emitting thirty two (32) light beams simultaneously. In this case, the surface emitting array 500 is arranged so that the "M" direction corresponds to the main-scanning corresponding direction, and the "S" direction corresponds to the sub-scanning corresponding direction.

The coupling lens 15 makes parallel the beams of divergent light flux from the light source 14. The light source 14 and the coupling lens 15 are fixed on an aluminum holder so that the positional relationship between the light source 14 and the coupling lens 15 is fixed to their desired positions as an unit.

The aperture plate 16 has an opening to regulate the diameter of the beam of the light flux through the coupling lens 15.

The anamorphic lens 17 forms an image by refracting the light flux having passed through the opening of the aperture plate 16 and the reflection mirror 18 with respect to the sub-scanning corresponding direction in the vicinity of the deflection reflection surface of the polygon mirror 13.

The optical system disposed on the optical path between the light source 14 and the polygon mirror 13 may be called a pre-deflector optical system. In this embodiment, the pre-deflector optical system includes the coupling lens 15, the aperture plate 16, the anamorphic lens 17, and the reflection mirror 18.

The polygon mirror 13 may be a hexagonal mirror having a radius of its inscribed circle of 18 mm. Each of the mirrors serves as a deflection reflection surface. This polygon mirror 13 deflects the light flux from the reflection mirror 18 while rotating around the axis line parallel to the sub-scanning corresponding direction.

The deflector-side scanning lens 11*a* is disposed on the optical path of the light flux deflected by the polygon mirror 13.

The image-surface-side scanning lens 11*b* is disposed on the optical path of the light flux passing through the deflector-side scanning lens 11*a*. The light flux passing through the image-surface-side scanning lens 11*b* is transmitted onto the surface of the photosensitive drum 1030 to form a light spot. This light spot moves in the longitudinal direction of the photosensitive drum 1030 in accordance with the rotation of the polygon mirror 13. Namely, the light spot is scanned on the surface of the photosensitive drum 1030. The moving direction of the light spot is in the "main-scanning corresponding direction". Further, the rotation direction of the photosensitive drum 1030 is in the "sub-scanning corresponding direction".

The optical system disposed on the optical path between the polygon mirror 13 and the photosensitive drum 1030 may be called a scanning optical system. In this embodiment, the scanning optical system includes the deflector-side scanning lens 11*a* and the image-surface-side scanning lens 11*b*. It should be noted that at least one folding mirror may be disposed on at least one of the optical paths between the deflector-side scanning lens 11*a* and the image-surface-side scanning lens 11*b* and between the image-surface-side scanning lens 11*b* and the photosensitive drum 1030.

In this case, in the surface emitting laser array 500, each of the light emitting section intervals is a contact interval "c" when that light emitting section is orthographically projected onto a virtual line extending in the "S" direction. Therefore, by adjusting the timing of emitting lights, this configuration is thought to be substantially the same as the configuration where the light emitting sections are aligned in the sub-scanning corresponding direction at the same intervals.

Further, since the interval "c" is 3 μm, it becomes possible to attain the high-density writing of 4800 dpi (dot per inch) by setting the magnification of the optical system to about 1.8. Needless to say, it becomes possible to attain higher density and high-quality printing by, for example, increasing the number of light emitting sections in the "T" direction, changing the array configuration by scaling down the interval "d" and further scaling down the interval "c", and increasing the magnification of the optical system. It should be noted that the writing interval in the main scanning direction may be easily controlled by adjusting the lighting timing of the light emitting sections.

Further, in this configuration, the laser printer 1000 may print without reducing the printing speed even in a case where the writing dot density is increased. Further, when the writing dot density is maintained, the printing speed may be further increased.

Further, in the surface laser array 500, the variations in the size of the current passage region and the thickness of the oxidized layer among the light emitting sections are small. Therefore, the variations of light-emitting diameter and the characteristics become small, and the diameters of the beam spots formed on photosensitive drum 1030 become substantially equal to each other.

As described above, in the optical scanning device 1010 according to the eighth embodiment of the present invention, the light source 14 is equipped with the surface emitting laser array 500. Therefore, the optical scanning device 1010 is capable of stably carrying out high-density optical scanning without incurring high cost.

Further, a laser printer 1000 according to the eight embodiment of the present invention, the laser printer includes the optical scanning device 1010. Therefore, the laser printer 1000 is capable of stably forming high-quality images without incurring high cost.

Further, the oxidized layer on the side surface of the mesa where the oxidation is started hardly becomes thicker than is designed, and the service lifetime of the surface emitting laser array becomes remarkably longer. Therefore, it becomes possible to re-use the writing unit or the light source unit.

In the eighth embodiment, a case is described where the light source 14 has thirty two (32) light emitting sections. However, the number of the light emitting sections is not limited to this number.

In the eighth embodiment, instead of using the surface emitting laser array 500, a surface emitting laser array in which the light emitting section same as that of the surface emitting laser array 500 is one-dimensionally aligned may be used.

In this eighth embodiment, a case is described where the laser printer 1000 is used as an image forming apparatus. However, the image forming apparatus of the present invention is not limited to the laser printer. Namely, the present invention may be applied to any image forming apparatus having the optical scanning device 1010. Such image forming apparatus may stably form high-quality images without incurring high cost.

For example, the present invention may apply to an image forming apparatus capable of irradiating a laser light directly onto a medium (such as a sheet) that develops colors by the laser light.

Further, the present invention may be applied to an image forming apparatus in which a silver salt film is used as an image carrier. In this case, a latent image is formed on the silver salt film, and the formed latent image is may be visualized in the same manner as a usual developing method in a silver photography process and transferred onto a printing paper in the same manner as a usual printing method in a silver photography process. Such image forming apparatus may be applied to an optical photoengraving apparatus and an optical drawing apparatus for drawing CT scanned images or the like.

Further, an image forming apparatus capable of forming multi-color images may stably form a high-quality image without incurring high cost when an optical scanning device adapted to multi-color images according to an embodiment of the present invention is used.

Figure 31:
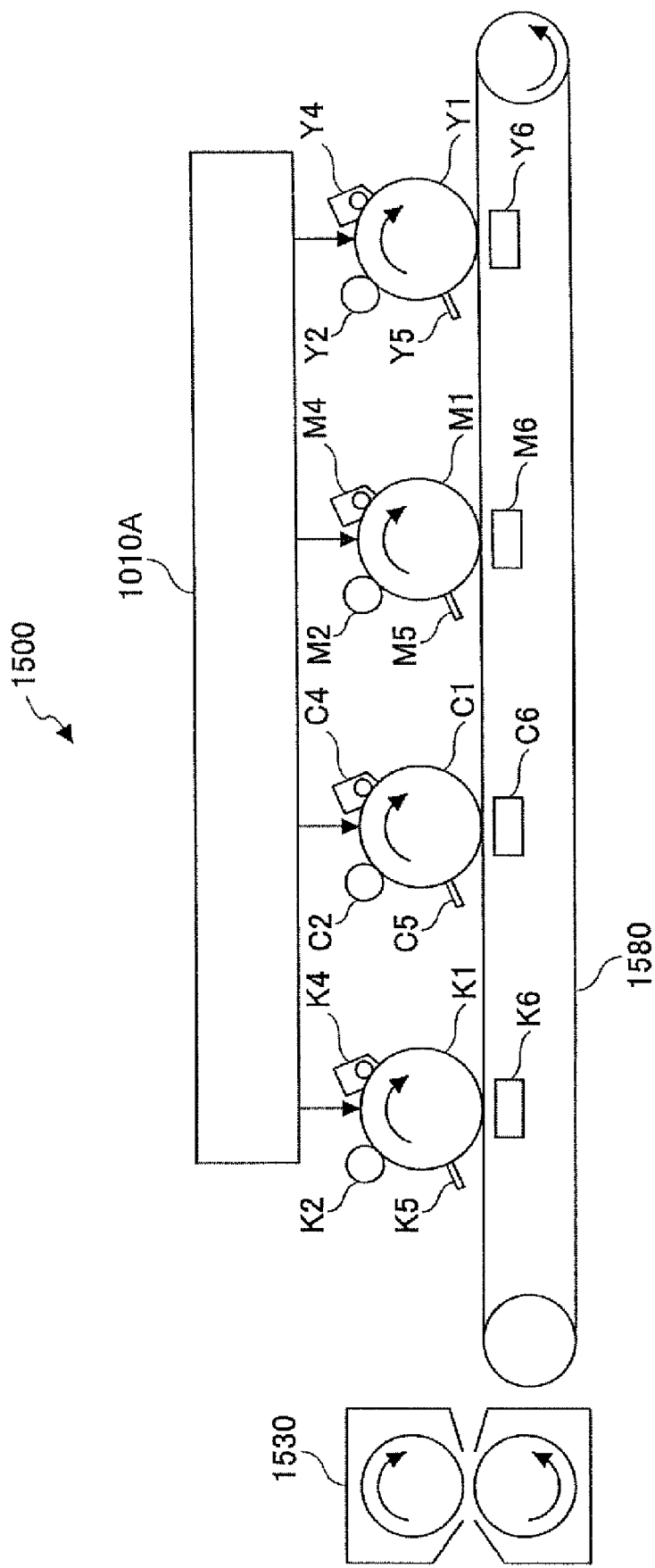
FIG. 31 is a schematic drawing showing a configuration of a tandem color machine.

For example, as shown in FIG. 31, the present invention may be applied to a tandem color machine 1500 equipped with plural photosensitive drums for a color image processing.

As shown in FIG. 31, the tandem color machine 1500 includes "a photosensitive drum K1, a charging device K2, a developing device K4, a cleaning unit K5, and transferring device K6" for black processing; "a photosensitive drum C1, a charging device C2, a developing device C4, a cleaning unit C5, and transferring device C6" for cyan processing; "a photosensitive drum M1, a charging device M2, a developing device M4, a cleaning unit M5, and transferring device M6" for magenta processing; "a photosensitive drum Y1, a charging device Y2, a developing device Y4, a cleaning unit Y5, and transferring device Y6" for yellow processing; an optical scanning device 1010A; a transfer belt 1580; and a fixing unit 1530.

Each photosensitive drum rotates in the direction indicated by the corresponding arrow in FIG. 31. In the order of the rotation in the rotating direction, the charging device, the developing device, the transferring device, and the cleaning unit are sequentially arranged. Each charging device uniformly charges the surface of the corresponding photosensitive drum. A light from the optical scanning device 1010A is irradiated onto the surface of the photosensitive drum charged by the charging device to form a latent image on the photosensitive drum. Then, a toner image is formed on the surface of the photosensitive drum by the corresponding developing device. Then, each color toner image is transferred onto a recording sheet on the transfer belt 1580 by the corresponding transferring device. Finally, the superposed image is fixed onto the recording sheet by the fixing unit 1530.

The optical scanning device 1010A has a light source of each color, the light source being similar to the light source 14. Therefore, the optical scanning device 1010A may achieve the same result as the optical scanning device 1010. Further, the tandem color machine 1500 is equipped with the optical scanning device 1010A. Therefore, the tandem color machine 1500 may achieve the same effect as the laser printer 1000.

On the other hand, in a tandem color machine, a problem of color displacement may be caused by a manufacturing error or a displacement error of each part or the like. Even in such a case, in the optical scanning device 1010A, it is possible to reduce the color displacement by changing the light emitting sections to be turned ON because each light source of the optical scanning device 1010A has the same surface emitting laser array as the surface emitting laser array 500.

Further, in the eighth embodiment of the present invention, instead of using the optical scanning device 1010, an exposure device equipped with a light source including the surface emitting laser array 500 may be used. In this case, the same effect as the laser printer 1000 may be achieved.

Optical Transmission System

Ninth Embodiment

Figure 32:
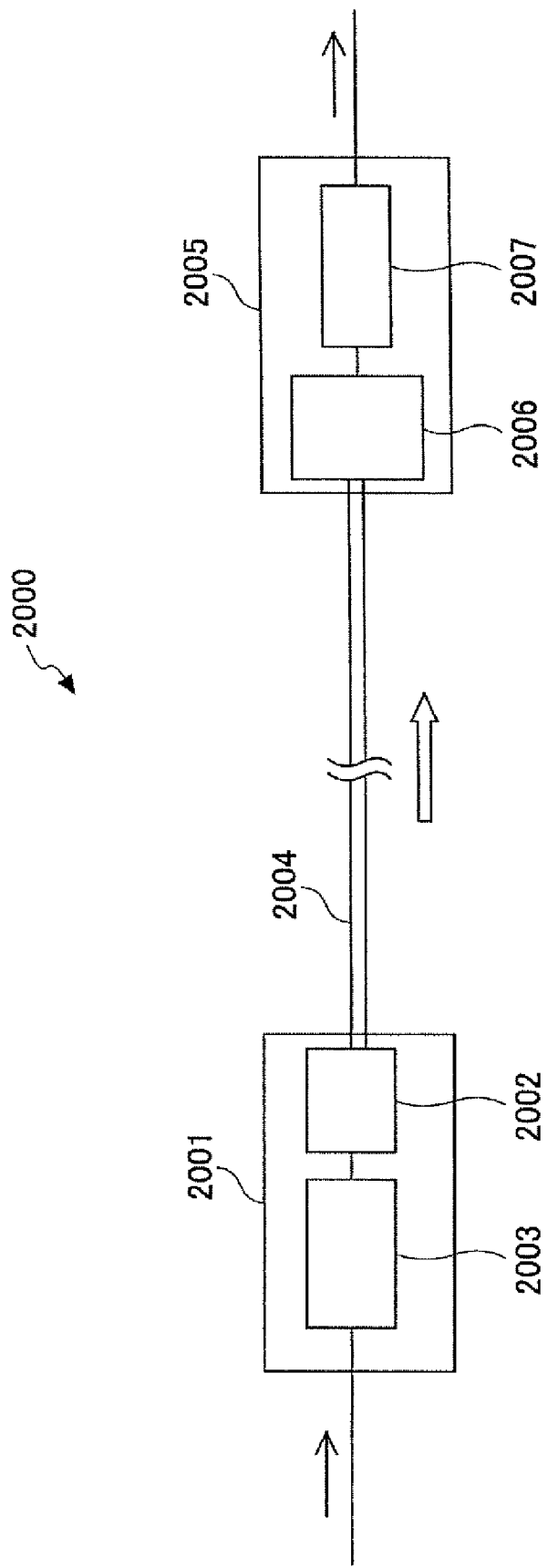
FIG. 32 is a schematic drawing showing a configuration of an optical transmission module and an optical transmission system according to a ninth embodiment of the present invention.

FIG. 32 schematically shows a configuration of an optical transmission system 2000 according to a ninth embodiment of the present invention. As shown in FIG. 32, the optical transmission system 2000 includes an optical transmission module 2001 and an optical reception module 2005 connected with each other through an optical fiber cable 2004, which allows one-way optical transmission from the optical transmission module 2001 to the optical reception module 2005.

Further, the optical transmission module 2001 includes a light source 2002 and a driving circuit 2003. The driving circuit 2003 controls the light intensity of the laser light output from the light source 2002 in accordance with an electronic signal input from the outside of the transmission module 2001.

The light source 2002 includes the surface emitting laser array 600.

Figure 33:
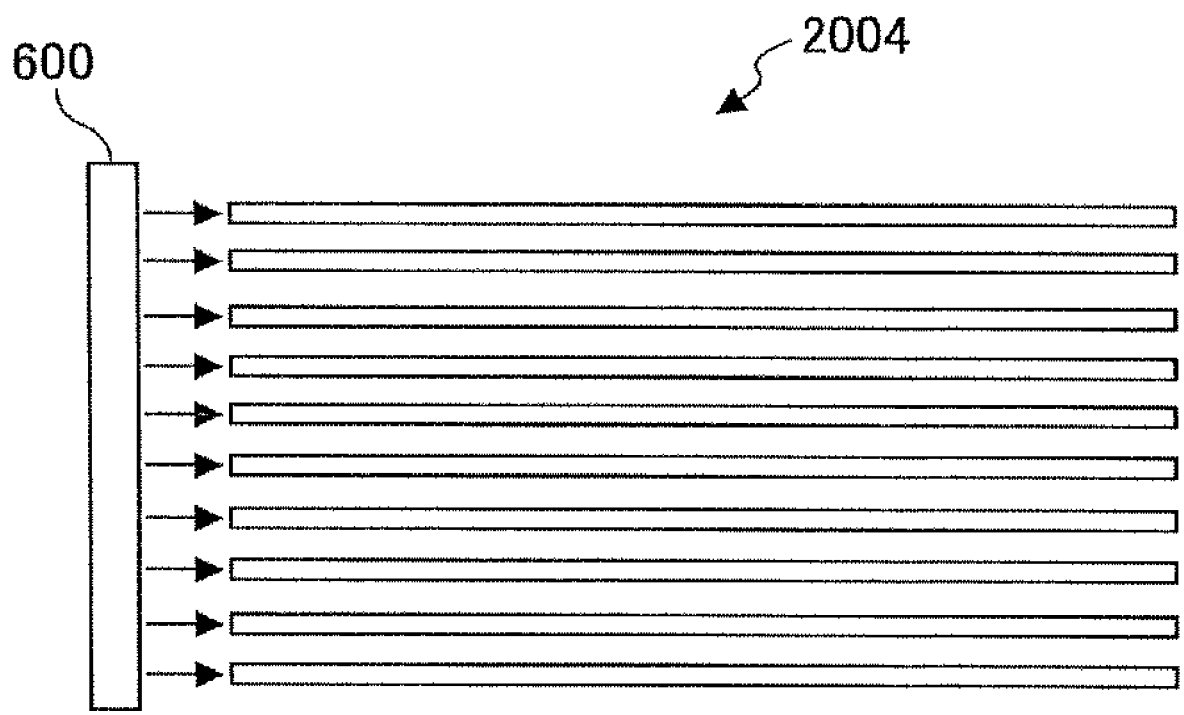
FIG. 33 is a drawing showing optical fibers in FIG. 32.

An optical signal output from the light source 2002 is coupled with and guided through the optical fiber cable 2004 to be input into the optical reception module 2005. It should be noted that as shown in FIG. 33 the optical fiber cable 2004 may include plural optical fibers so that the plural optical fibers correspond to the light emitting sections of the surface emitting laser array 600.

The optical reception module 2005 includes a light receiving device 2006 and a receiving circuit 2007. The light receiving device 2006 converts an optical signal into an electronic signal. The receiving circuit 2007 amplifies and performs waveform shaping of the electronic signal from the light receiving device 2006, and the like.

In the optical transmission module 2001 according to the ninth embodiment of the present invention, the light source 2002 includes the surface emitting laser array 600. Therefore, the optical transmission module 2001 may stably generate high-quality optical signal without incurring high cost.

Further, in the optical transmission system 2000 according to the ninth embodiment of the present invention, the optical transmission system 2000 includes the optical transmission module 2001. Therefore, high-quality optical transmission may be stably performed without incurring high cost.

Therefore, optical transmission system 2000 may be applied to short-range data transmission for home use, indoor office use, inside an apparatus, and the like.

Further, since the plural light emitting sections integrated on the same substrate have uniform characteristics, it is easy to perform data transmission based on simultaneous plural beams and fast data transmission.

Further, a surface emitting laser operates with low energy consumption. Therefore, when a surface emitting laser is included in an apparatus, temperature increase may be controlled.

It should be noted that in the ninth embodiment, a case is described where the plural light emitting sections correspond to the optical fibers one by one. However, plural light emitting sections having different oscillation wavelengths may be used based on wavelength multiplexing communication to increase the transmission rate.

Further, in the description of the ninth embodiment, a configuration for one-way communication is described. However, the present invention may be applied to a configuration for bidirectional communication.

INDUSTRIAL APPLICABILITY

As described above, a surface emitting laser and a surface emitting laser array according to an embodiment of the present invention may be more easily manufactured, have a higher yield, and have a longer service lifetime than conventional surface emitting laser and surface emitting laser arrays. Further, an optical scanning device according to an embodiment of the present invention may be adapted to stably perform high-density optical scanning without incurring high cost. Further, an image forming apparatus according to an embodiment of the present invention may be adapted to stably form high-quality images without incurring high cost. Further, an optical transmission module according to an embodiment of the present invention may be adapted to stably generate a high-quality optical signal without incurring high cost. Further, an optical transmission system according to an embodiment of the present invention may be adapted to stably perform high-quality optical data transmission without incurring high cost.

The present application is based on and claims the benefit of priority of Japanese Patent Application publication Nos. 2007-295505 filed on Nov. 14, 2007, 2008-016331 filed on Jan. 28, 2008, and 2008-136146 filed on May 26, 2008, the entire contents of which are hereby incorporated herein by reference.

The invention claimed is:

1. A surface emitting laser comprising:
an oscillator structure including an active layer;
semiconductor distribution Bragg reflectors each including plural pairs of a low refractive index layer and a high refractive index layer, the semiconductor distribution Bragg reflectors sandwiching the oscillator structure; and
a confined structure formed of a selectively-oxidized layer including aluminum, wherein
the selectively-oxidized layer is included as a part of the low refractive index layer of the semiconductor distribution Bragg reflector;
the low refractive index layer including the selectively-oxidized layer includes first and second layers, the first layer being in contact with at least one side of the selectively-oxidized layer, the second layer being in contact with the first layer; and
Al content rate in the first layer is lower than the Al content rate in the selectively-oxidized layer and is greater than the Al content rate in the second layer.

2. The surface emitting laser according to claim 1, wherein the confined structure includes a current passage region and an oxidized layer surrounding the current passage region, and
the oxidized layer includes an oxide formed by oxidizing a part of the selectively-oxidized layer and an oxide formed by oxidizing a part of the first layer.

3. The surface emitting laser according to claim 1, wherein a total thickness of the selectively-oxidized layer and the first layer is equal to or less than 110 nm.

4. The surface emitting as according to claim 3, wherein a maximum thickness of the oxidized layer is equal to or less than 110 nm.

5. The surface emitting laser according to claim 1, wherein an optical thickness of the low refractive index layer including the selectively-oxidized layer is expressed by the following formula:

$$(2n+1)\lambda/4N$$

where: "n" denotes an integer equal to or greater than 1, "λ" denotes an oscillation wavelength, and "N" denotes a refractive index of the layer.

6. The surface emitting laser according to claim 1, wherein a difference between Al content rate of the selectively-oxidized layer and Al content rate of the first layer is equal to or more than 5% and is equal to or less than 20%.

7. The surface emitting laser according to claim 1, wherein a difference between Al content rate of the selectively-oxidized layer and the Al content rate of the second layer is more than 20%.

8. A surface emitting laser emitting a light in the direction perpendicular to its substrate, the surface emitting laser comprising:
an oscillator structure including an active layer;
semiconductor distribution Bragg reflectors each including plural pairs of a low refractive index layer and a high refractive index layer, the semiconductor distribution Bragg reflectors sandwiching the oscillator structure; and a current confined structure in which a current passage region is surrounded by an oxidized layer, the current confined structure being formed in the semiconductor distribution Bragg reflector by selectively oxidizing aluminum, wherein the oxidized layer includes first and second boundary surfaces, the first boundary surface is provided at one side closer to the active layer, and the second boundary surface is provided on the other side, a thickness of the oxidized layer gradually decreases as the distance to the current passage region decreases, and the second boundary surface is more inclined than the first boundary surface with respect to a virtual surface perpendicular to a laser light emitting direction.

9. The surface emitting laser according to claim 8, wherein the semiconductor distribution Bragg reflector includes a selectively-oxidized layer, a first layer and a second layer, the center of the selectively-oxidized layer with respect to its thickness direction is disposed at a position corresponding to a node position of the standing wave distribution of the electric field of an oscillation light, the first layer adjoins one side of the selectively-oxidized layer, the one side being closer to the active layer, the second layer adjoins the other side of the selectively-oxidized layer, Al content rate in each of the first and second layers is less than the Al content rate in the selectively-oxidized layer, the Al content rate in the first layer is less than the Al content rate in the second layer, and the oxidized layer includes Al oxide in the selectively-oxidized layer and Al oxide in the second layer.

10. The surface emitting laser according to claim 9, wherein the selectively-oxidized layer, the first layer, and the second layer are included as a part of one of the low refractive index layers of the semiconductor distribution Bragg reflector.

11. The surface emitting according to claim 10, wherein the Al content rate of the first layer is less than the Al content rate in each of the low refractive index layers excluding the low refractive index layer including the selectively-oxidized layer.

12. The surface emitting laser according to claim 8, wherein the semiconductor distribution Bragg reflector includes a selectively-oxidized layer, a first layer and a second layer, the center of the selectively-oxidized layer with respect to its thickness direction is disposed at a position corresponding to a node position of the standing wave distribution of the electric field of an oscillation light, the first layer adjoins one side of the selectively-oxidized layer, the one side being closer to the active layer, the second layer adjoins the other side of the selectively-oxidized layer, Al content rates in of the first and second layers are substantially equal to each other and are less than the Al content rate in the selectively-oxidized layer, the thickness of the second layer is greater than the thickness of the first layer, and the oxidized layer includes Al oxide of the selectively-oxidized layer and Al oxide of the second layer.

13. The surface emitting laser according to claim 9, wherein the semiconductor distribution Bragg reflector further includes a third layer adjoining the second layer, the Al content rate in the third layer is less than the Al content rate in the second layer.

14. The surface emitting laser according to claim 13, wherein the selectively-oxidized layer, the first layer, the second layer, and the third layer are included as a part of one of the low refractive index layers of the semiconductor distribution Bragg reflector.

15. The surface emitting laser according to claim 14, wherein the Al content rate of the third layer is less than the Al content rate in each of the low refractive index layers excluding the low refractive index layer including the selectively-oxidized layer.

16. The surface emitting laser according to claim 9, wherein an optical thickness of the low refractive index layer including the selectively-oxidized layer is expressed by the following formula:

$$(2n+1)\lambda/4N$$

where: "n" denotes an integer equal to or greater than 1, "$\lambda$" denotes an oscillation wavelength, and "N" denotes a refractive index of the layer.

17. A surface emitting laser array in which plural of the surface emitting lasers according to claim 1 are integrated.

18. An image forming apparatus comprising:
an image carrier; and
an optical scanning device scanning a light including image information onto the image carrier, the optical scanning device including:
a light source including the surface emitting laser array according to claim 17;
a deflector deflecting a light from the light source; and
a scanning optical system focusing the light deflected by the deflector on the scanning surface.

19. An optical transmission module generating an optical signal in accordance with an input signal, the optical transmission module comprising:
the surface emitting laser array according to claim 17; and
a driving unit driving the surface emitting laser array in accordance with an input electronic signal.

20. An optical transmission system comprising:
the optical transmission module according to claim 18;
an optical medium through which an optical signal generated by the optical transmission module is transmitted; and
a converter converting the optical signal transmitted through the optical medium into an electronic signal.

* * * * *